(12) United States Patent
Yoon et al.

(10) Patent No.: US 10,519,316 B2
(45) Date of Patent: Dec. 31, 2019

(54) DYE COMPOUND, POLARIZER USING THE DYE COMPOUND, AND DISPLAY DEVICE USING THE DYE COMPOUND

(71) Applicant: Samsung Display Co. Ltd., Yongin-si, Gyeonggi-do (KR)

(72) Inventors: Hyung Guen Yoon, Hwaseong-si (KR); Jae Hong Park, Seoul (KR); Ji Yun Park, Hwaseong-si (KR); Kyung Hee Lee, Suwon-si (KR); Jae Bok Chang, Incheon (KR); Kyung Seon Tak, Hwaseong-si (KR)

(73) Assignee: SAMSUNG DISPLAY CO. LTD., Gyeonggi-Do (KR)

( * ) Notice: Subject to any disclaimer, the term of this patent is extended or adjusted under 35 U.S.C. 154(b) by 153 days.

(21) Appl. No.: 15/699,261

(22) Filed: Sep. 8, 2017

(65) Prior Publication Data

US 2018/0355181 A1    Dec. 13, 2018

(30) Foreign Application Priority Data

Jun. 12, 2017 (KR) .................. 10-2017-0073004

(51) Int. Cl.
*C09B 69/10* (2006.01)
*C09K 19/60* (2006.01)
(Continued)

(52) U.S. Cl.
CPC ............ *C09B 69/106* (2013.01); *C09B 43/28* (2013.01); *C09K 19/54* (2013.01); *C09K 19/601* (2013.01);
(Continued)

(58) Field of Classification Search
CPC ....... C09B 69/106; C09B 43/28; C09K 19/54; C09K 19/601; C09K 2019/0448;
(Continued)

(56) References Cited

U.S. PATENT DOCUMENTS 7,763,330 B2    7/2010  Lub et al.

FOREIGN PATENT DOCUMENTS

EP    0397263 A1    11/1990
JP    2013209367 A    10/2013
(Continued)

OTHER PUBLICATIONS

Salisu et al "Liquid crystal dimer containing bisazobenzene moieties", Molecular Crystal and Liquid Crystal, vol. 509, pp. 135-144 ( Year: 2009).*

(Continued)

*Primary Examiner* — Ruiyun Zhang
(74) *Attorney, Agent, or Firm* — Cantor Colburn LLP

(57) ABSTRACT

A dye compound represented by formula (A):

$$R_{A1}-(CH_2)_{k1}-L_{A1}-Cyc_{A1}-[E_{A0}-Cyc_{A0}]_{j1}-L_{A2}-$$
$$-(CH_2)_{k2}-L_{A3}-\phenyl-N\overset{\cdot\cdot}{=}N-[AR-N\overset{\cdot\cdot}{=}N]_{j2}-\phenyl-R_{A2}$$

wherein, in formula (A), $Cyc_{A1}$ and each $Cyc_{A0}$ are each independently 1,4-phenylene or 1,4-cyclohexylene, each $E_{A0}$ is independently a single bond, *—(C=O)O—*, *—O (C=O)—*, $C_{1-4}$ alkylene of the formula *—(CH_2)_k—* wherein k is a natural number, *—CH=CH—*, or *—C≡C—*, j1 is an integer of 1 to 3, each AR is independently 1,4-phenylene or (Continued)

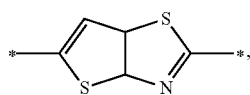

j2 is an integer of 1 or 2, $L_{41}$ is a single bond, *—O—*, *—(C=O)O—*, or *—O(C=O)—*, $L_{42}$ and $L_{43}$ are each independently a single bond or *—O—*, k1 is an integer of 0 to 12, k2 is an integer of 6 to 10, $R_{41}$ is a hydrogen atom, an acrylate group, or a methacrylate group, and $R_{42}$ is a hydrogen atom, a hydroxy group, an alkyl group, an alkoxy group, or

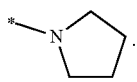

19 Claims, 30 Drawing Sheets

(51) Int. Cl.
| | |
|---|---|
| G02F 1/1368 | (2006.01) |
| G02F 1/1339 | (2006.01) |
| G02B 5/30 | (2006.01) |
| H01L 27/32 | (2006.01) |
| G02F 1/1335 | (2006.01) |
| H01L 51/52 | (2006.01) |
| C09K 19/54 | (2006.01) |
| C09B 43/28 | (2006.01) |
| C09K 19/04 | (2006.01) |

(52) U.S. Cl.
CPC ......... *G02B 5/3016* (2013.01); *G02F 1/1339* (2013.01); *G02F 1/1368* (2013.01); *G02F 1/133514* (2013.01); *H01L 27/323* (2013.01); *H01L 51/5281* (2013.01); *C09K 2019/0448* (2013.01); *G02B 5/3033* (2013.01); *G02F 1/133528* (2013.01); *G02F 2001/133519* (2013.01); *G02F 2202/043* (2013.01); *H01L 51/5253* (2013.01); *Y10T 428/10* (2015.01); *Y10T 428/1036* (2015.01); *Y10T 428/1041* (2015.01)

(58) Field of Classification Search
CPC ............... G02B 5/3016; G02B 5/3033; G02F 1/133514; G02F 1/133528; Y10T 428/10; Y10T 428/1036; Y10T 428/1041
USPC ...................... 428/1.1, 1.3, 1.31; 349/96, 97; 359/487.01, 487.02; 8/639
See application file for complete search history.

(56) References Cited

FOREIGN PATENT DOCUMENTS

| | | |
|---|---|---|
| JP | 2016133728 A | 7/2016 |
| WO | 2005045485 A1 | 5/2005 |
| WO | 2007000705 A1 | 1/2007 |

OTHER PUBLICATIONS

Emiel Peeters et al. "High-Contrast Thin-Film Polarizers by Photo-Crosslinking of Smectic Guest-Host Systems", Advanced materials, DOI: 10.1002/adma.200600355, Sep. 12, 2016, pp. 2412-2417, vol. 18.

* cited by examiner

DYE COMPOUND, POLARIZER USING THE DYE COMPOUND, AND DISPLAY DEVICE USING THE DYE COMPOUND

This application claims priority to Korean Patent Application No. 10-2017-0073004, filed on Jun. 12, 2017, in the Korean Intellectual Property Office, and all the benefits accruing therefrom under 35 U.S.C. § 119, the content of which in its entirety is incorporated by reference.

BACKGROUND

1. Field

The present disclosure relates to a dye compound, a polarizer using the dye compound, and a display device using the dye compound.

2. Description of the Related Art

A polarizer can convert unpolarized incident light into light polarized in a specific direction by transmitting a polarization component oscillating in a direction parallel to its transmission axis and absorbing a polarization component oscillating in a direction parallel to its absorption axis. The polarizer having such a polarizing function may be applied to a display device, so that the display device can have various optical functions.

For example, in a liquid crystal display, the polarizer may perform a shutter function together with a liquid crystal layer to adjust the amount of light provided from a light source, thereby realizing image display. In another example, the polarizer may convert unpolarized light into circularly polarized light together with a phase delay layer and may be used to suppress the deterioration of display quality due to reflection of external light.

A typical example of the polarizer is a polarizing plate using an iodine-polyvinyl alcohol film produced by stretching iodine-adsorbed polyvinyl alcohol.

SUMMARY

Embodiments of the disclosure provide a new dichroic dye compound having a high order liquid crystalline phase, a high dichroic ratio, and excellent durability.

Embodiments of the disclosure also provide a polarizer manufactured by aligning a new dichroic dye compound.

Embodiments of the disclosure also provide a display device manufactured using a new dichroic dye compound.

However, the disclosure is not restricted to the embodiments set forth herein. The above and other embodiments of the disclosure will become more apparent to one of ordinary skill in the art to which the disclosure pertains by referencing the detailed description of the disclosure given below.

According to an exemplary embodiment, there is provided a dye compound. The dye compound is represented by formula (A):

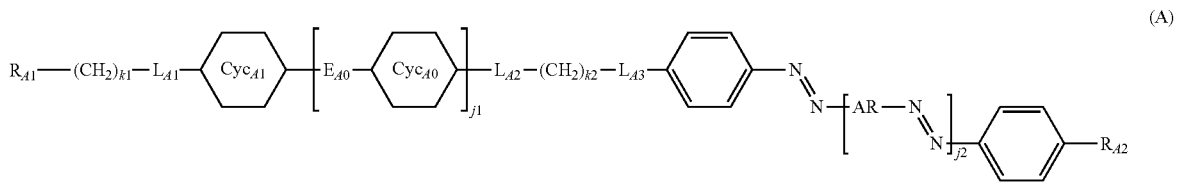

(A)

wherein, in formula (A), $Cyc_{A1}$ and each $Cyc_{A0}$ are each independently 1,4-phenylene or 1,4-cyclohexylene, each $E_{A0}$ is a single bond, *—(C=O)O—*, *—O(C=O)—*, $C_{1-4}$ alkylene of the formula *—(CH$_2$)$_k$—*, wherein k is a natural number, *—CH=CH—*, or *—C≡C—*, j1 is an integer of 1 to 3, each AR is independently 1,4-phenylene or

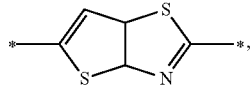

j2 is an integer of 1 or 2, $L_{A1}$ is a single bond, *—O—*, *—(C=O)O—*, or *—O(C=O)—*, $L_{A2}$ and $L_{A3}$ are each independently a single bond or *—O—*, k1 is an integer of 0 to 12, k2 is an integer of 6 to 10, $R_{A1}$ is a hydrogen atom, an acrylate group, or a methacrylate group, and $R_{A2}$ is a hydrogen atom, a hydroxy group, an alkyl group, an alkoxy group, or

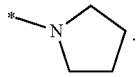

In an exemplary embodiment, the dye compound may be represented by one of formulae (A-1), (A-2), or (A-3):

In an exemplary embodiment, in formulae (A-1) through (A-3),

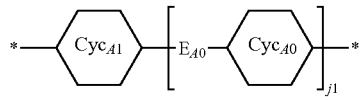

may be independently represented by one of the formulae:

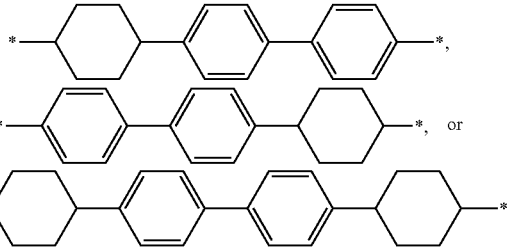

In an exemplary embodiment, in formulae (A-1) through (A-3), one or more of $L_{A2}$ and $L_{A3}$ may be *—O—*.

In an exemplary embodiment, the dye compound represented by formula (A-1) may absorb light in a wavelength band of about 400 to about 500 nanometers (nm), the dye

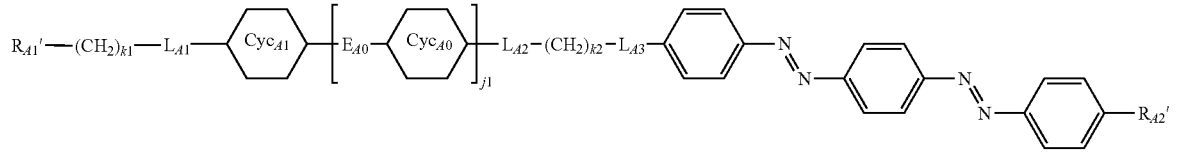
(A-1)

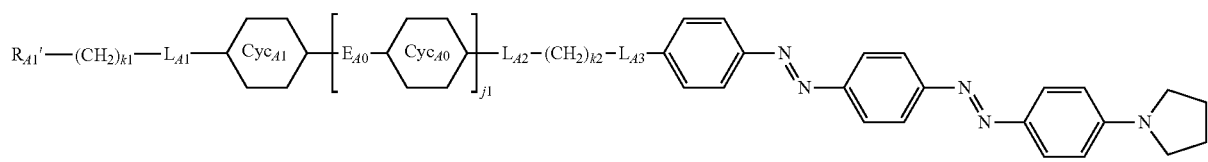
(A-2)

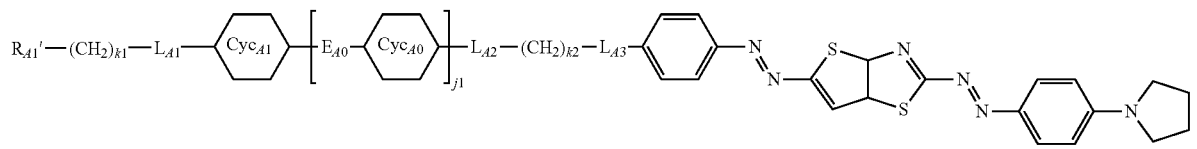
(A-3)

wherein, $R_{A2}'$ in formula (A-1) is a $C_{1-10}$ alkyl group or a $C_{1-10}$ alkoxy group, each $R_{A1}'$ in formulae (A-1) through (A-3) is independently an acrylate group or a methacrylate group, and $Cyc_{A1}$, $Cyc_{A0}$, $E_{A0}$, j1, $L_{A1}$, $L_{A2}$, $L_{A3}$, k1, and k2 are the same as those defined in formula (A).

In an exemplary embodiment, in formulae (A-1) through (A-3), k2 may be 6, 8, or 10.

compound represented by formula (A-2) may absorb light in a wavelength band of about 500 to about 600 nm, and the dye compound represented by formula (A-3) may absorb light in a wavelength band of about 600 to about 700 nm.

According to an exemplary embodiment, there is provided a polarizer. The polarizer includes: a dye alignment layer; and a polarizing layer which is disposed on the dye alignment layer and comprises a polymer derived from a compound represented by formula (A):

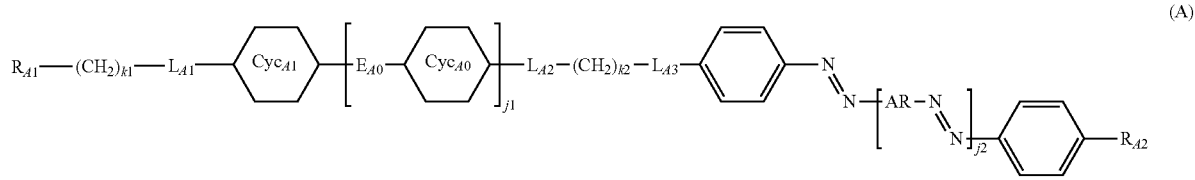

(A)

wherein, in formula (A). $Cyc_{A1}$ and each $Cyc_{A0}$ are independently 1,4-phenylene or 1,4-cyclohexylene, each $E_{A0}$ is independently a single bond, *—(C=O)O—*, *—O(C=O)—*, $C_{1-4}$ alkylene of the formula *—$(CH_2)_k$—* wherein k is a natural number, *—CH=CH—*, or *—C≡C—*, j1 is an integer of 1 to 3, each AR is independently 1,4-phenylene or

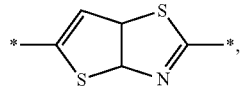

j2 is an integer of 1 or 2, $L_{A1}$ is a single bond, *—O—*, *—(C=O)O—*, or *—O(C=O)—*, $L_{A2}$ and $L_{A3}$ are each independently a single bond or *—O—*, k1 is an integer of 0 to 12, k2 is an integer of 6 to 10, $R_{A1}$ is a hydrogen atom, an acrylate group, or a methacrylate group, and $R_{A2}$ is a hydrogen atom, a hydroxy group, an alkyl group, an alkoxy group, or

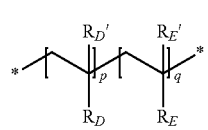

In an exemplary embodiment, the polarizing layer may further include a polymer derived from a liquid crystalline compound represented by formula (B):

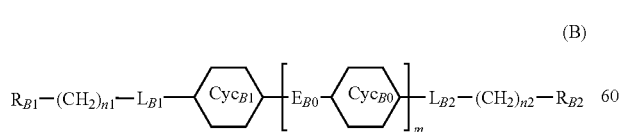

(B)

wherein, in formula (B), $Cyc_{B1}$ and each $Cyc_{B0}$ are independently 1,4-phenylene or 1,4-cyclohexylene, each $E_{B0}$ is independently a single bond, *—(C=O)O—*, *—O(C=O)—*, $C_{1-4}$ alkylene of the formula *—$(CH_2)_k$—* wherein k is a natural number, *—CH=CH—*, or *—C≡C—*, m is an integer of 1 to 3, $L_{B1}$ and $L_{B2}$ are each independently a single bond, *—O—*, *—(C=O)O—*, or *—O(C=O)—*, n1 and n2 are each independently an integer of 0 to 12, $R_{B1}$ and $R_{B2}$ are each independently a hydrogen atom, an acrylate group, or a methacrylate group, and one or more of $R_{B1}$ and $R_{B2}$ are the acrylate group or the methacrylate group.

In an exemplary embodiment, the liquid crystalline compound may have a smectic B phase and may be represented by one of formulae (B-1) or (B-2):

(B-1)

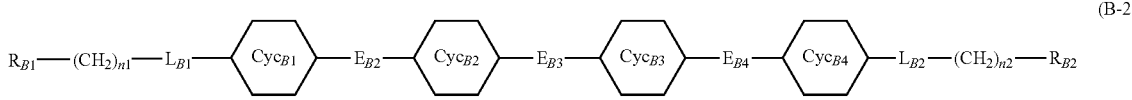

(B-2)

wherein, in formulae (B-1) and (B-2), $Cyc_{B2}$, $Cyc_{B3}$, and $Cyc_{B4}$ are each independently 1,4-phenylene or 1,4-cyclohexylene, $E_{B2}$, $E_{B3}$, and $E_{B4}$ are each independently a single bond, *—(C=O)O—*, *—O(C=O)—*, $C_{1-4}$ alkylene of the formula *—$(CH_2)_k$—* wherein k is a natural number, *—CH=CH—*, or *—C≡C—*, and $Cyc_{B1}$, $L_{B1}$, $L_{B2}$, n1, n2, $R_{B1}$, and $R_{B2}$ are the same as those defined in formula (B).

In an exemplary embodiment, the polarizing layer may include a polymer having a main chain represented by formula (C):

(C)

wherein, in formula (C), each $R_D$ is independently a monovalent atomic group represented by formula (D), each $R_D'$ is independently a hydrogen atom or a methyl group, and p is an integer of 0 to 100, each $R_E$ is independently a monovalent atomic group represented by formula (E), each $R_E'$ is independently a hydrogen atom or a methyl group, and q is an integer of 0 to 100, and both p and q are not zero, (D)

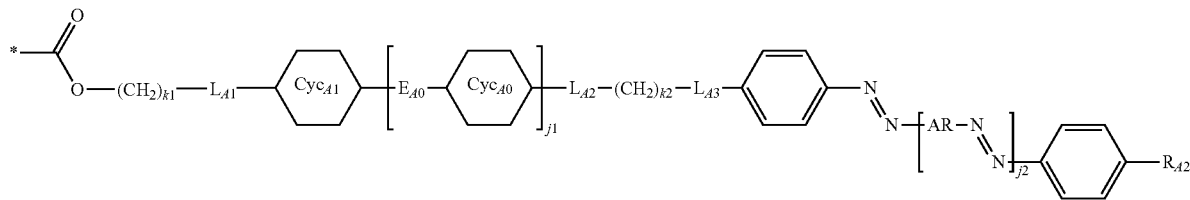

wherein, in formula (D), $Cyc_{A1}$ and each $Cyc_{A0}$ are independently 1,4-phenylene or 1,4-cyclohexylene, each $E_{A0}$ is independently a single bond, *—(C=O)O—*, *—O(C=O)—*, $C_{1-4}$ alkylene of the formula *—$(CH_2)_k$—* wherein k is a natural number, *—CH=CH—*, or *—C≡C—*, j1 is an integer of 1 to 3, each AR is independently 1,4-phenylene or

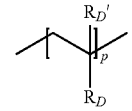

j2 is an integer of 1 or 2, $L_{A1}$ is a single bond, *—O—*, *—(C=O)O—*, or *—O(C=O)—*, $L_{A2}$ and $L_{A3}$ are each independently a single bond or *—O—*, k1 is an integer of 0 to 12, k2 is an integer of 6 to 10, $R_{A2}$ is a hydrogen atom, a hydroxy group, an alkyl group, an alkoxy group, or; and (E)

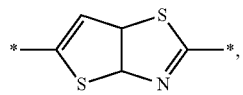

wherein, in formula (E), $Cyc_{B1}$ and each $Cyc_{B0}$ are independently 1,4-phenylene or 1,4-cyclohexylene, each $E_{B0}$ is independently a single bond, *—(C=O)O—*, *—O(C=O)—*, $C_{1-4}$ alkylene of the formula *—$(CH_2)_k$—* wherein k is a natural number, *—CH=CH—*, or *—C≡C—*, m is an integer of 1 to 3, $L_{B1}$ and $L_{B2}$ are each independently a single bond, *—O—*, *—(C=O)O—*, or *—O(C=O)—*, n1 and n2 are each independently an integer of 0 to 12, and $R_{B2}$ is a hydrogen atom, an acrylate group, or a methacrylate group.

In an exemplary embodiment, in formula (C), the repeating unit of the formula

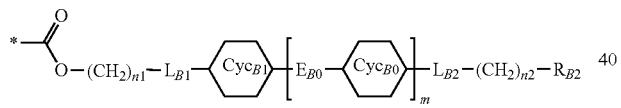

may be represented by one of formulae (C-1), (C-2), or (C-3):

(C-1)

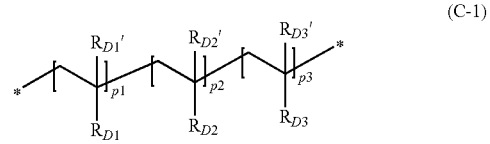

(C-2)

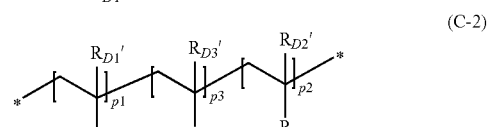

(C-3)

where in, in formulae (C-1), (C-2), and (C-3), each $R_{D1}$ is independently a monovalent atomic group represented by formula (D-1), each $R_{D1}'$ is independently a hydrogen atom or a methyl group, p1 is an integer of 1 to 30, each $R_{D2}$ is independently a monovalent atomic group represented by formula (D-2), each $R_{D2}'$ is independently a hydrogen atom or a methyl group, p2 is an integer of 1 to 30, each $R_{D3}$ is independently a monovalent atomic group represented by formula (D-3), each $R_{D3}'$ is independently a hydrogen atom or a methyl group, and p3 is an integer of 1 to 30, (D-1)

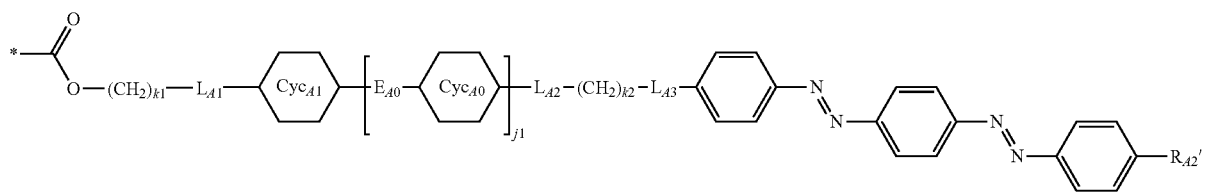

(D-2)

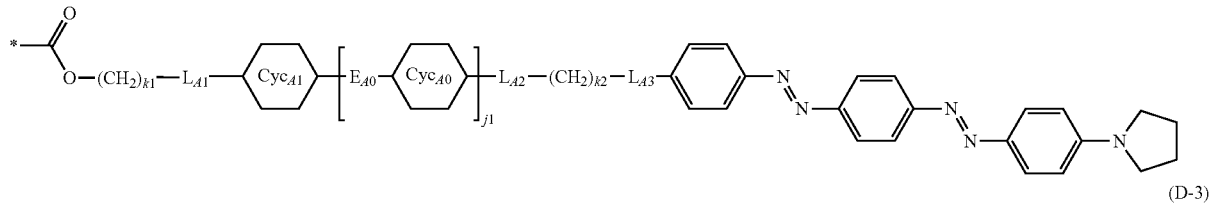

(D-3)

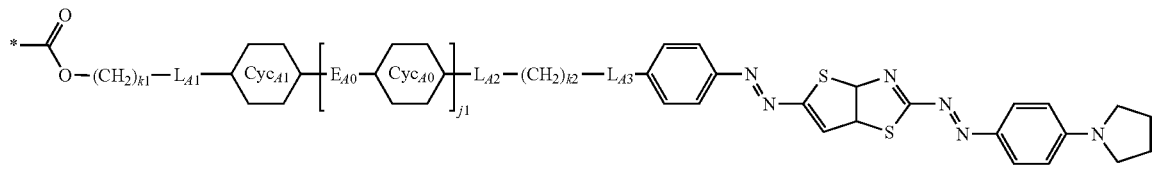

wherein $R_{A2}'$ in formula (D-1) is a $C_{1-10}$ alkyl group or a $C_{1-10}$ alkoxy group, and $Cyc_{A1}$, each $Cyc_{A0}$, each $E_{A0}$, j1, $L_{A1}$, $L_{A2}$, $L_{A3}$, k1, and k2 in formulas (D-1) through (D-3) are the same as those defined in formula (D).

In an exemplary embodiment, in formula (C), the repeating unit of the formula

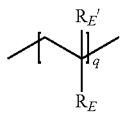

may be represented by formula (C-4):

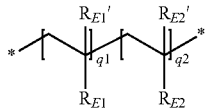

(C-4)

wherein, in formula (C-4), each $R_{E1}$ is independently a monovalent atomic group represented by formula (E-1), each $R_{E1}'$ is independently a hydrogen atom or a methyl group, q1 is an integer of 1 to 30, each $R_{E2}$ is independently a monovalent atomic group represented by formula (E-2), each $R_{E2}'$ is independently a hydrogen atom or a methyl group, and q2 is an integer of 1 to 30, (E-1)

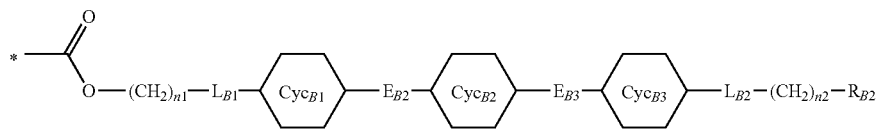

(E-2)

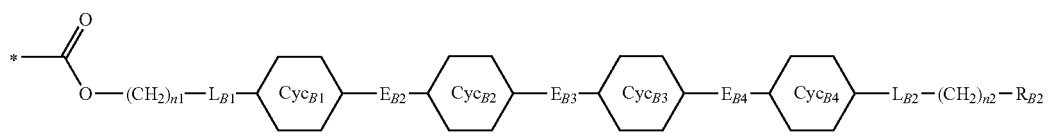

wherein, in formulae (E-1) and (E-2), $Cyc_{B2}$, $Cyc_{B3}$ and $Cyc_{B4}$ are each independently 1,4-phenylene or 1,4-cyclohexylene, $E_{B2}$, $E_{B3}$ and $E_{B4}$ are each independently a single bond, *—(C=O)O—*, *—O(C=O)—*, $C_{1-4}$ alkylene of the formula *—$(CH_2)_k$—* wherein k is a natural number, *—CH=CH—*, or *—C≡C—*, and $Cyc_{B1}$, $L_{B1}$, $L_{B2}$, n1, n2 and $R_{B2}$ are the same as those defined in formula (E).

In an exemplary embodiment, the polarizing layer may be made of a polymer derived from a composition comprising the compound represented by formula (A) and the liquid crystalline compound represented by formula (B), wherein the composition may have a smectic B phase at any temperature within a range of about 0° C. to about 100° C.

In an exemplary embodiment, the composition may further include a crosslinking agent, wherein the crosslinking agent may include a compound represented by one of formulae (F-1), (F-2), or (F-3); and about 200 to about 400 parts by weight of the liquid crystalline compound represented by formula (B) and about 10 to about 100 parts by weight of the crosslinking agent, based on 100 parts by weight of the compound represented by formula (A):

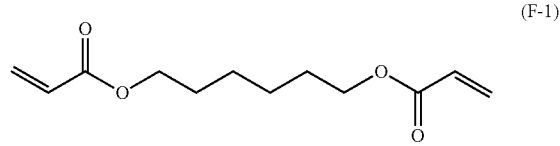
(F-1)

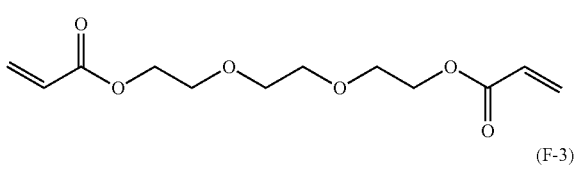
(F-2)

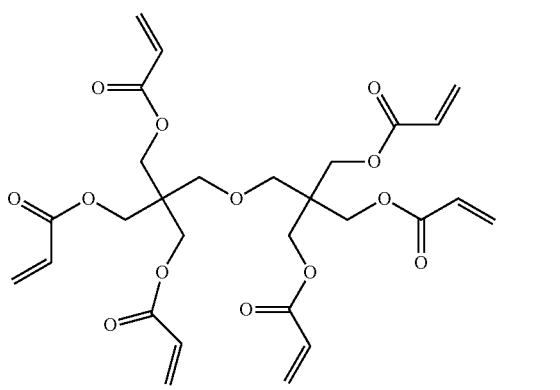
(F-3)

According to an exemplary embodiment, there is provided a display device. The display device includes a polarizing layer which comprises a polymer derived from a compound represented by formula (A):

wherein, in formula (A), $Cyc_{A1}$ and each $Cyc_{A0}$ are independently 1,4-phenylene or 1,4-cyclohexylene, each $E_{A0}$ is independently a single bond, *—(C=O)O—*, *—O(C=O)—*, $C_{1-4}$ alkylene of the formula *—$(CH_2)_k$—* wherein k is a natural number, *—CH=CH—*, or *—C≡C—*, j1 is an integer of 1 to 3, each AR is independently 1,4-phenylene or

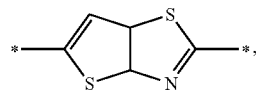

j2 is an integer of 1 or 2, $L_{A1}$ is a single bond, *—O—*, *—(C=O)O—*, or *—O(C=O)—*, $L_{A2}$ and $L_{A3}$ are each independently a single bond or *—O—*, k1 is an integer of 0 to 12, k2 is an integer of 6 to 10, $R_{A1}$ is a hydrogen atom, an acrylate group, or a methacrylate group, and $R_{A2}$ is a hydrogen atom, a hydroxy group, an alkyl group, an alkoxy group, or

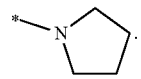

In an exemplary embodiment, the display device may further include: a first display panel which includes a first base substrate and a switching element disposed on the first base substrate; a second display panel which faces the first display panel and includes a second base substrate and the polarizing layer disposed on a surface of the second base substrate which faces the first display panel; a liquid crystal layer which is interposed between the first display panel and the second display panel; and a sealing member which seals the liquid crystal layer by bonding the first display panel and the second display panel together.

In an exemplary embodiment, the second display panel may further include, a color control pattern layer which is disposed on the surface of the second base substrate; an overcoat layer which is disposed on the color control pattern layer; and a dye alignment layer which is disposed on the overcoat layer, wherein the polarizing layer may be disposed directly on the dye alignment layer.

In an exemplary embodiment, the display device may further include: a first display panel; a second display panel which faces the first display panel and includes a base substrate having a surface facing the first display panel and an other surface; a liquid crystal layer which is interposed between the first display panel and the second display panel; a sealing member which seals the liquid crystal layer by bonding the first display panel and the second display panel together; and a dye alignment layer which is disposed directly on the other surface of the base substrate, wherein the polarizing layer may be disposed directly on the dye alignment layer.

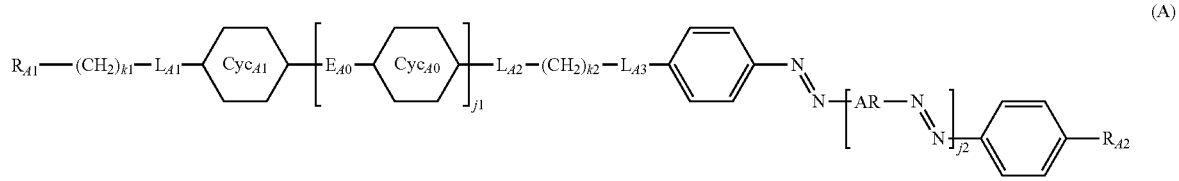
(A)

In an exemplary embodiment, the display device may further include: a base substrate; an organic light emitting element which is disposed between the base substrate and the polarizing layer; and an encapsulation member which is disposed between the organic light emitting element and the polarizing layer to encapsulate the organic light emitting element.

In an exemplary embodiment, the encapsulation member may include one or more inorganic layers and one or more organic layers, wherein each inorganic layer is stacked alternately with each organic layer, and the display device may further include: a first touch electrode which is disposed on the encapsulation member; a second touch electrode which is disposed on the first touch electrode and insulated from the first touch electrode; an insulating layer which is disposed on the second touch electrode; a phase delay layer which is disposed on the insulating layer; and a dye alignment layer which is disposed directly on the phase delay layer, wherein the polarizing layer may be disposed directly on the dye alignment layer.

A dye compound according to an embodiment has excellent physical/chemical stability and a high dichroic ratio. Therefore, the dye compound can be utilized as a dichroic dye. In addition, since the dye compound has a high order liquid crystalline phase, it can be easily aligned.

Furthermore, the polarizer according to the embodiment can be manufactured through a relatively simple process and has excellent polarization degree and durability.

A display device according to an embodiment includes a polarizing layer having excellent polarization degree and durability. Therefore, the reliability and display quality of the display device can be improved.

However, the effects and features of the disclosure are not restricted to the embodiments set forth herein. The above and other effects and features of the disclosure will become more apparent to one of ordinary skill in the art to which the disclosure pertains by referencing the claims.

BRIEF DESCRIPTION OF THE DRAWINGS

These and/or other aspects will become apparent and more readily appreciated from the following description of the embodiments, taken in conjunction with the accompanying drawings, in which.

DETAILED DESCRIPTION

Figure 1:
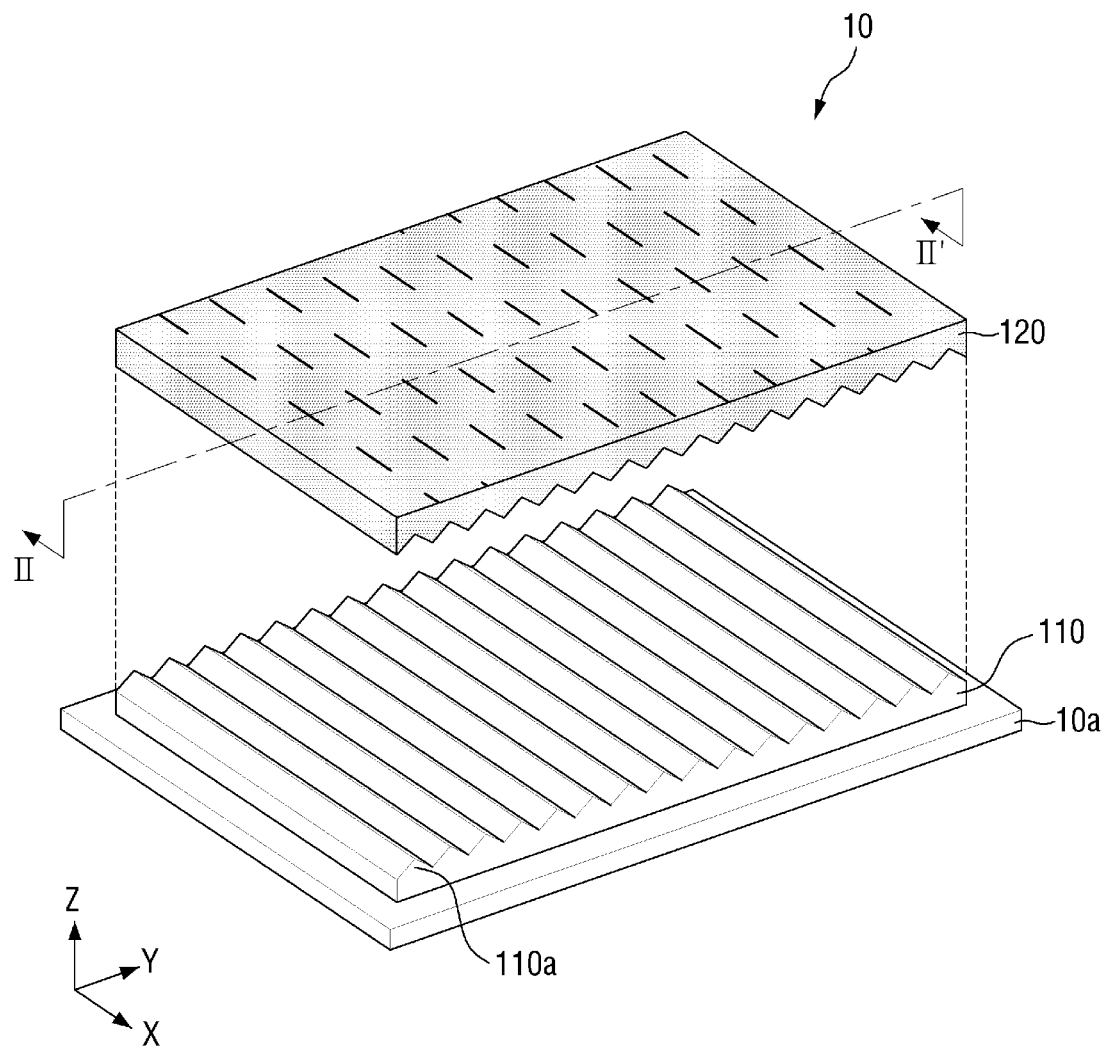
FIG. 1 is an exploded perspective view of a polarizer according to an embodiment.

As described above, a typical a polarizing plate may use an iodine-polyvinyl alcohol film produced by stretching iodine-adsorbed polyvinyl alcohol. However, polyvinyl alcohol, which is a water-soluble polymer, has poor water resistance and heat resistance. In addition, since iodine is susceptible to heat, it can be sublimated when exposed to strong light or heat. Thus, polarization characteristics of the polarizer may deteriorate. Furthermore, a production process performed under a stretching or pressure process is complicated, and the iodine-polyvinyl alcohol polarizing plate may have poor mechanical strength. When the iodine-polyvinyl alcohol polarizing plate shrinks due to heat or moisture, it may warp or crack. That is, since the iodine-polyvinyl alcohol polarizing plate can have poor durability, its polarization characteristics may continuously deteriorate. In this regard, there is a need for the development of a polarizer that can replace the polarizing plate that includes the iodine-polyvinyl alcohol film.

Features of the disclosure and methods of accomplishing the same may be understood more readily by reference to the following detailed description of exemplary embodiments and the accompanying drawings. The disclosure may, however, be embodied in many different forms and should not be construed as being limited to the exemplary embodiments set forth herein. Rather, these exemplary embodiments are provided so that this disclosure will be thorough and complete, and so the exemplary embodiments may be realized by those who have ordinary skill in the art.

The exemplary embodiments are merely described below, by referring to the figures, to explain aspects of the present description. In the drawings, the thickness of layers, films, panels, regions, etc., are exaggerated for clarity. Like numbers refer to like elements throughout. As used herein, the term "and/or" includes any and all combinations of one or more of the associated listed items.

It will be understood that when an element or layer is referred to as being "on," "connected to" or "coupled to" another element or layer, the element or layer can be directly on, connected or coupled to another element or layer or intervening elements or layers. In contrast, when an element is referred to as being "directly on," "directly connected to" or "directly coupled to" another element or layer, there are no intervening elements or layers present. As used herein, connected may refer to elements being physically, electrically, and/or fluidly connected to each other.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

It will be understood that, although the terms first, second, third, etc., may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of the present embodiments.

Spatially relative terms, such as "below," "lower," "under," "above," "upper", or the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "beneath" relative to other elements or features would then be oriented "above" relative to the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting. As used herein, the singular forms "a," "an" and "the" are intended to include the plural forms as well, including "at least one," unless the context clearly indicates otherwise. It will be further understood that the terms "comprises," "comprising," "includes" and/or "including," when used in this specification, specify the presence of stated features, integers, operations, elements, and/or components, but do not preclude the presence or addition of one or more other features, integers, steps, operations, elements, components, and/or groups thereof. "At least one" is not to be construed as limiting "a" or "an." "Or" means "and/or." As used herein, the term "and/or" includes any and all combinations of one or more of the associated listed items.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, a numerical range indicated by using "to" or "through" denotes a numerical range including first and last values as a lower limit and an upper limit, respectively.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

As used herein, "*" denotes a binding site at which adjacent atoms are covalently bonded. A dash ("-") that is not between two letters or symbols is used to indicate a point of attachment for a substituent. As used herein, "$C_{A-B}$" denotes having A to B carbon atoms. For example, a $C_{1-5}$ alkyl group is an alkyl group having 1 to 5 carbon atoms.

The term "alkyl group," as used herein, denotes a monovalent atomic group obtained by excluding one hydrogen atom from a straight-chain or branched-chain aliphatic saturated hydrocarbon having the specified number of carbon atoms, optionally substituted with one or more substituents unless indicated otherwise, provided that the valence of the alkyl group is not exceeded, and may be represented by "*—$C_nH_{2n+1}$" (where n is a natural number). Examples of the alkyl group may be a methyl group, an ethyl group, an iso-propyl group, a tert-butyl group, a n-octyl group, a n-decyl group, a n-hexadecyl group, or the like.

The term "alkoxy group," as used herein, denotes a monovalent atomic group in which an alkyl group and one oxygen atom are bonded and may be represented by "*—O—$C_nH_{2n+1}$" (where n is a natural number).

Unless defined otherwise, the term "alkylene group," as used herein, denotes a divalent atomic group obtained by excluding two hydrogen atoms from a straight-chain or branched-chain aliphatic saturated hydrocarbon having the specified number of carbon atoms, optionally substituted with one or more substituents unless indicated otherwise, provided that the valence of the alkylene group is not exceeded, and may be represented by "*—$C_nH_{2n}$—*" (where n is a natural number).

"Substituted" means that the compound or group is substituted with at least one (e.g., 1, 2, 3, or 4) substituent independently selected from a hydroxyl (—OH), a $C_{1-9}$ alkoxy, a $C_{1-9}$ haloalkoxy, an oxo (=O), a nitro (—$NO_2$), a cyano (—CN), an amino (—$NH_2$), an azido (—$N_3$), an amidino (—C(=NH)$NH_2$), a hydrazino (—$NHNH_2$), a hydrazono (=N—$NH_2$), a carbonyl (—C(=O)—), a carbamoyl group (—C(O)$NH_2$), a sulfonyl (—S(=O)$_2$—), a thiol (—SH), a thiocyano (—SCN), a tosyl ($CH_3C_6H_4SO_2$—), a carboxylic acid (—C(=O)OH), a carboxylic ($C_{1-6}$ alkyl) ester (—C(=O)OR wherein R is a $C_{1-6}$ alkyl group), a carboxylic acid salt (—C(=O)OM) wherein M is an organic or inorganic anion, a sulfonic acid (—$SO_3H_2$), a sulfonic mono- or dibasic salt (—$SO_3MH$ or —$SO_3M_2$ wherein M is an organic or inorganic anion), a phosphoric acid (—$PO_3H_2$), a phosphoric acid mono- or dibasic salt (—$PO_3MH$ or —$PO_3M_2$ wherein M is an organic or inorganic anion), a $C_{1-12}$ alkyl, a $C_{3-12}$ cycloalkyl, a $C_{2-12}$ alkenyl, a $C_{5-12}$ cycloalkenyl, a $C_{2-12}$ alkynyl, a $C_{6-12}$ aryl, a $C_{7-13}$ arylalkylene, a $C_{7-13}$ alkylarylene, a $C_{4-12}$ heterocycloalkyl, and a $C_{3-12}$ heteroaryl instead of hydrogen, provided that the substituted atom's normal valence is not exceeded. The number of carbon atoms indicated for any group is exclusive of any substituents.

The term "dichroic," as used herein, denotes that absorbance in an axial direction differs from absorbance in another axial direction.

Hereinafter, dye compounds and compositions including the dye compounds according to exemplary embodiments will be described.

A composition according to an embodiment may include at least one dye compound and a liquid crystalline compound.

The at least one dye compound includes a dye compound represented by formula (A) below. In an example, the at least one dye compound may include a single type of dye compound represented by formula (A). In another example, the at least one dye compound may include a plurality of different dye compounds represented by formula (A):

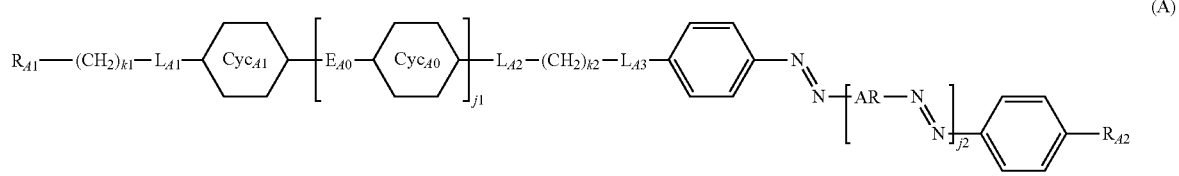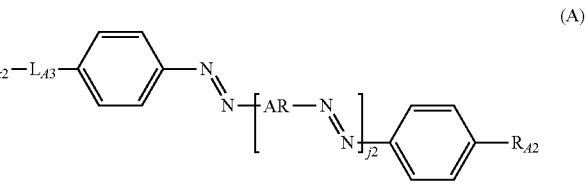

(A)

where $Cyc_{A1}$ and each $Cyc_{A0}$ are each independently a divalent cyclic group having 6 to 12 carbon atoms. For example, $Cyc_{A1}$ and each $Cyc_{A0}$ may each independently be 1,4-phenylene or 1,4-cyclohexylene.

j1 may define a repeating unit in a basic skeleton. In an embodiment, j1 may be an integer of 1 to 3, and each $E_{A0}$ may independently be a single bond, *—(C=O)O—*, *—O(C=O)—*, $C_{1-4}$ alkylene of the formula *—(CH$_2$)$_k$—* wherein k is a natural number, *—CH=CH—*, or *—C≡C—*. $E_{A0}$ and $Cyc_{A0}$ in each repeating unit defined by j1 may be the same or different from those in other repeating units.

The basic skeleton defined by $Cyc_{A1}$, j1, $Cyc_{A0}$, and $E_{A0}$ may represent a mesogenic skeleton. The mesogenic skeleton may give predetermined liquid crystallinity to dye compounds represented by formula (A), so that the dye compounds can have a self-aligning ability. In addition, the dye compounds represented by formula (A) and having the mesogenic skeleton may have an excellent intermolecular interaction (i.e., affinity) with the liquid crystalline compound due to a geometric molecular structure. As a non-limiting example,

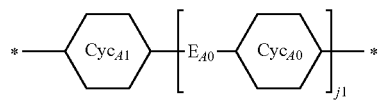

of the dye compounds represented by formula (A) may be represented by

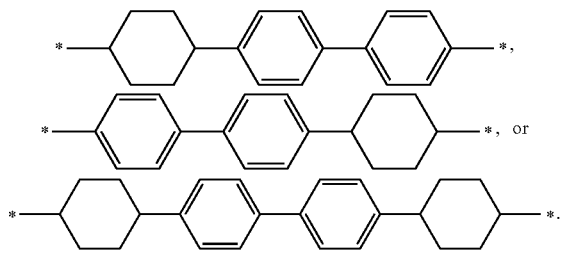

In addition, each AR is independently a divalent cyclic group having 3 to 6 carbon atoms. For example, each AR may independently be 1,4-phenylene or

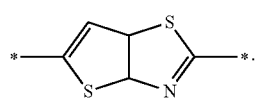.

j2 may define a repeating unit in a basic skeleton. In an embodiment, j2 may be an integer of 1 or 2. AR in each repeating unit defined by j2 may be the same or different from that in other repeating units.

The basic skeleton defined by AR and j2 has an azo group (—N=N—). The azo group may be in a trans-isomer state in which one end and the other end of a double bond are located in different directions. The azo group may give a coloring property to the dye compounds represented by formula (A).

AR in the basic skeleton representing the coloring property of the dye compounds according to the current embodiment may be in an unsubstituted state. When AR in the basic skeleton maintains the unsubstituted state, for example, when a carboxyl group (—COOH) and/or a sulfo group (—SO$_3$H) which can be introduced into a divalent cyclic group represented by AR and oriented in a short axis direction of the dye compounds are excluded, the linearity of the dye compounds can be secured, and the affinity between the dye compounds and the liquid crystalline compound to be described later can be further improved.

$L_{A1}$ may be a single bond, *—O—*, *—(C=O)O—*, or *—O(C=O)—*. In addition, k1 may define the length of an alkylene group (*—(CH$_2$)—*) linking a mesogenic skeleton and a terminal group $R_{A1}$. k1 may be an integer of 0 to 12.

$L_{A2}$, $L_{A3}$, and k2 form a linking group connecting the mesogenic skeleton and a skeleton having an azo group. $L_{A2}$ and $L_{A3}$ may each independently be a single bond or *—O—*. $L_{A3}$ can be introduced into a carbon facing the carbon of a benzene ring to which an azo group has been bonded. That is, $L_{A3}$ can be bonded to a para position of the benzene ring. The linking group (*-$L_{A2}$-(CH$_2$)$_{k2}$-$L_{A3}$-*) formed by bonding $L_{A3}$ to the para position may not reduce or substantially reduce the linearity of the dye compounds. In some embodiments, one or more of $L_{A2}$ and $L_{A3}$ may be *—O—*.

In addition, k2 may be an integer of 6 to 10. When k2 is smaller than 6, the order parameter of the dye compounds cannot be sufficiently secured. This may cause unstable alignment, and may result in a decrease in the degree of polarization. When k2 is greater than 10, flexibility may be given to the linking group (*-$L_{A2}$-(CH$_2$)$_{k2}$-$L_{A3}$-*), thereby degrading linearity. In terms of the linearity of the dye compounds represented by formula (A), k2 may advantageously be an even number, that is, 6, 8 or 10.

$R_{A1}$ may be a hydrogen atom or a photopolymerizable group. Examples of the photopolymerizable group include an acrylate group ( 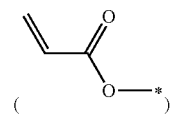 )

and a methacrylate group

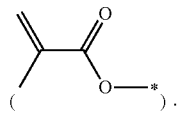

When the terminal group $R_{A1}$ is a photopolymerizable group, predetermined reactivity may be given to the dye compounds represented by formula (A). This makes it possible to polymerize the dye compounds represented by formula (A) and/or polymerize the dye compounds represented by formula (A) with the liquid crystalline compound to be described later. That is, when the terminal group $R_{A1}$ is a photopolymerizable group, the compounds represented by formula (A) may be reactive-dye compounds.

$R_{A2}$ can affect a wavelength band absorbed by the dye compounds represented by formula (A). In an embodiment, $R_{A2}$ may be a hydrogen atom, a hydroxy group, an alkyl group, an alkoxy group, or

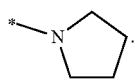

For example, the dye compounds represented by formula (A) may be represented by formulae (A-1), (A-2), or (A-3):

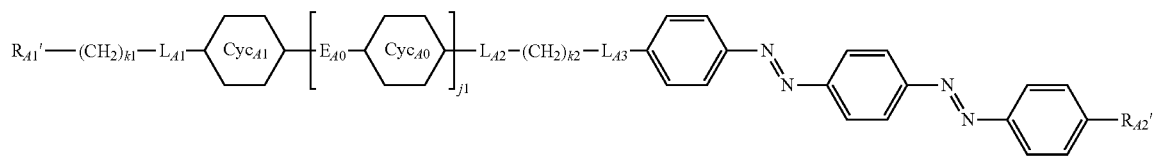

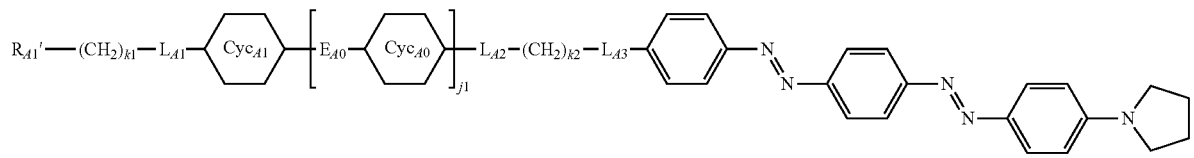

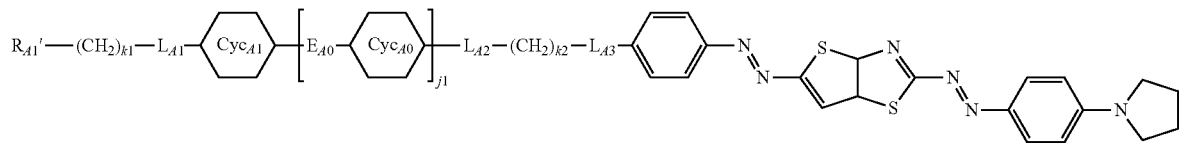

In formula (A-1), $R_{42}'$ is a $C_{1-10}$ alkyl group or a $C_{1-10}$ alkoxy group. In formulae (A-1) through (A-3), $R_{41}'$ may be an acrylate group or a methacrylate group. $Cyc_{A1}$, each $Cyc_{A0}$, each $E_{A0}$, j1, $L_{A1}$, $L_{A2}$, $L_{A3}$, k1, and k2 are the same as those defined in the above formula (A).

For example, a dye compound represented by formula (A-1) may absorb light in a wavelength band of about 400 to about 500 nanometer (nm). A dye compound represented by formula (A-2) may absorb light in a wavelength band of about 500 to about 600 nm. In addition, a dye compound represented by formula (A-3) may absorb light in a wavelength band of about 600 to about 700 nm.

The dye compounds represented by the above formulas (A-1) through (A-3) may be positive dichroic dyes that absorb light polarized in a long axis direction of molecules. For example, the absorbance of the dye compound according to an embodiment in a maximum absorption wavelength band in the long axis direction may be about 30,000 arbitrary units (a.u.) or more, about 35,000 a.u. or more, or about 40,000 a.u. or more.

Since each substituent in the above formulas (A-1), (A-2), and (A-3) has been described above with reference to formula (A), a description of each substituent will be omitted.

A dye compound represented by formula (A) may be, but is not limited to, any one or more of the following compounds:

A101

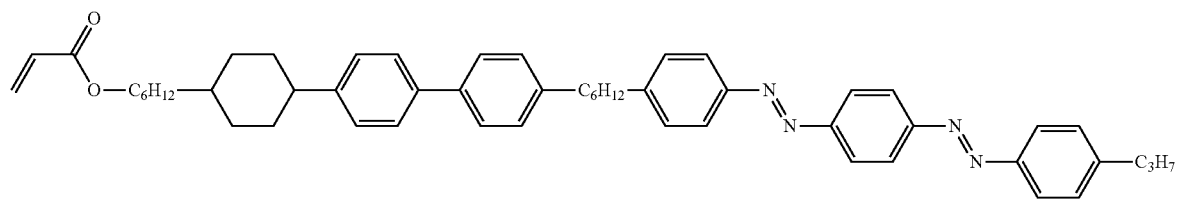

A102

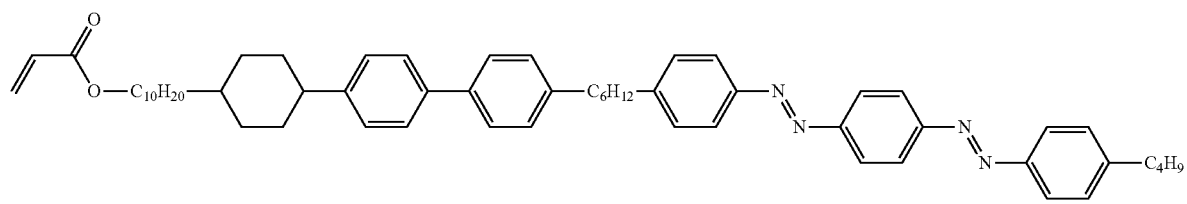

A103

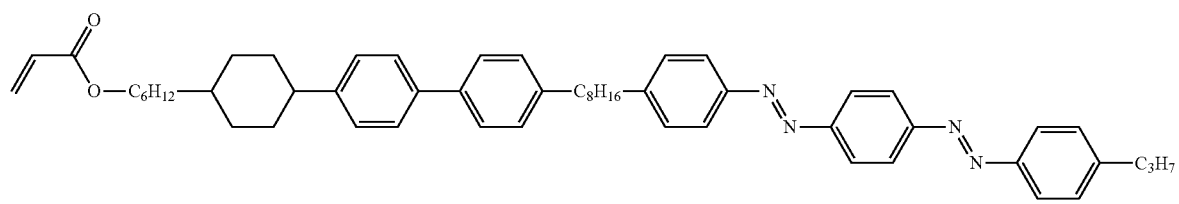

A104

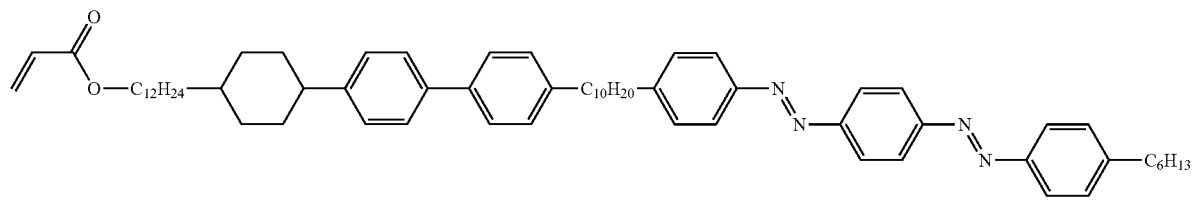

A105

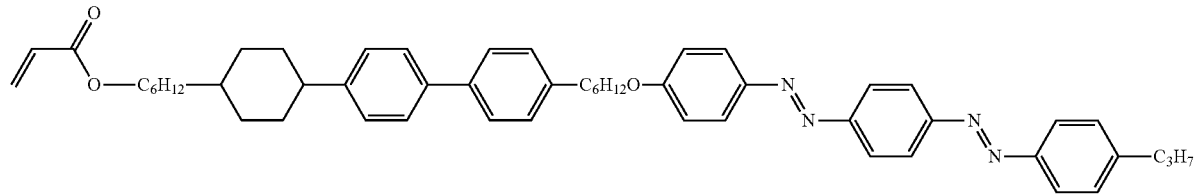

-continued
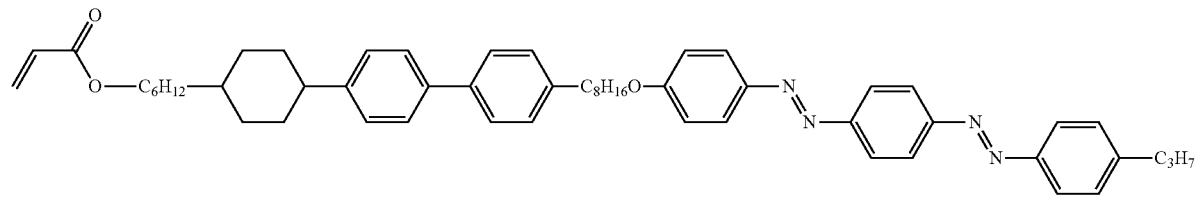
A106
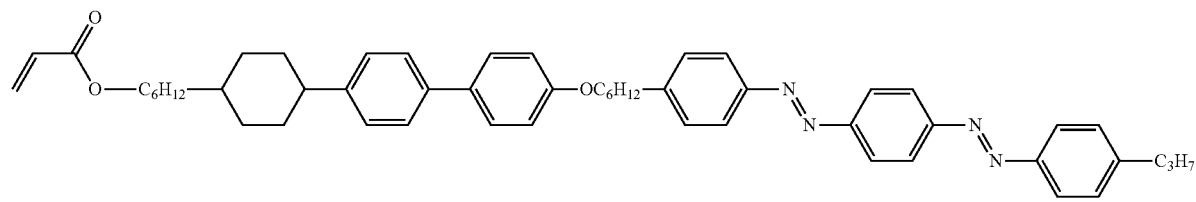
A107
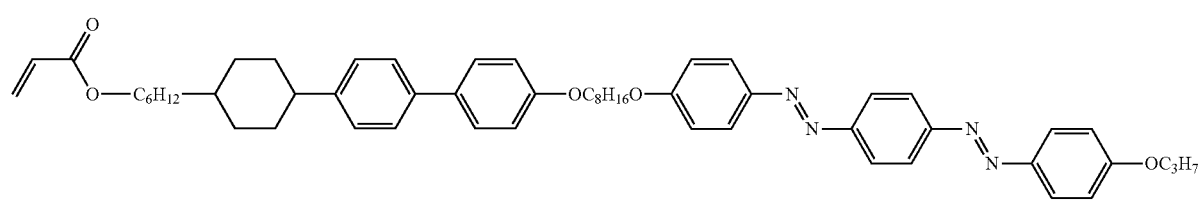
A108
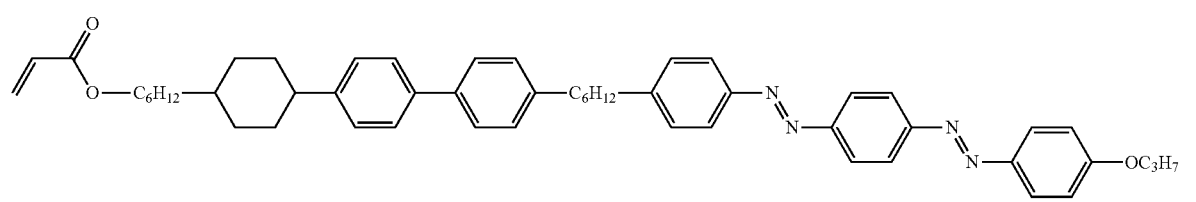
A109
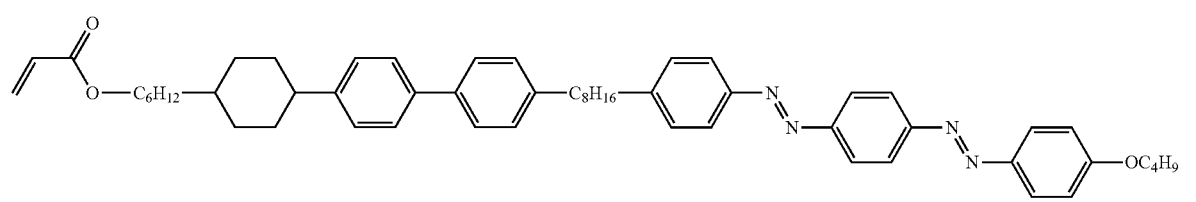
A110
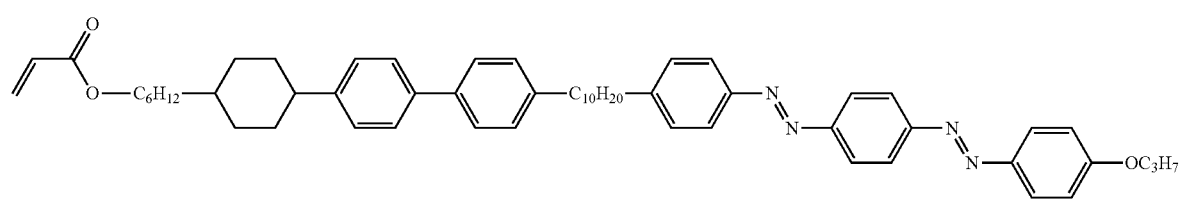
A111
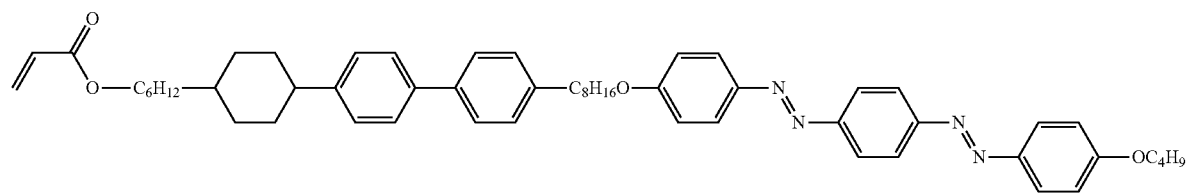
A112

-continued
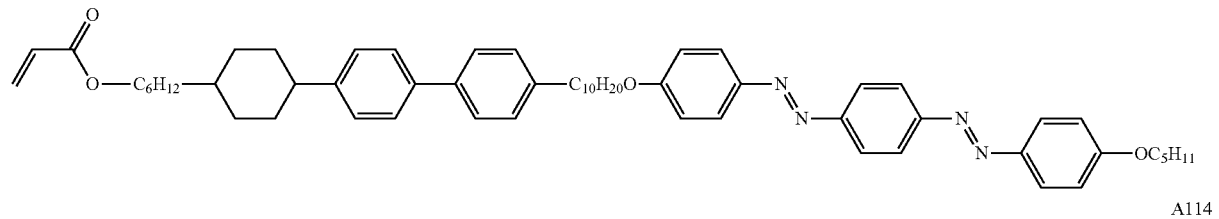
A113
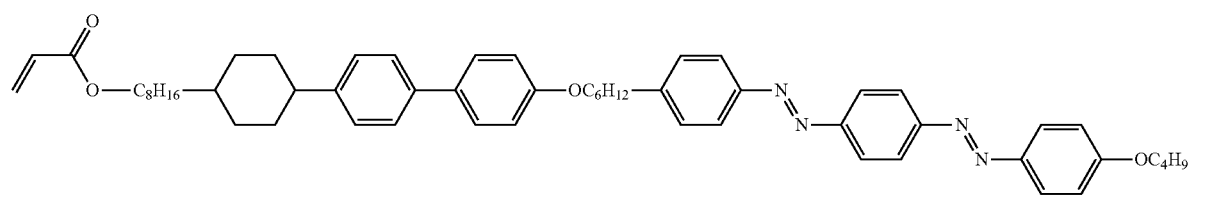
A114
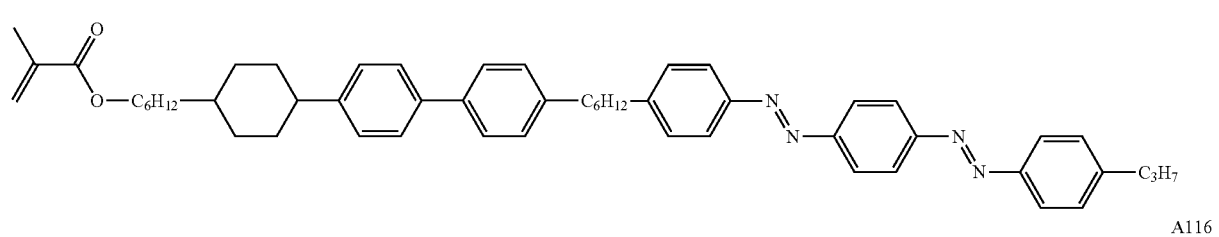
A115
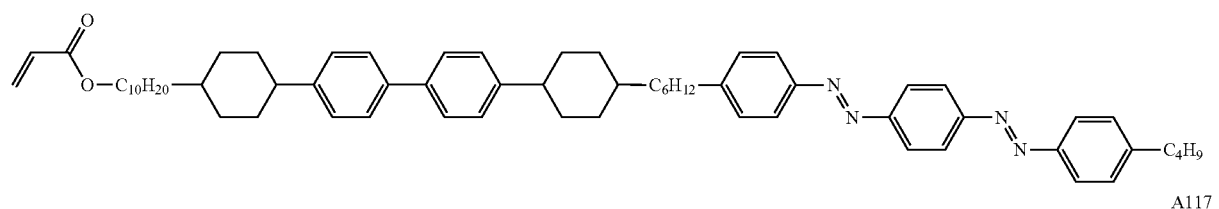
A116
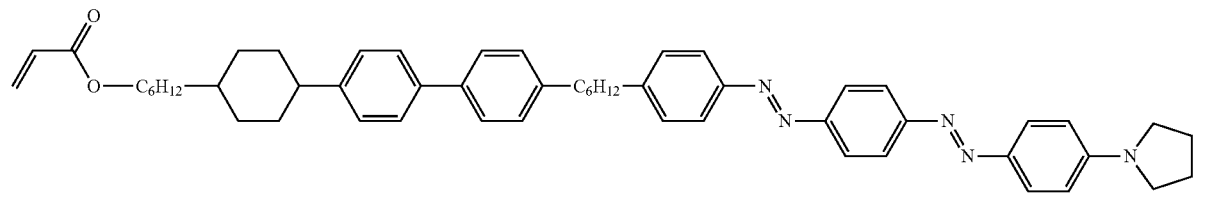
A117
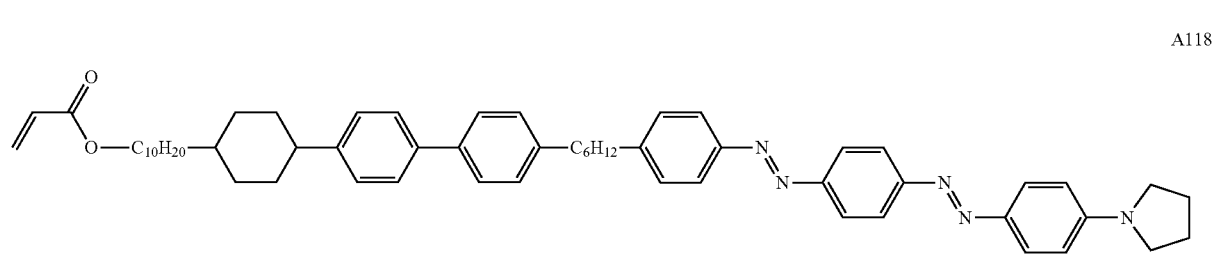
A118
A119

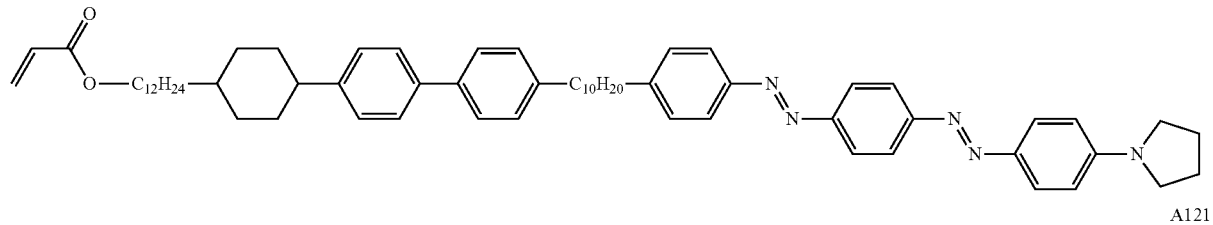
A120
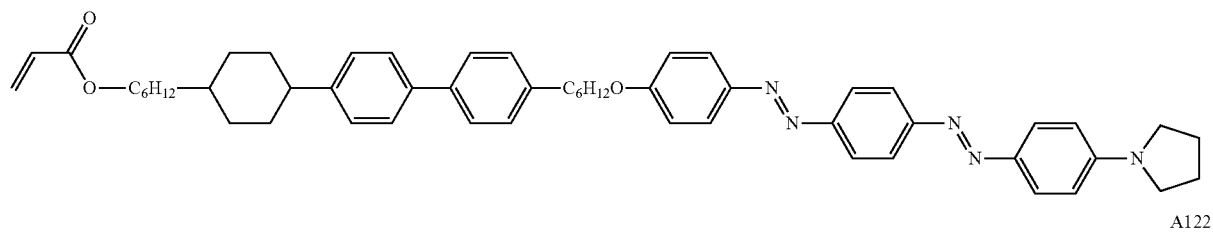
A121
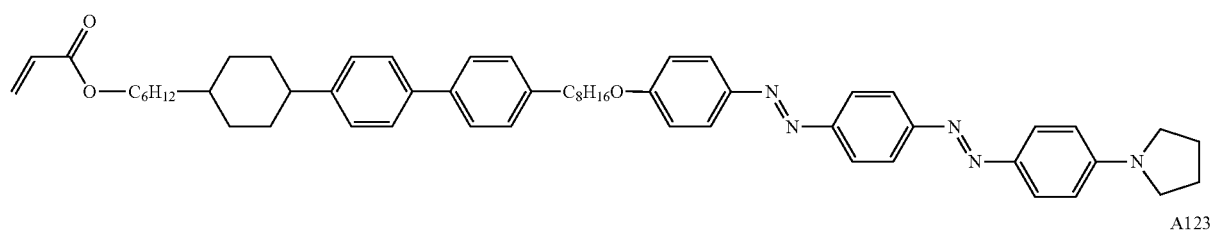
A122
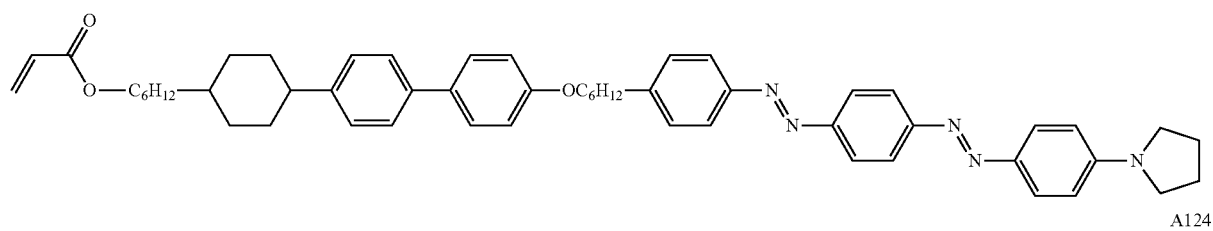
A123
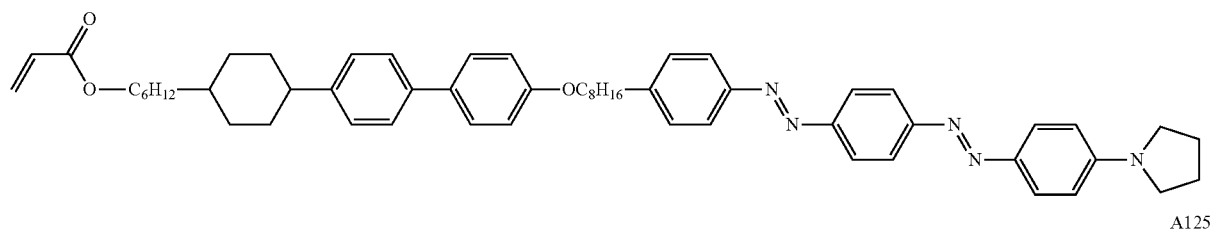
A124
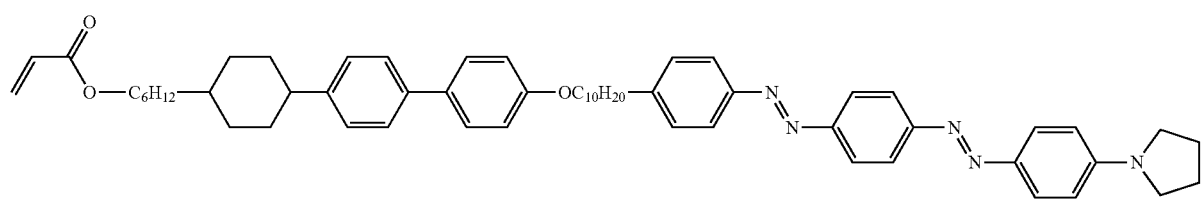
A125
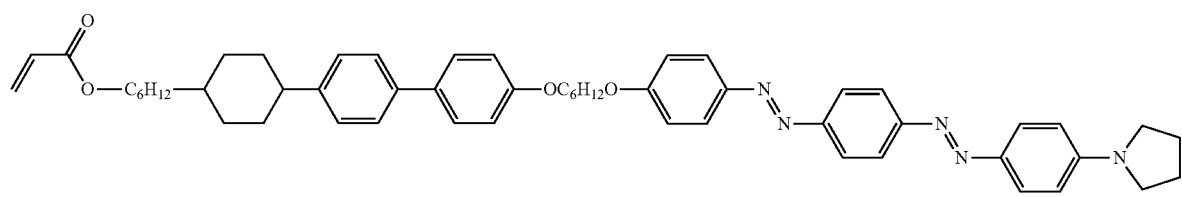
A126

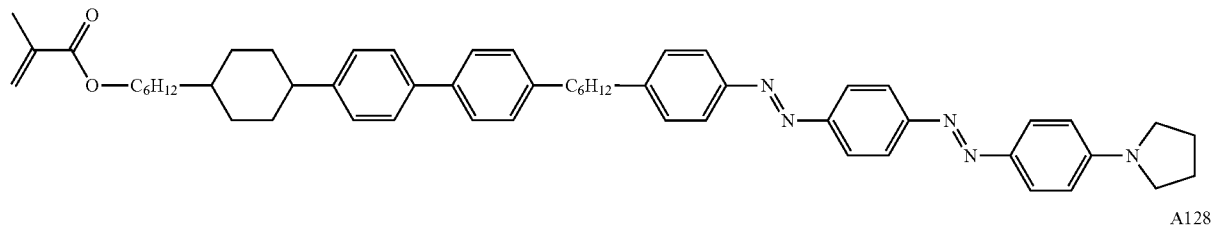
A127
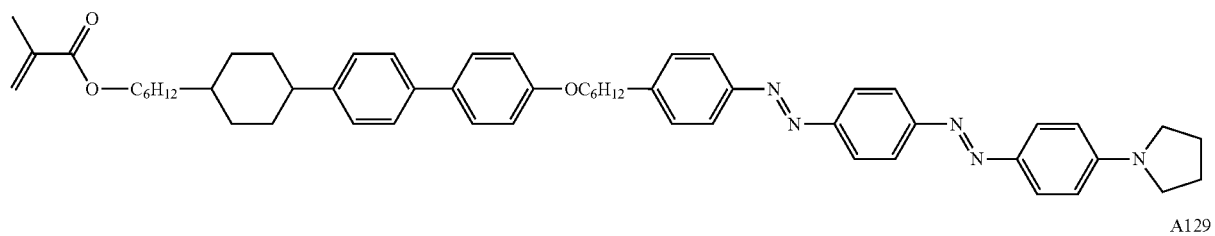
A128
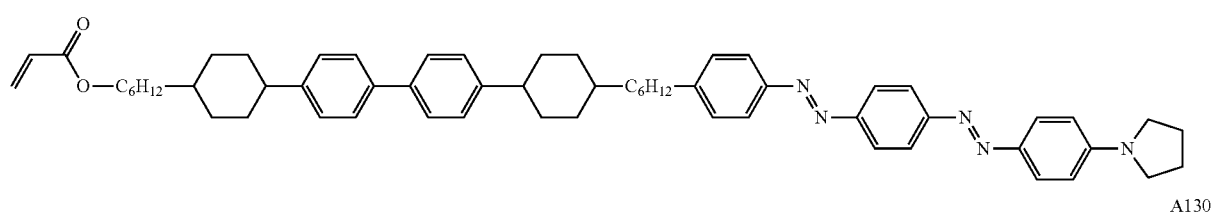
A129
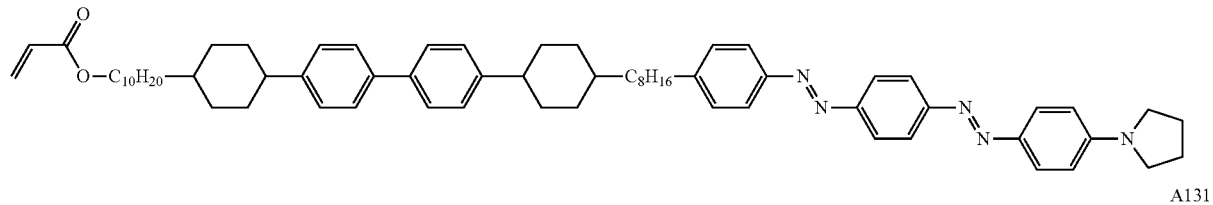
A130
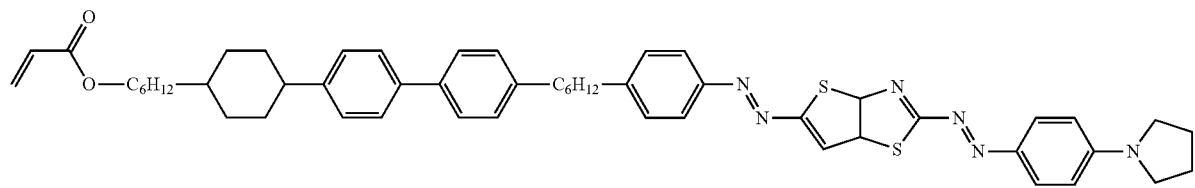
A131
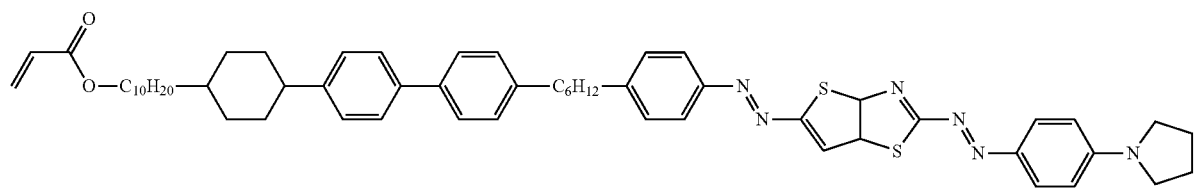
A132
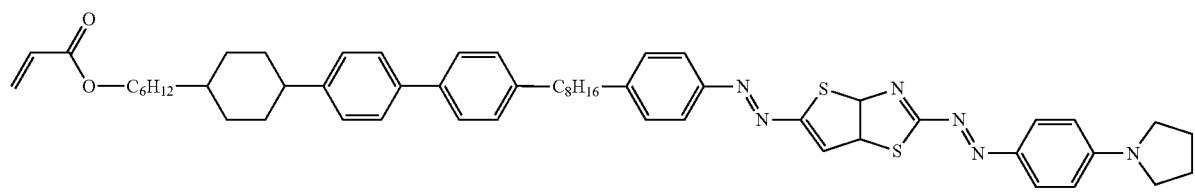
A133

-continued
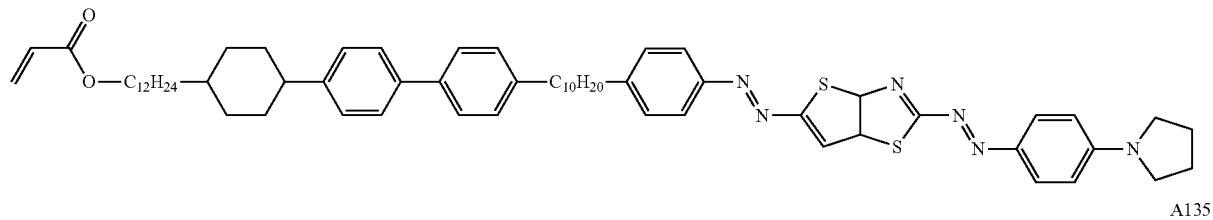
A134
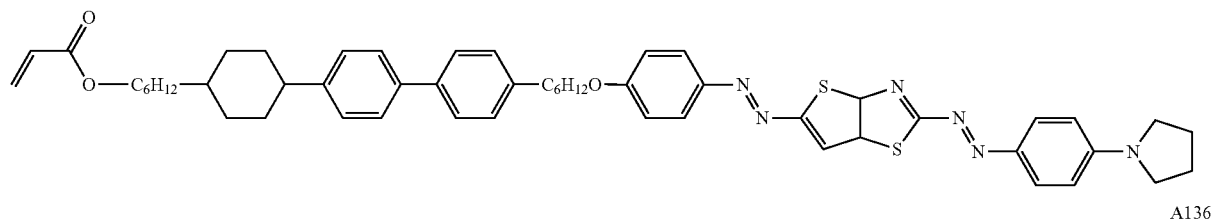
A135
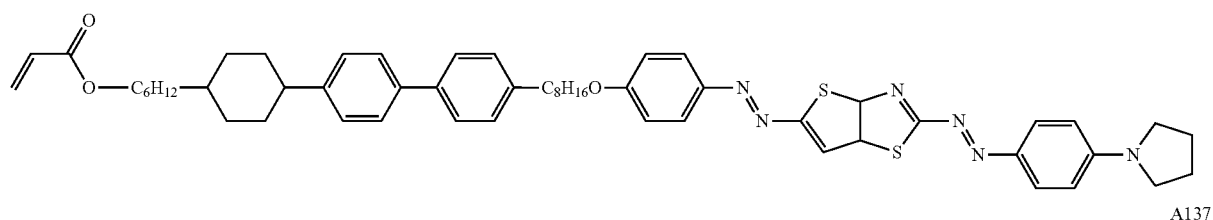
A136
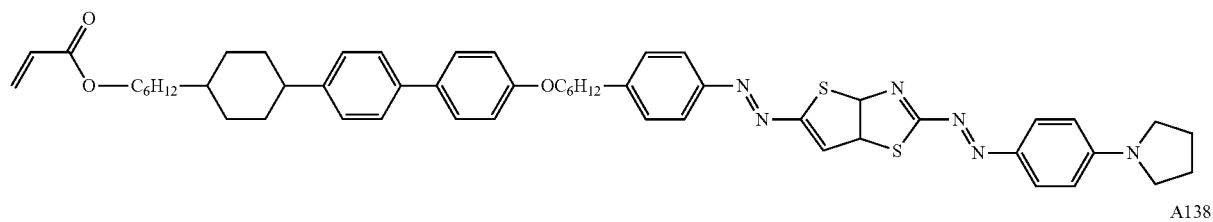
A137
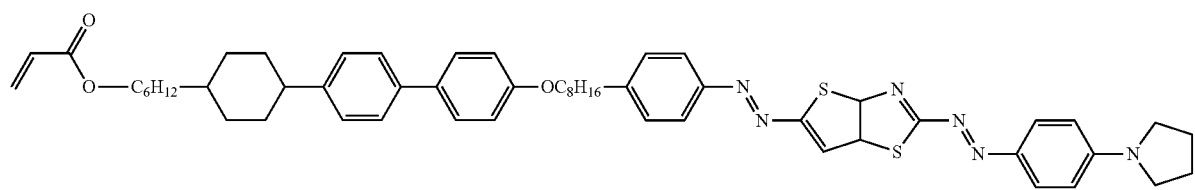
A138
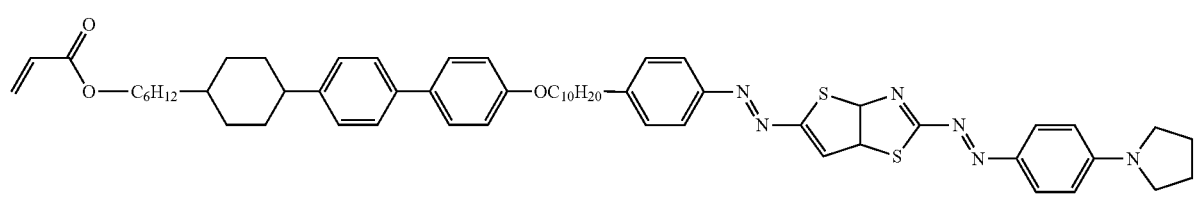
A139
A140

-continued
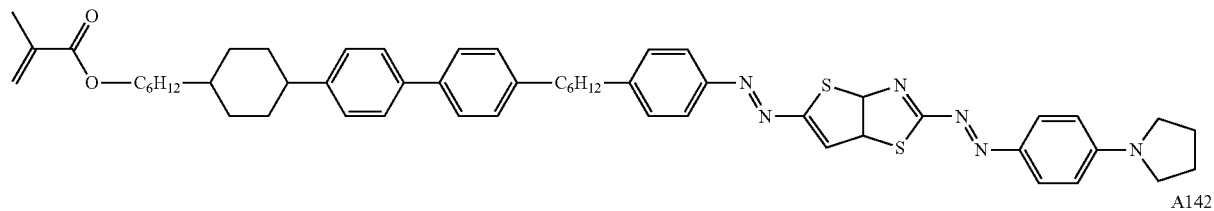
A141
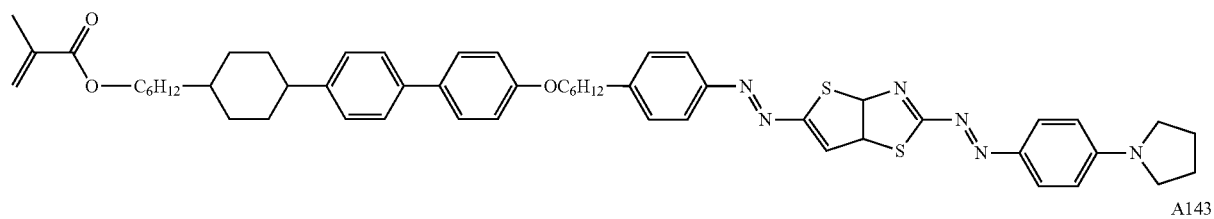
A142
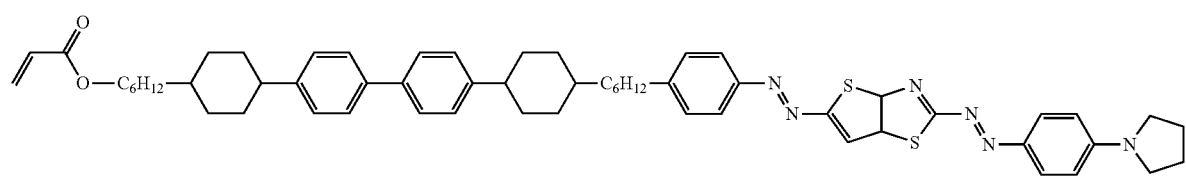
A143
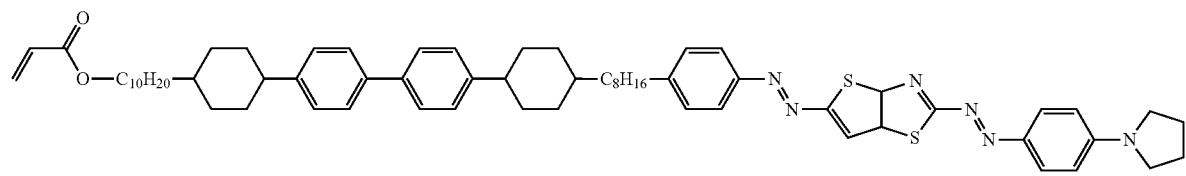
A144
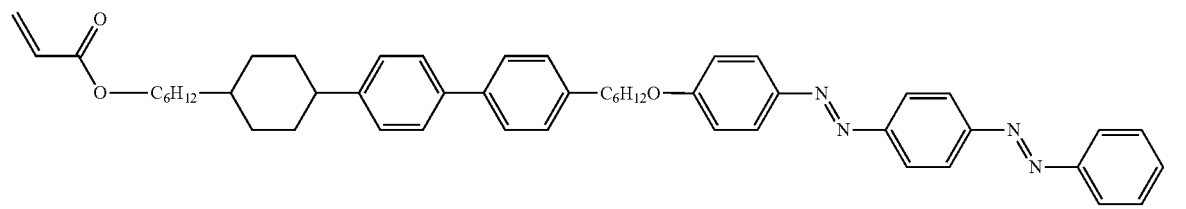
A145
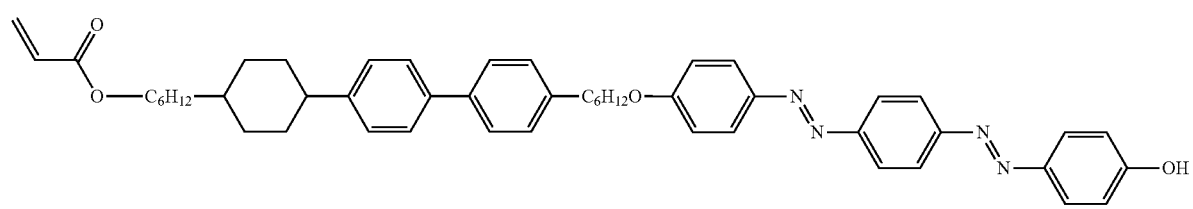
A146
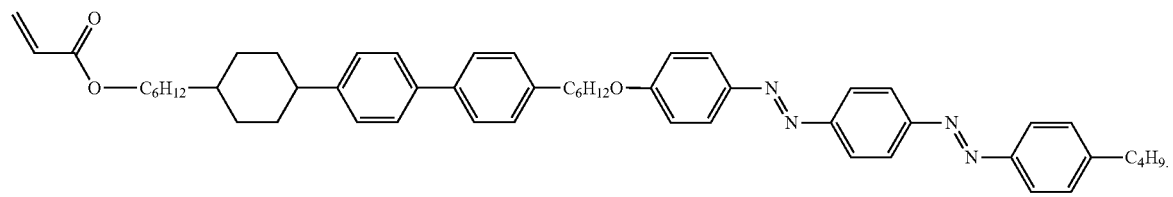
A147

The dye compounds represented by formula (A) can function as dichroic dyes having excellent linearity and a high dichroic ratio. In addition, since the dye compounds include the mesogenic skeleton in the basic skeleton to exhibit predetermined liquid crystallinity, they can be aligned stably. In addition, since the dye compounds have excellent affinity with the liquid crystalline compound to be described later, they can be aligned more easily. Furthermore, when a terminal group has a photopolymerizable group (for example, an acrylate group or a methacrylate group), a polymer can be formed between the dye compounds represented by formula (A) and/or between the dye compounds represented by formula (A) and the liquid crystalline compound. Therefore, the alignment state of the dye compounds can be maintained stably.

In addition, the excellent physical/chemical stability of the dye compounds can minimize the denaturation of the dye compounds even when the dye compounds are exposed to high temperature or moisture. Accordingly, a polarizing layer having improved polarization degree and durability can be formed.

In an exemplary embodiment, a composition including the at least one dye compound may include a dye compound represented by formula (A) as a dye compound. In some embodiments, the composition may include the dye compound represented by the above-described formula (A-1) as a dye compound. In some embodiments, the composition may include the dye compound represented by the above-described formula (A-2) as a dye compound. In some embodiments, the composition may include the dye compound represented by the above-described formula (A-3) as a dye compound.

In another exemplary embodiment, a composition including the at least one dye compound may include, as a dye compound, the dye compound represented by formula (A-1) and the dye compound represented by formula (A-2). In an embodiment, the composition may include, as a dye compound, the dye compound represented by formula (A-1) and the dye compound represented by formula (A-3). In an embodiment, the composition may include, as a dye compound, the dye compound represented by formula (A-2) and the dye compound represented by formula (A-3). In some embodiments, the composition may include, as a dye compound, all of the dye compound represented by formula (A-1), the dye compound represented by formula (A-2) and the dye compound represented by formula (A-3).

For example, the dye compound represented by formula (A-1) may absorb light in a wavelength band of about 400 to about 500 nm, and the dye compound represented by formula (A-2) may absorb light in a wavelength band of about 500 to about 600 nm. In addition, the dye compound represented by formula (A-3) may absorb light in a wavelength band of about 600 to about 700 nm.

In an exemplary embodiment, when a composition including only some of the dye compounds represented by the above formulae (A-1) through (A-3) is used as a coating composition for producing a polarizer, the composition includes dye compounds having selectivity for some wavelength bands, and can therefore absorb light of a specific wavelength band or bands among polarization components oscillating in an absorption axis direction of the polarizer. Therefore, a wavelength-selective polarizer can be provided.

In another exemplary embodiment, when a composition including all of the compounds represented by the above formulae (A-1) through (A-3) is used as a coating composition for producing a polarizer, the composition includes dye compounds having a superior dichroic ratio for all wavelength bands of visible light (e.g., about 400 to about 700 nm), and can therefore absorb light of polarization components oscillating in the absorption axis direction of the polarizer, for example completely absorb visible light, regardless of wavelength band in the visible light region. Therefore, a polarizer having an excellent polarization degree can be provided.

In addition, a composition according to an embodiment may include additional dye compounds. In this case, if there is a weak affinity between the additional dye compounds and the liquid crystalline compound to be described later, the dye compound represented by formula (A) can improve dispersion characteristics of the additional dye compounds because it includes both a basic skeleton having an azo group and a mesogenic skeleton. For example, by using the affinity attributable to a molecular structure between the dye compound represented by formula (A) and the additional dye compounds and the affinity attributable to a molecular structure between the dye compound represented by formula (A) and the liquid crystalline compound, it is possible to improve the dispersion characteristics of the additional dye compounds in the liquid crystalline compound that forms a host material.

The liquid crystalline compound may be a reactive-liquid crystalline compound.

The reactive-liquid crystalline compound according to an embodiment may be a liquid crystalline compound which includes a mesogenic basic skeleton exhibiting liquid crystallinity and a photopolymerizable group and has a smectic B phase. For example, the reactive-liquid crystalline compound according to the current embodiment may have the smectic B phase in a temperature range of about 0 to about 100° C., about 10 to about 20° C., about 20 to about 30° C., about 30 to about 40° C., about 40 to about 50° C., about 50 to about 60° C., about 60 to about 70° C., about 70 to about 80° C., about 80 to about 90° C., or about 90 to about 100° C. The liquid crystalline compound having the smectic B phase is advantageous in inducing proper alignment of a dye compound because it has a very high order parameter as compared with a nematic liquid crystal, a smectic A liquid crystal, and a smectic C liquid crystal.

In an embodiment, the liquid crystalline compound having the smectic B phase may be a liquid crystalline compound represented by formula (B) below:

(B)

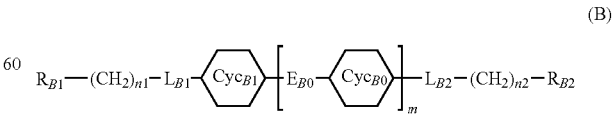

wherein, in formula (B), $Cyc_{B1}$ and each $Cyc_{B0}$ are each independently a divalent cyclic group having 6 to 12 carbon atoms. For example, $Cyc_{B1}$ and each $Cyc_{B0}$ may each independently be 1,4-phenylene or 1,4-cyclohexylene.

m may define a repeating unit of a basic skeleton. In an embodiment, m may be an integer of 1 to 3, and each $E_{B0}$ may independently be a single bond, *—(C=O)O—*, *—O(C=O)—*, $C_{1-4}$ alkylene of the formula *—$(CH_2)_k$—* wherein k is a natural number, *—CH=CH—*, or *—C≡C—*. $E_{B0}$ and $Cyc_{B0}$ in each repeating unit defined by m may be the same or different as those in other repeating units.

The basic skeleton defined by $Cyc_{B1}$, m, $Cyc_{B0}$, and $E_{B0}$ may represent a mesogenic skeleton. The mesogenic skeleton may give liquid crystallinity to the compounds represented by formula (B). The compounds represented by formula (B) and having the mesogenic skeleton may have an excellent affinity with the dye compounds represented by formula (A) due to a geometric molecular structure. Thus, the compounds represented by formula (B) can further improve the alignment characteristics of the dye compounds represented by formula (A).

In addition, $L_{B1}$ and $L_{B2}$ may each independently be a single bond, *—O—*, *—(C=O)O—*, or *—O(C=O)—*. n1 and n2 may define the length of an alkylene group linking a mesogenic skeleton (a basic skeleton) and a terminal group ($R_{B1}$, $R_{B2}$). n1 and n2 may each independently be an integer of 0 to 12.

$R_{B1}$ and $R_{B2}$ may each independently be a hydrogen atom or a photopolymerizable group. Examples of the photopolymerizable group include an acrylate group and a methacrylate group. One or more of $R_{B1}$ and $R_{B2}$ may be a photopolymerizable group. For example, one or more of $R_{B1}$ and $R_{B2}$ may be an acrylate group or a methacrylate group. The terminal group $R_{B1}$ and/or the terminal group $R_{B2}$ may give predetermined reactivity to the liquid crystalline compounds represented by formula (B) to enable polymerization of the liquid crystalline compounds. For example, the terminal group $R_{B1}$ and/or the terminal group $R_{B2}$ may make it possible to polymerize the liquid crystalline compounds represented by formula (B) and/or polymerize the liquid crystal compounds represented by formula (B) and the dye compounds represented by the above-described formula (A) and maintain the stable alignment state of the dye compounds.

The liquid crystalline compound represented by formula (B) may be represented by one of the following formulae (B-1) or (B-2):

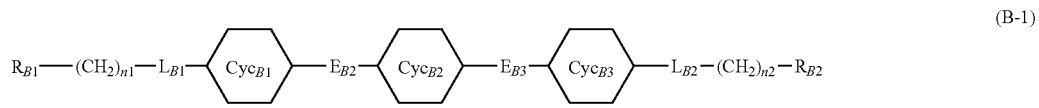

(B-1)

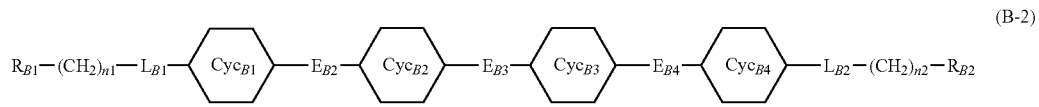

(B-2)

wherein, in formulae (B-1) and (B-2), $Cyc_{B2}$, $Cyc_{B3}$, and $Cyc_{B4}$ are each independently 1,4-phenylene or 1,4-cyclohexylene, $E_{B2}$, $E_{B3}$, and $E_{B4}$ are each independently a single bond, *—(C=O)O—*, *—O(C=O)—*, $C_{1-4}$ alkylene of the formula *—$(CH_2)_k$—* wherein k is a natural number, *—CH=CH—*, or *—C≡C—*. In addition, $Cyc_{B1}$, $L_{B1}$, $L_{B2}$, n1, n2, $R_{B1}$, and $R_{B2}$ are the same as those defined in the above formula (B).

A liquid crystalline compound represented by formula (B) may be, but is not limited to, any one or more of the following compounds:

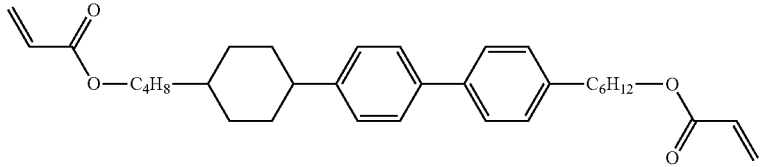

B101

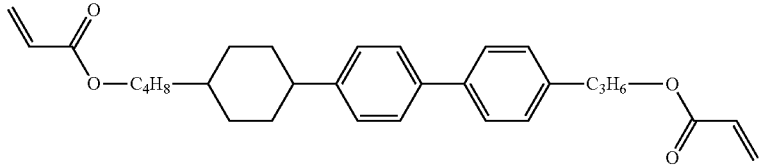

B102

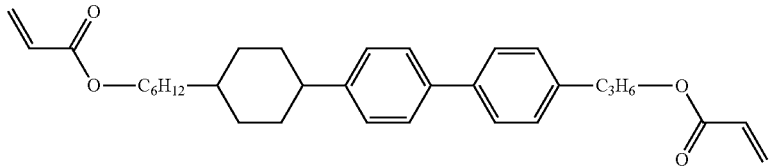

B103

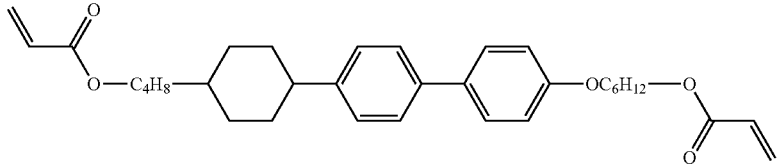

B104

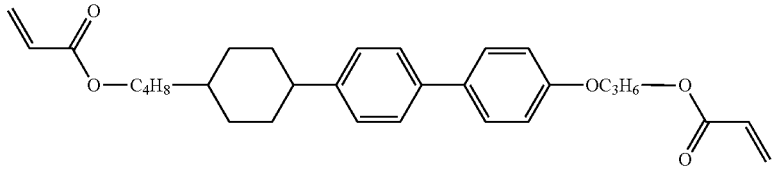

B105

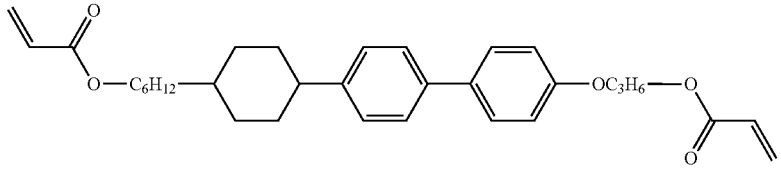

B106

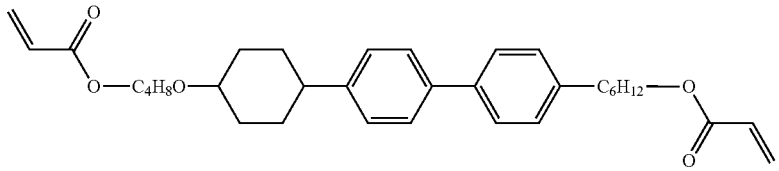

B107

B108
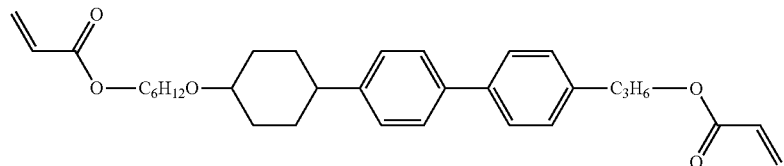
B109
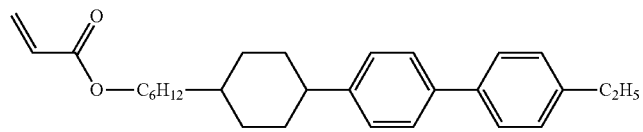
B110
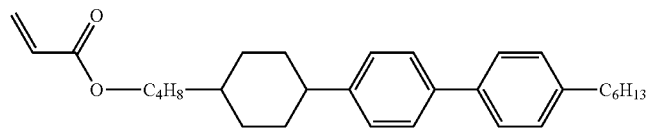
B111
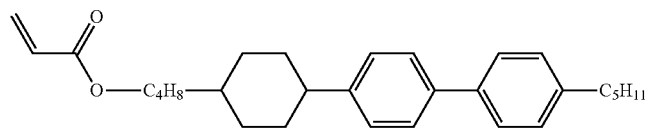
B112
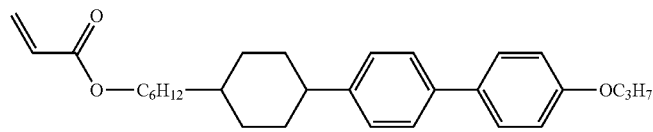
B113
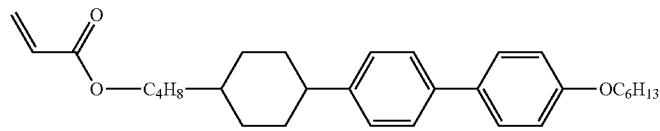
B114
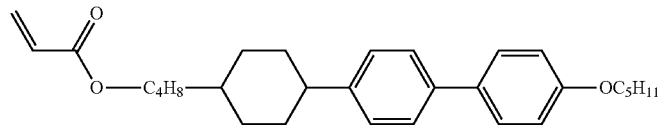
B115
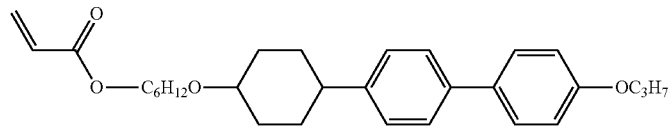
B116
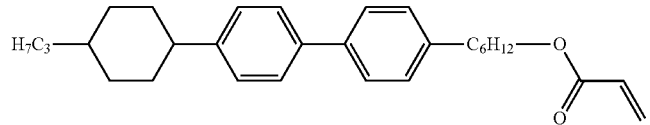
B117
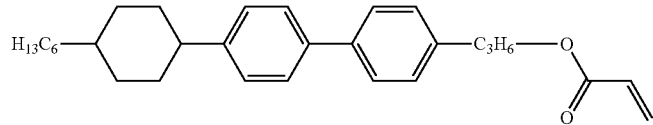
B118
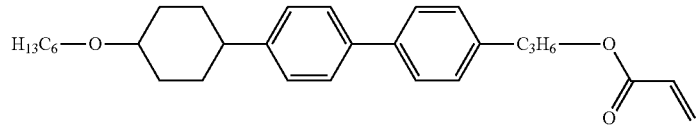

-continued

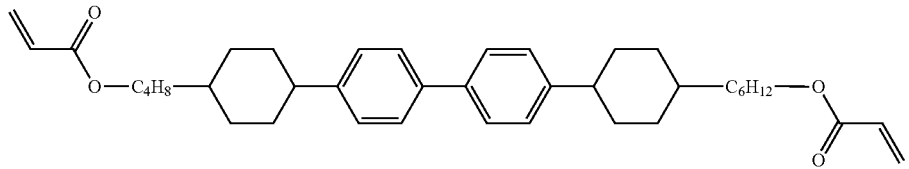
B119

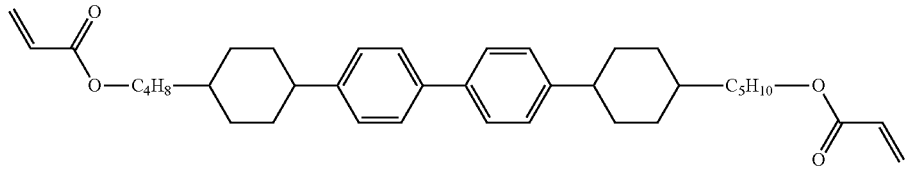
B120

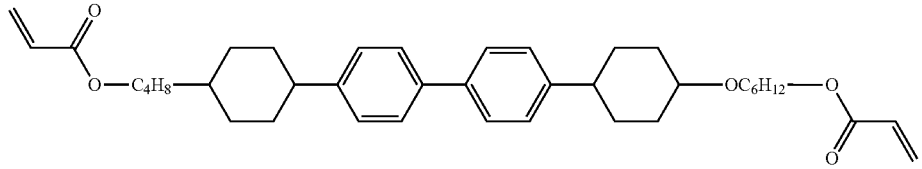
B121

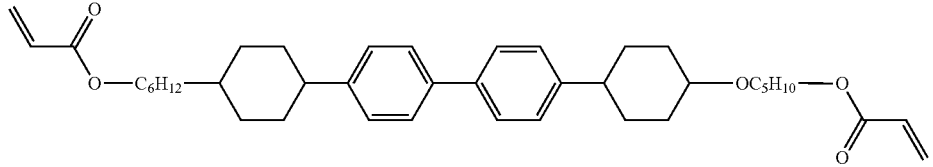
B122

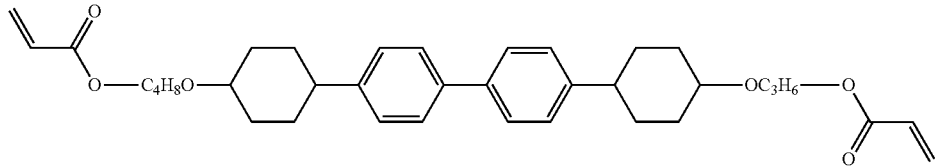
B123

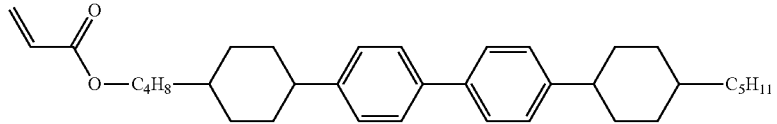
B124

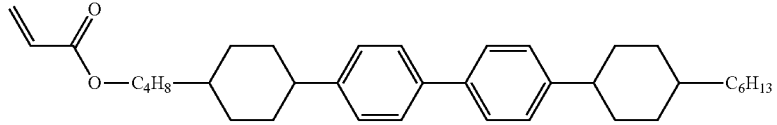
B125

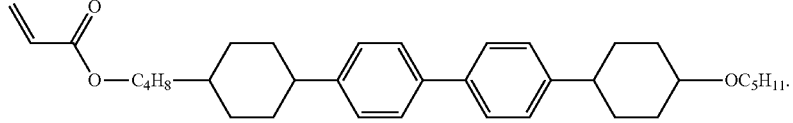
B126

The compounds B101 through B126 may all have the smetic B phase.

In an embodiment, a composition including the liquid crystalline compound may include a liquid crystalline compound represented by formula (B). In some embodiments, the composition may include a liquid crystalline compound represented by the above-described formula (B-1). In some embodiments, the composition may include a liquid crystalline compound represented by the above-described formula (B-2). In some embodiments, the composition may include both the liquid crystalline compound represented by formula (B-1) and the liquid crystalline compound represented by formula (B-2).

In some embodiments, the composition may further include a crosslinking agent, an initiator, and a solvent.

The crosslinking agent may be a substance that forms a cross-link so as to improve the degree of curing of a coating layer prepared by using the above composition. In an embodiment, the crosslinking agent may include a compound represented by one of formulae (F-1), (F-2), or (F-3):

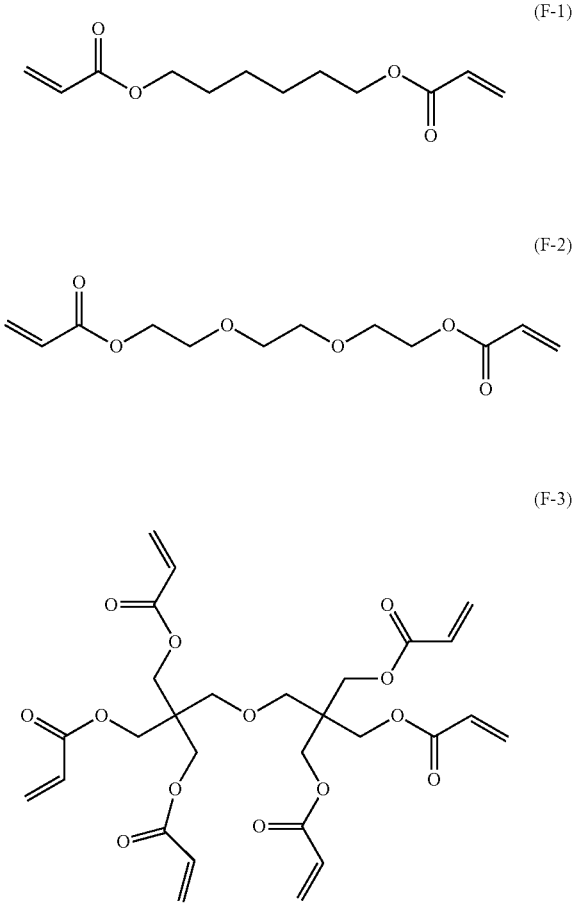

(F-1)

(F-2)

(F-3)

The initiator is not limited to a particular substance as long as it can initiate polymerization of a photopolymerizable group of a dye compound represented by formula (A) and a photopolymerizable group of a reactive-liquid crystalline compound (e.g., represented by formula (B)) in response to light irradiation. For example, the initiator may be a photoinitiator that initiates polymerization in response to light having a wavelength of about 365 nm or about 254 nm.

In an embodiment, a composition according to an embodiment may include about 200 to about 400 parts by weight of the liquid crystalline compound, based on 100 parts by weight of the dye compound, and may further include about 10 to about 100 parts by weight of the crosslinking agent, based on 100 parts by weight of the dye compound. When the liquid crystalline compound is included in an amount of about 200 parts by weight or more (e.g., about 200 to about 400 parts by weight), it may sufficiently form a stable alignment by forming a smectic B-phase host in the composition. When the liquid crystalline compound is included in an amount of about 400 parts by weight or less (e.g., about 200 to about 400 parts by weight), a content ratio of the dichroic dye compound which is a guest material can be ensured to sufficiently absorb a polarization component oscillating in the absorption axis direction of the dye compound. Therefore, a coating layer having polarization characteristics can be formed.

The solvent is not particularly limited as long as it is a solvent in which the dye compound and the liquid crystalline compound can be dissolved. Examples of the solvent include, but are not limited to, propylene glycol monomethyl ether acetate, methyl ethyl ketone, γ-butyrolactone, anisole, toluene, xylene, or the like.

In a non-limiting example, a composition according to an embodiment may include, based on the total weight of the composition, about 20 to about 30% by weight of a dye compound, about 60 to about 80% by weight of a liquid crystalline compound, 0 to about 4% or more by weight of a crosslinking agent, and the balance solids and solvent.

For example, the dye compound may include, based on the total weight of the composition according to the embodiment, about 6 to about 10% by weight of the dye compound represented by formula (A-1), about 6 to about 10% by weight of the dye compound represented by formula (A-2), and about 6 to about 10% by weight of the dye compound represented by formula (A-3).

In addition, the liquid crystalline compound may include, based on the total weight of the composition according to the embodiment, about 40 to about 70% by weight of the liquid crystalline compound represented by formula (B-1) and about 5 to about 10° % by weight of the liquid crystalline compound represented by formula (B-2). The content of the liquid crystalline compound represented by formula (B-1) may be made greater than the content of the liquid crystalline compound represented by formula (B-2) to form a phase that facilitates the alignment of the dye compound and the liquid crystalline compound.

The composition according to the embodiment may maintain the smectic B phase at any temperature in a range of about 0 to about 100° C.

Hereinafter, methods of preparing the compounds according to the above embodiments will be described.

According to an exemplary embodiment, a dye compound can be prepared through the following reaction.

(1-1)

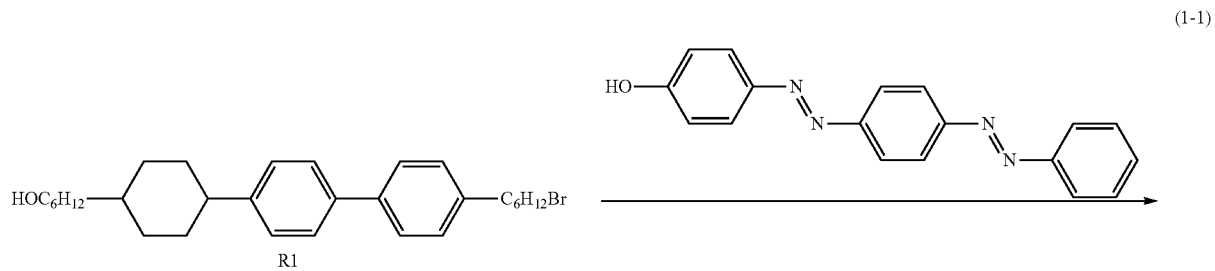

R1

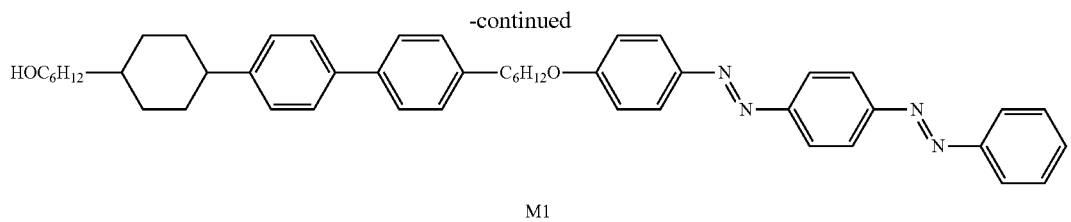

M1

Referring to reaction scheme (1-1), an intermediate M1 is prepared by reacting {4-[4'-(bromohexyl)biphenyl-4-yl]cyclohexyl}hexanol (R1) with 4-[(E)-{4-[(E)-phenyldiazenyl]phenyl}diazenyl]phenol.

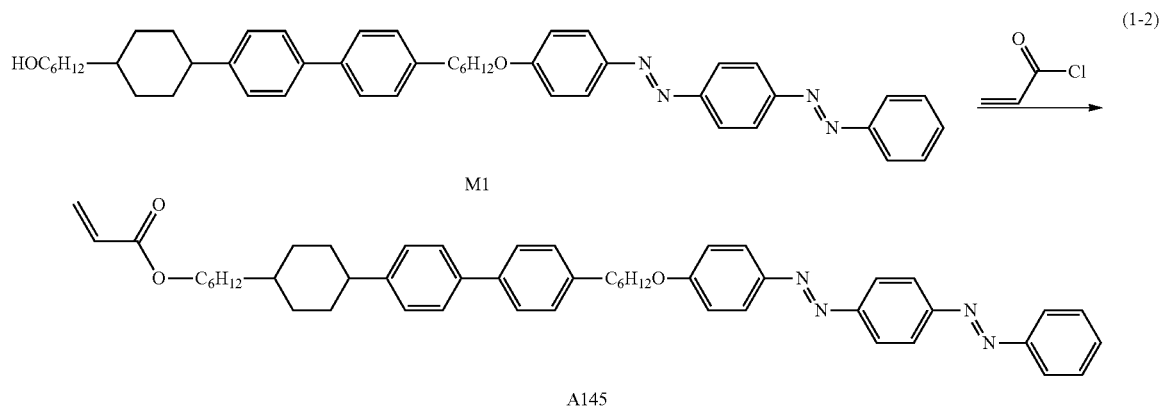

Referring to reaction scheme (1-2), a compound A145 can be prepared by reacting the intermediate M1 with prop-2-enoyl chloride.

According to another exemplary embodiment, a dye compound can be prepared through the following reaction.

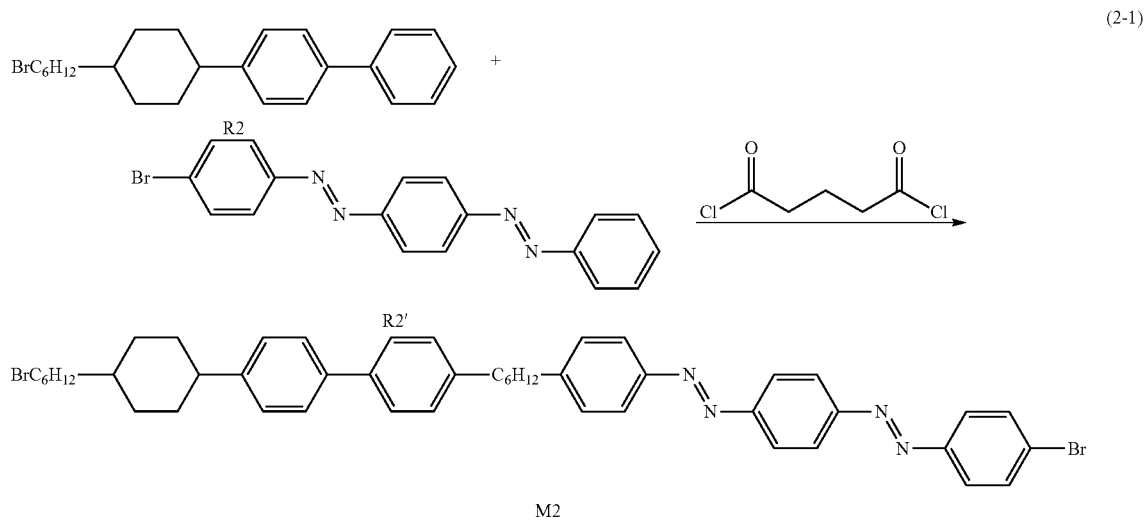

Referring to reaction scheme (2-1), an intermediate M2 is prepared by reacting 4-[4-(bromohexyl)cyclohexyl]biphenyl (R2) with (E)-1-(4-bromophenyl)-2-{4-[(E)-phenyldiazenyl]phenyl}diazene (R2') under pentanedioyl dichloride.

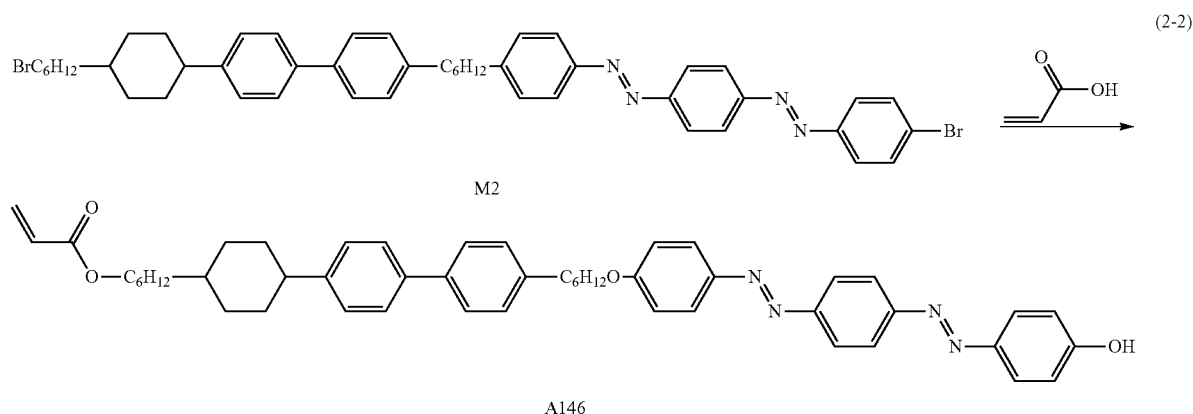

(2-2)

Referring to reaction scheme (2-2), a compound A146 can be prepared by reacting the intermediate M2 with prop-2-enoic acid.

According to yet another exemplary embodiment, a dye compound can be prepared through the following reaction.

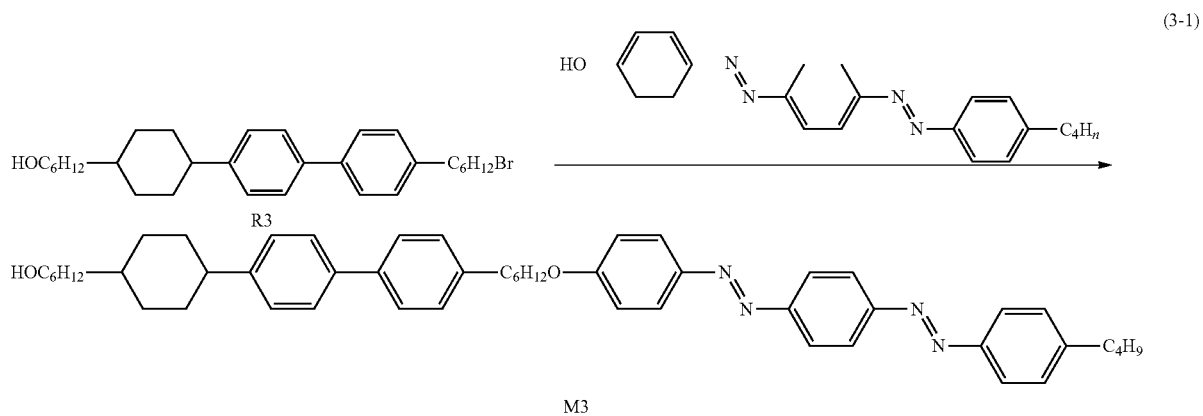

(3-1)

Referring to reaction scheme (3-1), an intermediate M3 is prepared by reacting {4-[4'-(bromohexyl)biphenyl-4-yl] cyclohexyl}hexanol (R3) with 4-[(E)-{4-[(E)-(4-butylphenyl)diazenyl]phenyl}diazenyl]phenol.

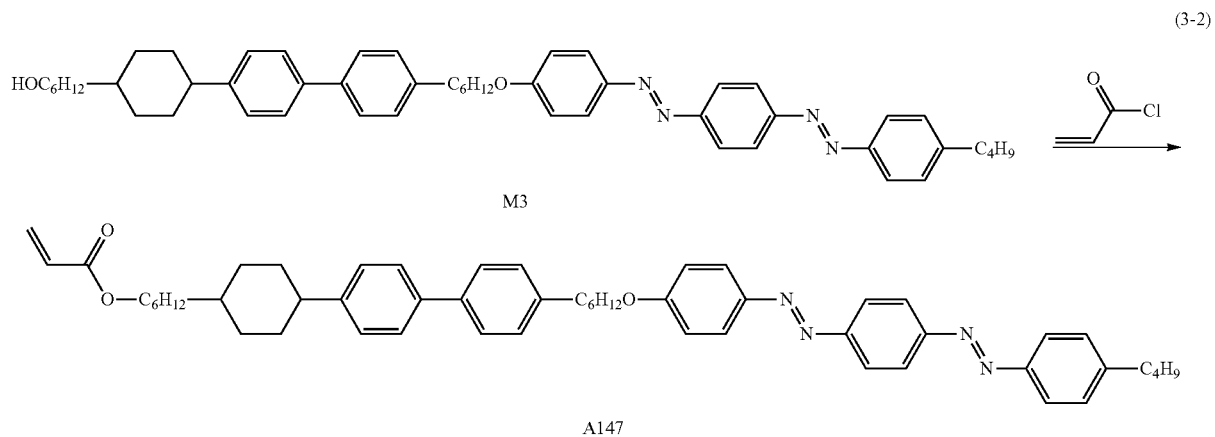

(3-2)

Referring to reaction scheme (3-2), a compound A147 can be prepared by reacting the intermediate M3 with prop-2-enoyl chloride.

According to yet another exemplary embodiment, a dye compound can be prepared through the following reaction.

(4-1)

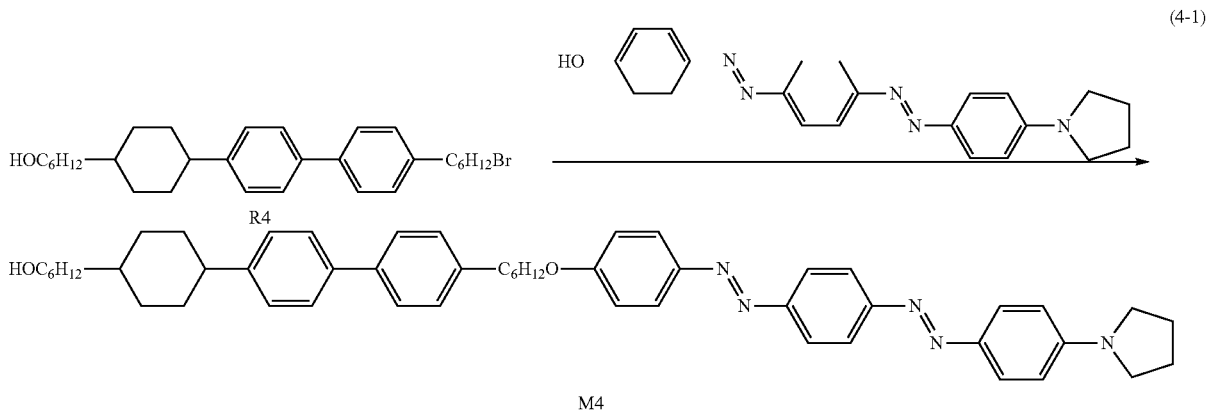

Referring to reaction scheme (4-1), an intermediate M4 is prepared by reacting {4-[4'-(bromohexyl)biphenyl-4-yl]cyclohexyl}hexanol (R4) with 4-[(E)-(4-{(E)-[4-(pyrrolidin-1-yl)phenyl]diazenyl}phenyl)diazenyl]phenol.

(4-2)

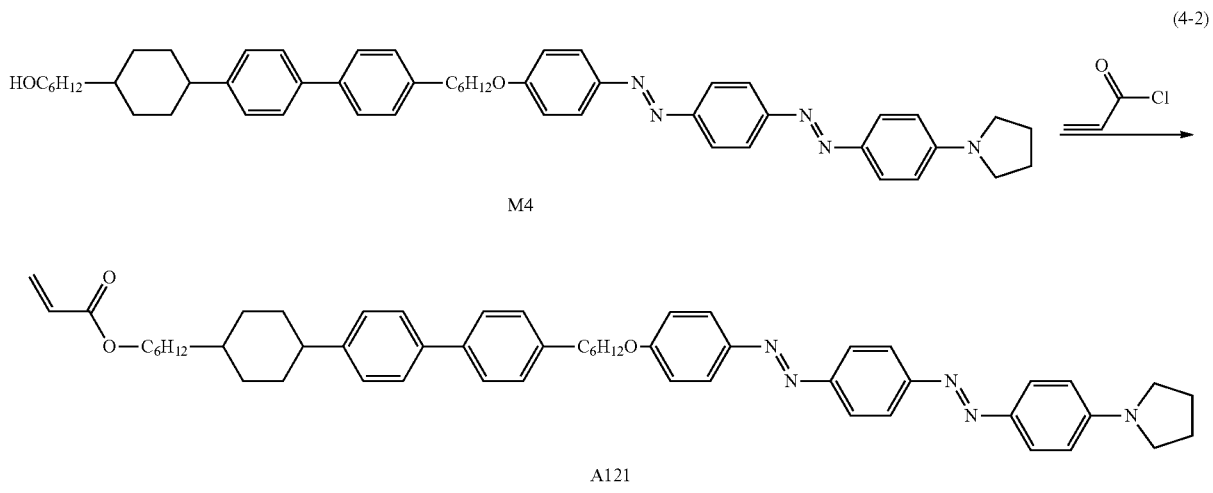

Referring to reaction scheme (4-2), a compound A121 can be prepared by reacting the intermediate M4 with prop-2-enoyl chloride.

According to yet another exemplary embodiment, a dye compound can be prepared through the following reaction.

(5-1)

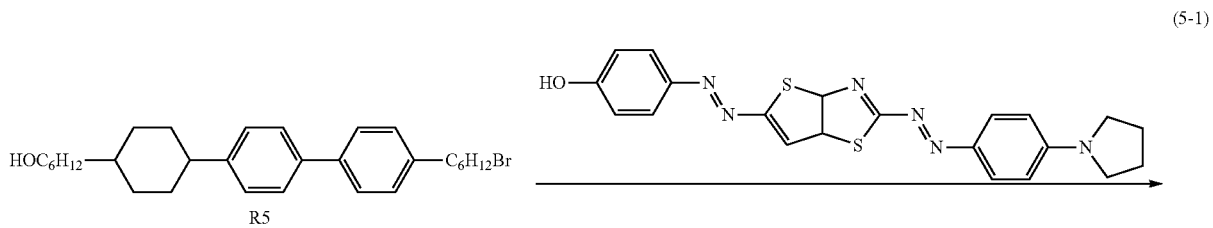

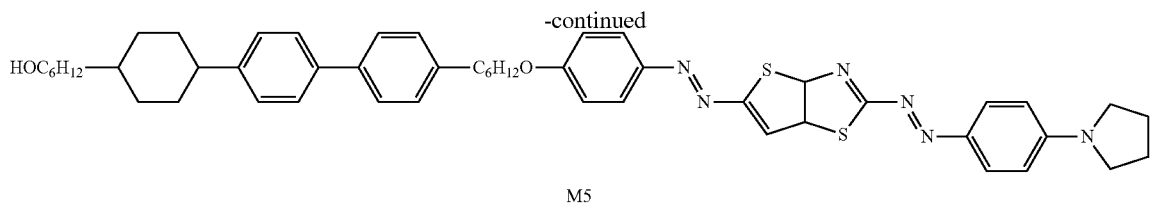

M5

Referring to reaction scheme (5-1), an intermediate M5 is prepared by reacting {4-[4'-(bromohexyl)biphenyl-4-yl]cyclohexyl}hexanol (R5) with 4-[(E)-(2-{(E)-[4-(pyrrolidin-1-yl)phenyl]diazenyl}-3a,6a-dihydrothieno[2,3-d][1,3]thiazol-5-yl)diazenyl]phenol.

(5-2)

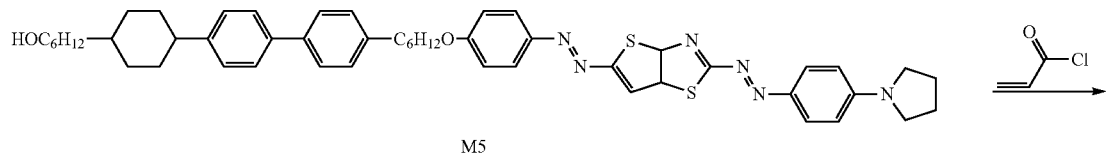

M5

[structure]

A135

Referring to reaction scheme (5-2), a compound A135 can be prepared by reacting the intermediate M5 with prop-2-enoyl chloride.

Hereinafter, polarizers according to embodiments will be described with reference to the accompanying drawings. For simplicity, a redundant description of substituents of formulas referred to as the same chemical formulas as those described above will be omitted, and the description of substituents will be clearly understood by those skilled in the art.

Figure 2:
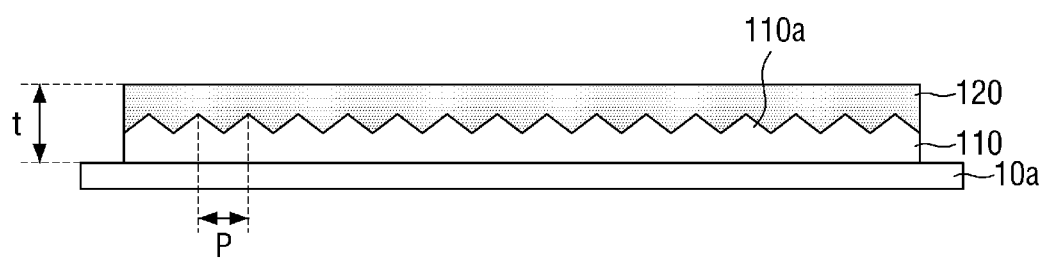
FIG. 2 is a cross-sectional view taken along the line II-II' of FIG. 1.

FIG. 1 is an exploded perspective view of a polarizer 10 according to an embodiment. FIG. 2 is a cross-sectional view taken along the line II-II' of FIG. 1.

Referring to FIGS. 1 and 2, the polarizer 10 according to an embodiment may include a base 10a, a dye alignment layer 110, and a polarizing layer 120.

The base 10a provides a space in which the dye alignment layer 110 and the polarizing layer 120 can be disposed and supports the dye alignment layer 110 and the polarizing layer 120. In an example, the base 10a may be a translucent substrate such as synthetic resin or glass. In another example, the base 10a may be a thin film such as an overcoat layer or an insulating layer made of an organic material and/or an inorganic material. That is, the polarizer 10 according to an embodiment may be provided in the form of a polarizing plate or film including the separate base 10a or may be directly disposed on a display device in the form of a coating layer and integrated with a display panel.

The dye alignment layer 110 may be disposed on the base 10a. The dye alignment layer 110 may induce the alignment of a dye compound in the polarizing layer 120 disposed on the dye alignment layer 110. For example, the dye alignment layer 110 may induce the alignment of a dye compound having a mesogenic skeleton in a coating composition (e.g., a composition as described herein) for forming the polarizing layer 120. The dye alignment layer 110 may also induce the alignment of a liquid crystalline compound having a mesogenic skeleton in the coating composition. The alignment anisotropy of the dye alignment layer 110 and the physical/chemical affinity between the dye compound and the liquid crystalline compound may cause the dye compound and the liquid crystalline compound to be aligned in the same direction.

A surface (an upper surface in the drawings) of the dye alignment layer 110 which faces the polarizing layer 120 to be described later may have a surface shape having alignment anisotropy. For example, the alignment anisotropy may be physical anisotropy. In an embodiment, the surface (the upper surface in the drawings) of the dye alignment layer 110 may include a plurality of linear protruding patterns 110a extending in a first direction X and repeated in a second direction Y intersecting the first direction X. In FIG. 2, each of the protruding patterns 110a has two sloping sidewalls and a peak formed by the two sidewalls in a cross section cut along the second direction Y. Thus, each of the protruding patterns 110a has a substantially triangular cross-sectional shape. However, in an embodiment, sidewalls of each protruding pattern may be perpendicular to a surface of the base 10a, and an upper surface of each protruding pattern may have a predetermined area. Thus, each protruding pattern may have a substantially quadrilateral cross-sectional shape. The protruding patterns 110a of the dye alignment layer 110 may be formed by a patterning method such as nanoimprinting, for example.

A pitch P of the protruding patterns 110a may be about 700 nm or less, about 500 nm or less, or about 100 nm or less. The pitch P of the protruding patterns 110a refers to a distance from the peak of a protruding pattern 110a repeatedly disposed along the second direction Y to the peak of a next protruding pattern 110a. The protruding patterns 110a having the pitch of 700 nm or less can induce the self-alignment of the liquid crystalline compound and the dye compound in the polarizing layer 120 which will be described later.

The material that forms the dye alignment layer 110 having the protruding patterns 110a is not particularly limited as long as it has excellent adhesion to the coating composition for forming the polarizing layer 120. For example, the dye alignment layer 110 may be made of a metal material such as aluminum, copper, or the like, or a synthetic resin material such as polyvinyl alcohol, polyimide, polyamide, cyclo polyolefin, epoxy, phenol, or the like.

The polarizing layer 120 may be disposed directly on the dye alignment layer 110. The polarizing layer 120 may have a polarizing ability by including a polymer of a dichroic dye compound. The polarizing layer 120 may transmit a polarization component oscillating in a direction parallel to its transmission axis and absorb a polarization component oscillating in a direction parallel to an absorption axis. Therefore, the polarizing layer 120 can convert unpolarized incident light into light polarized in a specific direction. As used herein, "unpolarized light" refers to light that is not composed only of polarization components in a specific direction, that is, light that is not polarized only in a specific direction, in other words, light that is composed of random polarization components. The sum (t) of thicknesses of the dye alignment layer 110 and the polarizing layer 120 may be about 10 micrometer (μm) or less.

The polarizing layer 120 may be formed by applying and polymerizing a composition according to any one of the above-described embodiments. The method of applying the polarizing layer 120 is not particularly limited. For example, the polarizing layer 120 may be applied by slit coating or spin coating.

The polarizing layer 120 includes a polymer of at least one dye compound. In an embodiment, the at least one dye compound may include one or more of dye compounds represented by formula (A):

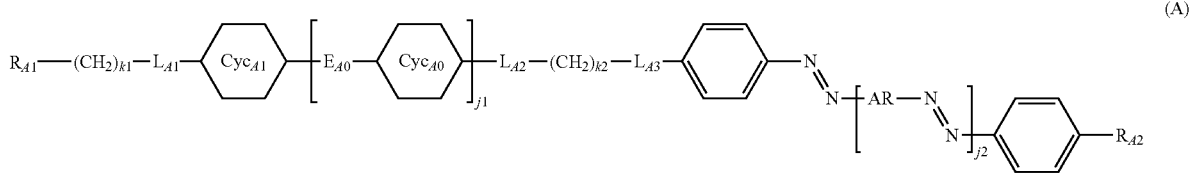

(A)

The dye compounds represented by formula (A) may be dye compounds represented by formulae (A-1), (A-2), or (A-3):

compound represented by formula (A-1), a polymer of a dye compound represented by formula (A-2), and a polymer of a dye compound represented by formula (A-3).

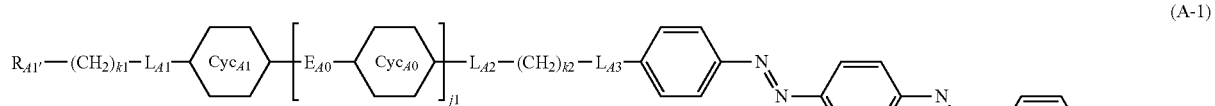

(A-1)

(A-2)

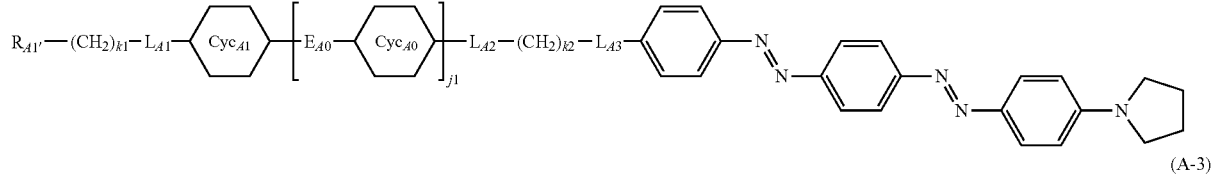

(A-3)

Substituents of dye compounds having the structures represented by formula (A) and formulae (A-1) through (A-3) and exemplary compounds have been described above and thus will not be described again.

In addition, the polarizing layer 120 may further include a polymer of one or more of reactive-liquid crystalline compounds described herein. The reactive-liquid crystalline compounds may be liquid crystalline compounds having a structure represented by formula (B):

In some embodiments, the polarizing layer 120 may include both a polymer of a liquid crystalline compound represented by formula (B-1) and a polymer of a liquid crystalline compound represented by formula (B-2).

In an embodiment, a main chain formed by the polymer of the dye compound and/or the polymer of the liquid crystalline compound of the polarizing layer 120 may be represented by formula (C):

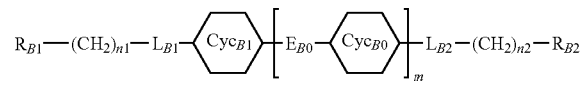

(B)

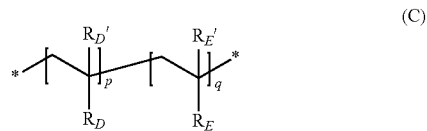

(C)

The liquid crystalline compounds represented by formula (B) may be liquid crystalline compounds represented by formulae (B-1) or (B-2):

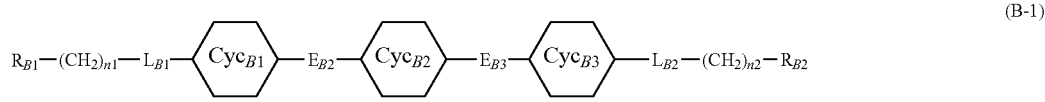

(B-1)

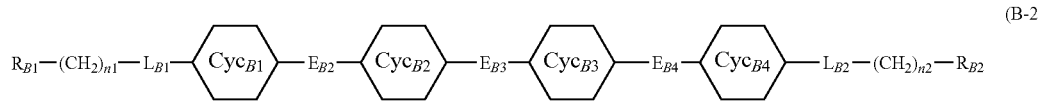

(B-2)

Substituents of liquid crystalline compounds having the structures represented by formulae (B), (B-1), and (B-2) and exemplary compounds have been described above and thus will not be described again.

For example, the polarizing layer 120 may include, as a polymer of a dye compound, all of a polymer of a dye wherein each $R_D$ is independently a substituent represented by formula (D) below, that is, a monovalent atomic group. In addition, each $R_D'$ may independently be a hydrogen atom or a methyl group, and p may be an integer of 0 to 100. The substituents $R_D$ and $R_D'$ in each repeating unit of the main chain defined by p may be the same or different from those in other repeating units.

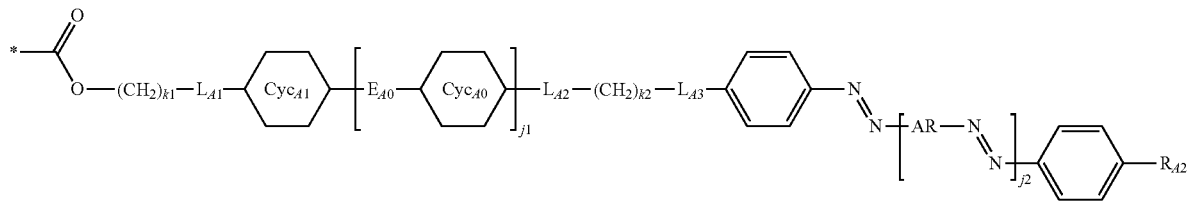

(D)

The substituent represented by formula (D) may be a monovalent atomic group derived from a dye compound represented by the above-described formula (A).

For example, in formula (D), $Cyc_{A1}$ and each $Cyc_{A0}$ may each independently be 1,4-phenylene or 1,4-cyclohexylene. In addition, j, which defines a repeating unit of a mesogenic basic skeleton in the substituent represented by formula (D), may be an integer of 1 to 3, and each $E_{A0}$ may independently be a single bond, *—(C=O)O—*, *—O(C=O)—*, $C_{1-4}$ alkylene of the formula *—$(CH_2)_k$—* wherein k is a natural number, *—CH=CH—*, or *—C≡C—*. $E_{A0}$ and $Cyc_{A0}$ in each repeating unit defined by j1 may be the same or different from those in other repeating units.

In the above formula (D), each AR may independently be 1,4-phenylene or

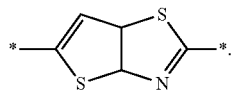

In addition, j2, which defines a repeating unit of a basic skeleton representing the coloring property in the substituent represented by formula (D), may be an integer of 1 or 2, and AR in each repeating unit defined by j2 may be the same or different from that in other repeating units.

$L_{A1}$ may be a single bond, *—O—*, *—(C=O)O—*, or *—O(C=O)—*. In addition, k1 may define the length of an alkylene group linking a mesogenic skeleton and an ester group (—C(=O)O—). k1 may be an integer of 0 to 12. $L_{A2}$ and $L_{A3}$ may each independently be a single bond or *—O—*, and k2 may be an integer of 6 to 10. $R_{A2}$ may be a hydrogen atom, a hydroxy group, an alkyl group, an alkoxy group, or

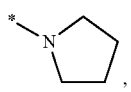

In the above formula (C), each $R_E$ is independently a monovalent atomic group represented by formula (E) below. In addition, each $R_E'$ is independently a hydrogen atom or a methyl group, q is an integer of 0 to 100, and both p and q are not zero. The substituents $R_E$ and $R_E'$ in each repeating unit of the main chain defined by q may be the same or different from those in other repeating units.

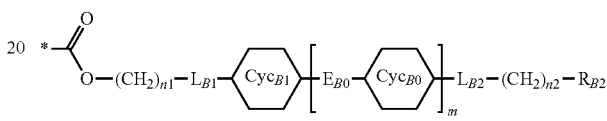

(E)

The substituent represented by formula (E) may be a monovalent atomic group derived from a liquid crystalline compound represented by formula (B) described above.

For example, in formula (E). $Cyc_{B1}$ and each $Cyc_{B0}$ may each independently be 1,4-phenylene or 1,4-cyclohexylene. In addition, m, which defines a repeating unit of a mesogenic basic skeleton in the substituent represented by formula (E), may be an integer of 1 to 3, and each $E_{B0}$ may independently be a single bond, *—(C=O)O—*, *—O(C=O)—*, $C_{1-4}$ alkylene of the formula *—$(CH_2)_k$—* wherein k is a natural number, *—CH=CH—*, or *—C≡C—*. $E_{B0}$ and $Cyc_{B0}$ in each repeating unit defined by m may be the same or different from those in other repeating units.

$L_{B1}$ and $L_{B2}$ may each independently be a single bond, *—O—*, *—(C=O)O—*, or *—O(C=O)—*. In addition, n1 and n2 may each independently be an integer of 0 to 12. $R_{B2}$ may be a hydrogen atom, an acrylate group, or a methacrylate group.

In some embodiments, the repeating unit

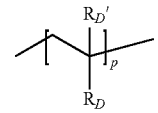

of the main chain represented by the above formula (C) may be represented by any one of the following formulae (C-1), (C-2), or (C-3):

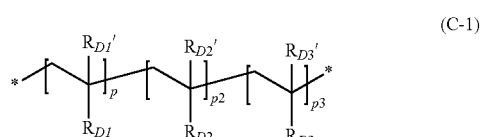

(C-1)

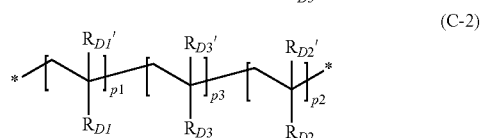

(C-2)

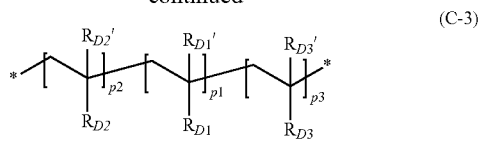
(C-3)

In the above formulae (C-1) through (C-3), each $R_{D1}$ may independently be a monovalent atomic group represented by formula (D-1) below. Also, each $R_{D1}'$ may independently be a hydrogen atom or a methyl group, and p1 may be an integer of 1 to 30. $R_{D1}$ and $R_{D1}'$ in each repeating unit of the main chain defined by p1 may be the same or different from that in other repeating units.

In addition, each $R_{D2}$ may independently be a monovalent atomic group represented by formula (D-2) below, and each $R_{D2}'$ may independently be a hydrogen atom or a methyl group. p2 may be an integer of 1 to 30, and $R_{D2}$ and $R_{D2}'$ in each repeating unit of the main chain defined by p2 may be the same or different from that in other repeating units.

Each $R_{D3}$ may independently be a monovalent atomic group represented by formula (D-3) below, and each $R_{D3}'$ may independently be a hydrogen atom or a methyl group. p3 may be an integer of 1 to 30, and $R_{D3}$ and $R_{D3}'$ in each repeating unit of the main chain defined by p3 may be the same or different from that in other repeating units.

be a monovalent atomic group derived from the dye compound represented by the above-described formula (A-3).

Other substituents of formulae (D-1) through (D-3) are the same as those defined in formula (D) above and thus will not be described again.

The main chain represented by any one of formulae (C-1) through (C-3) according to an embodiment may have any of the substituents (i.e., a side chains) represented by formula (D-1), the substituent represented by formula (D-2), and the substituent represented by formula (D-3). For example, the substituent represented by formula (D-1) may include an azo chromophore to absorb light in a wavelength band of about 400 to about 500 nm, and the substituent represented by formula (D-2) may include an azo chromophore to absorb light in a wavelength band of about 500 to about 600 nm. In addition, the substituent represented by formula (D-3) may include an azo chromophore to absorb light in a wavelength band of about 600 to about 700 nm. Accordingly, the polarizing layer 120 can have excellent absorbance for the entire visible wavelength band (e.g., about 400 to about 700 nm) and absorb light of polarization components oscillating in the absorption axis direction of the polarizer 10, regardless of wavelength band.

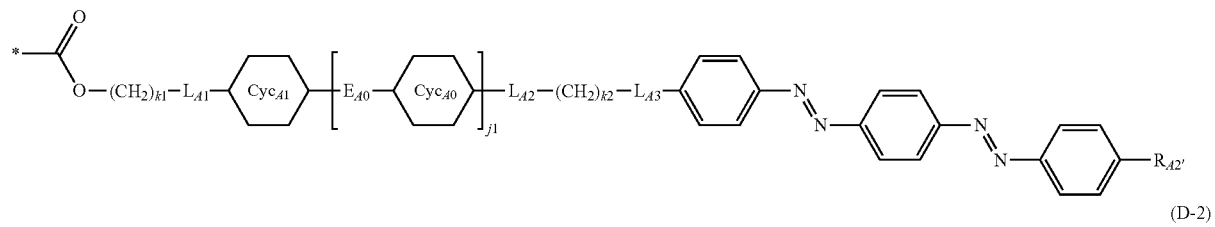
(D-1)

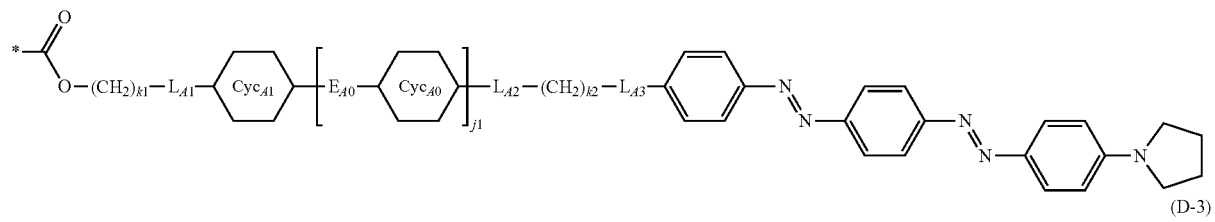
(D-2)

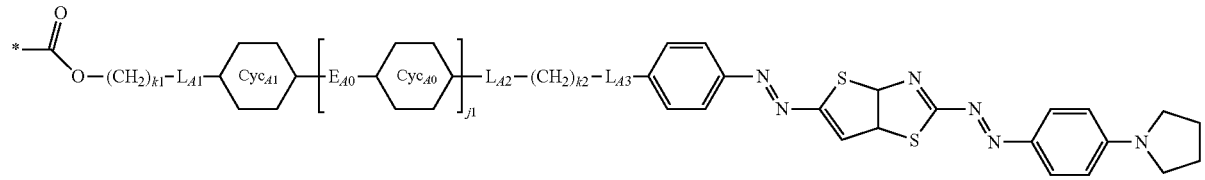
(D-3)

The substituent represented by formula (D-1) may be a monovalent atomic group derived from the dye compound represented by the above-described formula (A-1). For example, $R_{A2}'$ may be a $C_{1-10}$ alkyl group or a $C_{1-10}$ alkoxy group. In addition, the substituent represented by formula (D-2) may be a monovalent atomic group derived from the dye compound represented by the above-described formula (A-2), and the substituent represented by formula (D-3) may In some embodiments, the repeating unit

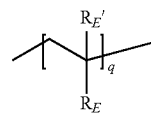

of the main chain represented by formula (D) may be represented by formula (C-4):

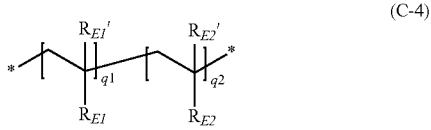

In formula (C-4), each $R_{E1}$ may independently be a monovalent atomic group represented by formula (E-1) below. In addition, each $R_{E1}$ may independently be a hydrogen atom or a methyl group, and q1 may be an integer of 1 to 30. $R_{E1}$ and $R_{E1}'$ in each repeating unit of the main chain defined by q1 may be the same or different from those in other repeating units.

In addition, each $R_{E2}$ may independently be a monovalent atomic group represented by formula (E-2) below, and each $R_{E2}'$ may independently be a hydrogen atom or a methyl group. q2 may be an integer of 1 to 30, and $R_{E2}$ and $R_{E2}'$ in each repeating unit of the main chain defined by q2 may be the same or different from those in other repeating units.

formula (C-4) or bonded to an end of the repeating unit defined by q2 in the main chain represented by formula (C-4).

Figure 3:
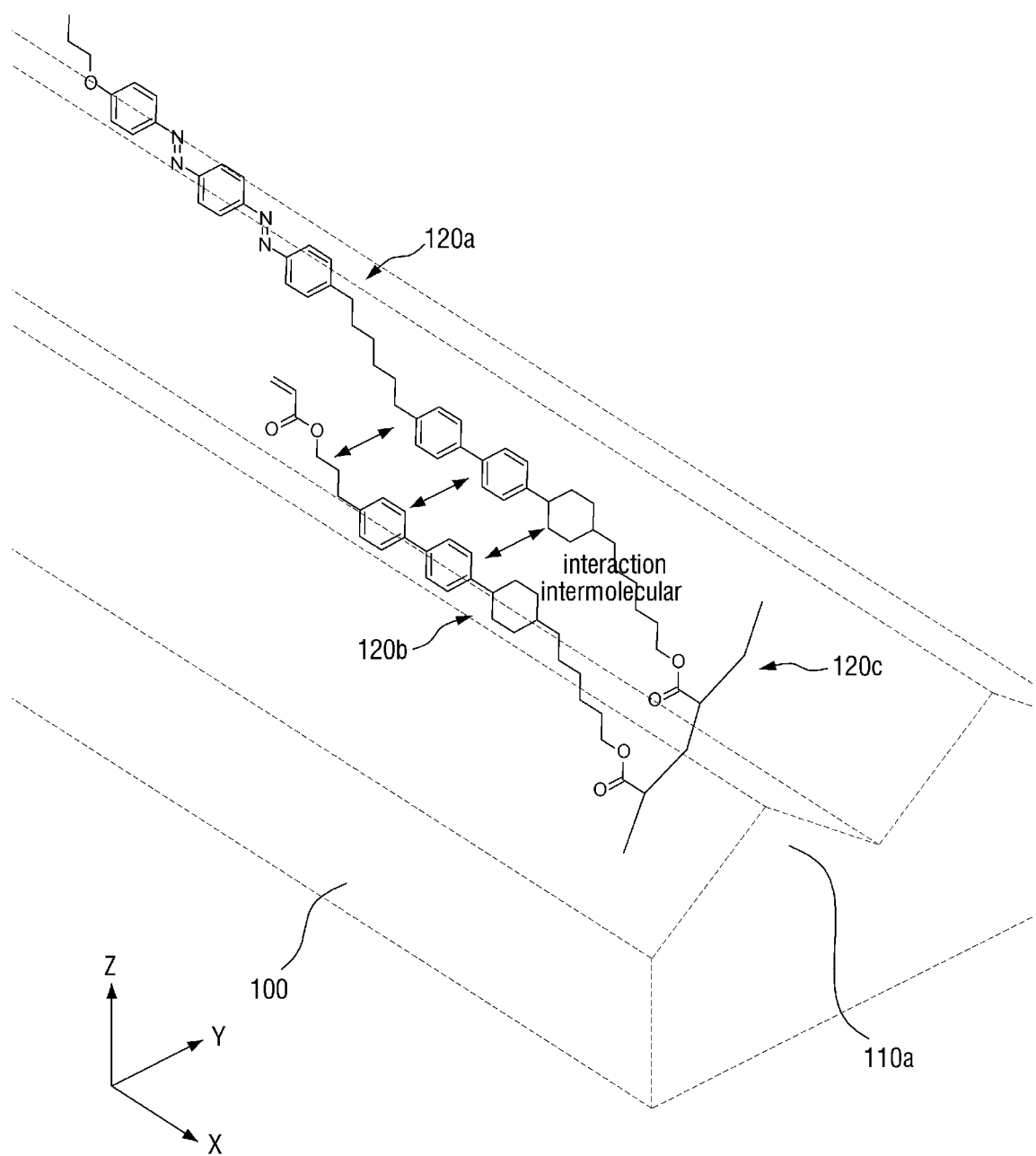
FIG. 3 is a schematic diagram illustrating the alignment state of a dye compound and a liquid crystalline compound in a polarizing layer of FIG. 1.

The alignment state of the dye compound and the liquid crystalline compound in the polarizing layer 120 according to an embodiment will now be described with reference to FIG. 3. FIG. 3 is a schematic diagram illustrating the alignment state of the dye compound and the liquid crystalline compound in the polarizing layer 120 of FIG. 1.

Referring to FIG. 3, a main chain 120c of a polymer in the polarizing layer 120 has a first side chain 120a derived from a dye compound and a second side chain 120b derived from a reactive-liquid crystalline compound. That is, the first side chain 120a may have a mesogenic skeleton and a basic skeleton exhibiting the coloring property, and the second side chain 120b may have a mesogenic skeleton.

A long axis of the first side chain 120a and a long axis of the second side chain 120b may all be aligned in a direction substantially parallel to a direction (i.e., the first direction X) in which the protruding patterns 110a of the dye alignment layer 110 extend. For example, the reactive-liquid crystalline compound, which may be a smectic B-phase host material exhibiting an excellent order parameter, may be polymerized

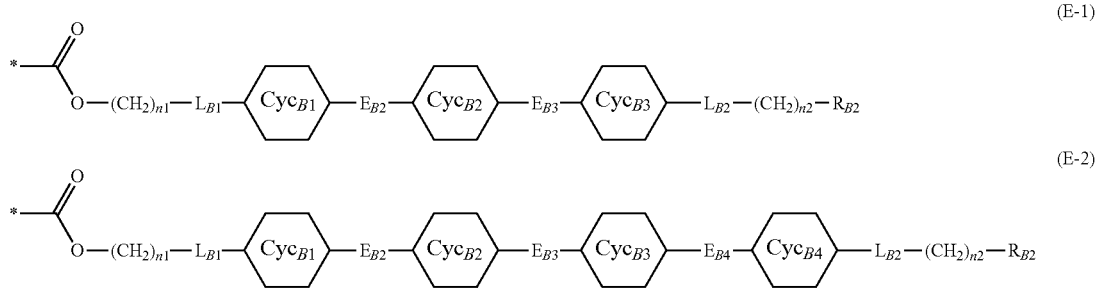

The substituent represented by formula (E-1) above may be a monovalent atomic group derived from the liquid crystalline compound represented by the above-described formula (B-1). The substituent represented by formula (E-2) above may be a monovalent atomic group derived from the liquid crystalline compound represented by the above-described formula (B-2). For example, in formulae (E-1) and (E-2), $Cyc_{B2}$, $Cyc_{B3}$ and $Cyc_{B4}$ may each independently be 1,4-phenylene or 1,4-cyclohexylene, and $E_{B2}$, $E_{B3}$ and $E_{B4}$ may each independently be a single bond, *—(C=O)O—*, *—O(C=O)—*, $C_{1-4}$ alkylene of the formula *—(CH$_2$)$_k$—* wherein k is a natural number, *—CH=CH—*, or *—C≡C—*.

Other substituents of formulae (E-1) and (E-2) are the same as those defined in formula (E) above and thus will not be described again.

The main chain represented by formula (C-4) according to an embodiment may have both the substituent represented by formula (E-1) and the substituent represented by formula (E-2). By using a liquid crystalline compound having an excellent order parameter and a substituent derived from the liquid crystalline compound, it is possible to further improve the alignment characteristics of the dye compound and easily control the alignment of the dye compound.

An end of the repeating unit defined by p in the main chain represented by formula (C) may be bonded to an end of the repeating unit defined by q1 in the main chain represented by in a state where its long axis is aligned in the first direction X by the protruding patterns 110a, thereby forming the second side chain 120b. In addition, the dye compound having the mesogenic skeleton and excellent affinity with the reactive-liquid crystalline compound may be polymerized in a state where its long axis is aligned in the first direction X by the protruding patterns 110a, thereby forming the first side chain 120a. The dye compound may maintain this state stably. In FIG. 3, the compound A109 described above is used as the dye compound that forms the first side chain 120a, and the compound B103 described above is used as the reactive-liquid crystalline compound that forms the second side chain 120b. However, the embodiments are not limited to this case.

The first side chain 120a, derived from the dye compound to have the coloring property and aligned in the first direction X may define the transmission axis and the absorption axis of the polarizer 10. In an embodiment in which the dye compound is a positive dichroic dye, the absorption axis of the polarizing layer 120 may be substantially parallel to the first direction X, and the transmission axis of the polarizing layer 120 may be substantially parallel to the second direction Y.

The polarizer 10 according to the current embodiment can have an excellent degree of polarization without a complicated process such as a stretching/pressure process. In addition, the polarizer 10 can be provided in the form of a polarizing plate or film including a separate base. Alternatively, the dye alignment layer 110 and the polarizing layer 120 can be provided in the form of a coating layer and integrated with a display panel of a display device during the process of manufacturing the display device.

In addition, a dye compound according to an embodiment has high linearity, a high dichroic ratio, and an excellent self-aligning ability. Therefore, the polarizing layer 120 having a sufficient degree of polarization can be formed even without a stretching process. Furthermore, since the dye compound has high physical/chemical stability, it can maintain a stable state even in a polymerized state and minimize the degradation of polarization characteristics due to heat or moisture.

Although embodiments are not limited to the following case, when the polarizing layer 120 includes additional dye compounds (or a polymer of the additional dye compounds), if there is a weak affinity between the additional dye compounds and the above-described liquid crystalline compound, the superior affinity between the dye compounds represented by formula (A), or the like, and the additional dye compounds, and the affinity between the dye compounds represented by formula (A) and the liquid crystalline compound, may be used to improve the dispersion characteristics of the additional dye compounds in the liquid crystalline compound that forms a host material.

A polarizer according to another exemplary embodiment will now be described.

Figure 4:
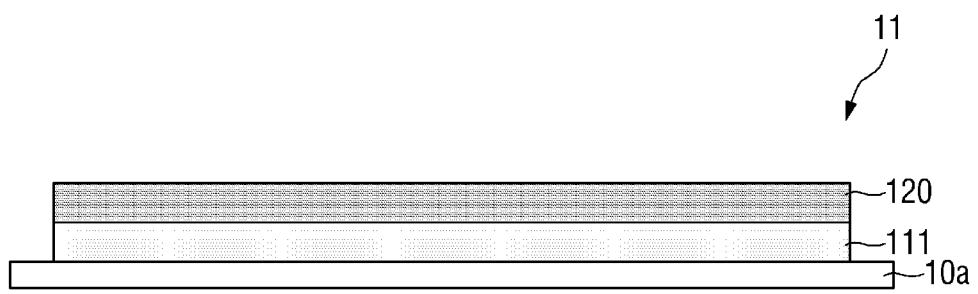
FIG. 4 is a cross-sectional view of a polarizer according to an embodiment.

FIG. 4 is a cross-sectional view of a polarizer 11 according to an embodiment.

Referring to FIG. 4, the polarizer 11 according to an embodiment is different from the polarizer 10 according to the embodiment of FIG. 1 in that a dye alignment layer 111 is made of an organic material and that alignment anisotropy is given through rubbing alignment or photo alignment.

In an embodiment, the dye alignment layer 111 may be an alignment film having a photoreactive group in a repeating unit. The alignment film may be a copolymer of a dianhydride-based compound and a diamine-based compound. The alignment film may be a polymer which includes a polyamic acid having a photoreactive group in a repeating unit, a polymer obtained by partial imidization of a polyamic acid having a photoreactive group in a repeating unit, or polyimide obtained by dehydrative cyclization of a polyamic acid having a photoreactive group in a repeating unit. The photoreactive group can be isomerized or decomposed in response to light. The dye alignment layer 111 may be formed by applying a composition containing the polymer material, irradiating polarized light to give an alignment ability, and then curing the composition.

In an embodiment, although a surface (an upper surface in the drawing) of the dye alignment layer 111 which faces a polarizing layer 120 does not have protruding patterns of a micron-level size, alignment anisotropy can be given to the dye alignment layer 111 through anisotropy exhibited by a main chain of a polymer chain in the dye alignment layer 111.

Accordingly, a side chain of a polymer of a dye compound and/or a side chain of a polymer of a reactive-liquid crystalline compound in the polarizing layer 120 can be aligned in one direction. For example, a side chain derived from the dye compound and a side chain derived from the reactive-liquid crystalline compound may be substantially parallel to a surface of a base 10a, and the side chains, for example all of the side chains, may be aligned in the one direction. The side chains aligned in the one direction and exhibiting the coloring property can define a transmission axis and an absorption axis of the polarizer 11.

Hereinafter, display devices according to embodiments will be described.

Figure 5:
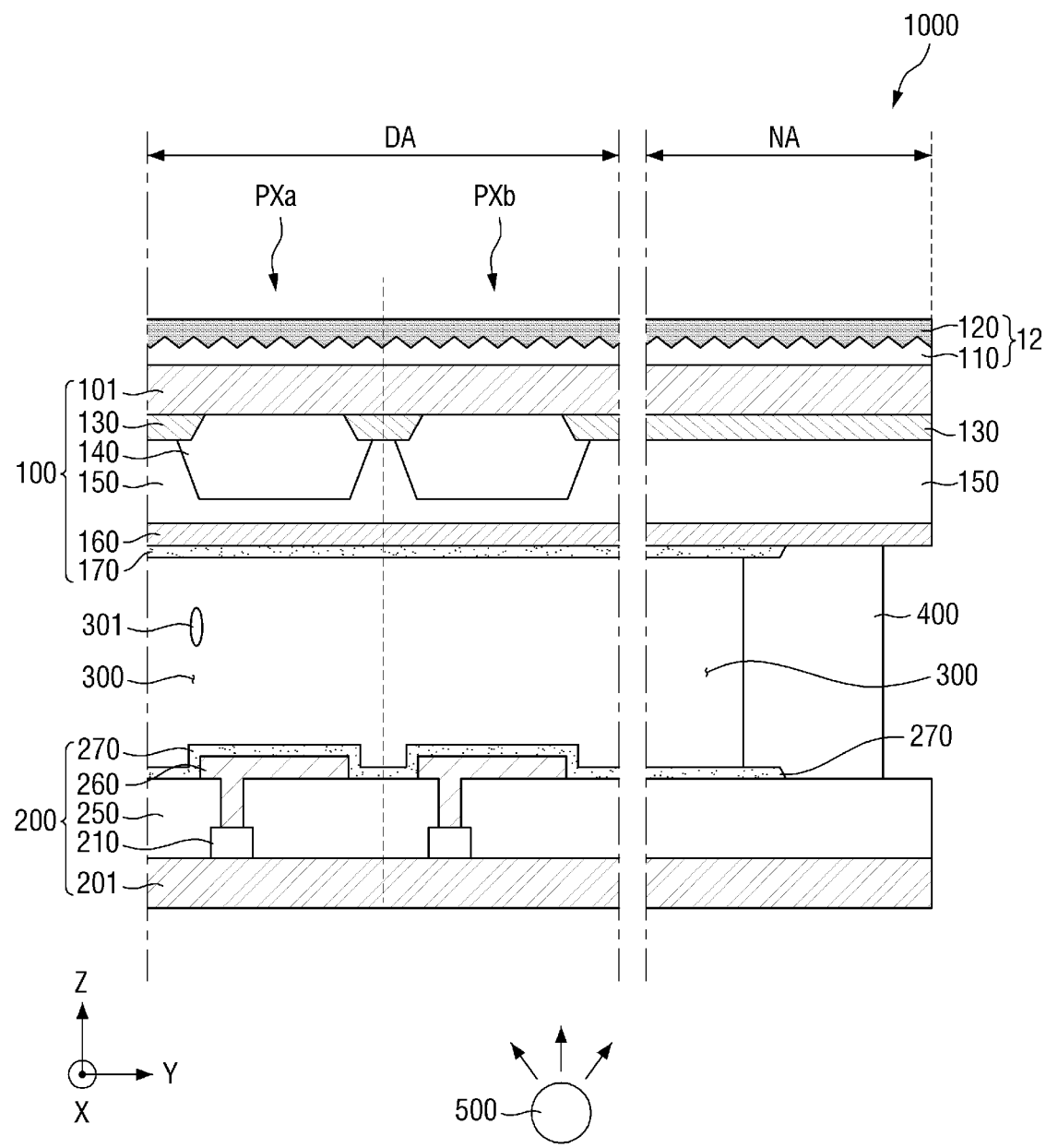
FIG. 5 is a cross-sectional view of a display device according to an embodiment.

FIG. 5 is a cross-sectional view of a display device 1000 according to an embodiment.

Referring to FIG. 5, the display device 1000 according to an embodiment includes a light source 500, a first display panel 100 and a second display panel 200 disposed on the light source 500, and further includes a polarizer 12 disposed on the first display panel 100.

The display area DA and the non-display area NA located outside the display area DA may be defined in the display panel. The display area DA is an area contributing to image display, and the non-display area NA is an area not contributing to image display.

The plurality of pixels PXa and PXb arranged in a substantially matrix form in plan view may be defined in the display area DA. As used herein, the term "pixel" denotes each of a plurality of regions into which the display area DA is divided for color display in plan view, and one pixel may be a minimum unit displaying a different color that can be distinguished from those of other pixels. That is, each of the pixels PXa and PXb may uniquely display one of primary colors to implement color display. Examples of the primary colors include red, green, and blue.

The display panel may include a first display panel 100, a second display panel 200 separated from the first display panel 100 to face the first display panel 100, a liquid crystal layer 300 interposed between the first display panel 100 and the second display panel 200, and a sealing member 400 for sealing the liquid crystal layer 300 by bonding the first and second display panels 100 and 200 together.

The first display panel 100 may be an upper panel located on an opposite side of the liquid crystal layer 300 from the light source 500. The first display panel 100 includes a first base substrate 101 and a color control pattern layer 140 and may further include a common electrode 160.

The first base substrate 101 may be a transparent insulating substrate. For example, the first base substrate 101 may be made of a glass material, a quartz material, or a translucent plastic material. In some embodiments, the first base substrate 101 may be flexible, and the display device 1000 may be a curved display device. The first base substrate 101 has a surface (a lower surface in the drawing) facing the second display panel 200 and the other surface (an upper surface in the drawing).

The light shielding member 130 may be disposed on the surface (the lower surface) of the first base substrate 101. In the display area DA, the light shielding member 130 may be disposed at each boundary between adjacent pixels PXa and PXb in a substantially quadrilateral lattice form in plan view. The light shielding member 130 can prevent a color mixture defect between neighboring pixels by blocking transmission of light. In addition, the light shielding member 130 may be disposed in the non-display area NA to block light provided from the light source 500 from transmitting through the non-display area NA of the display panel.

The color control pattern layer 140 may be disposed on the light shielding member 130. The color control pattern layer 140 may convert the color of transmitted light into a color different from that of incident light that is received from the light source 500. That is, light may be converted into light of a specific wavelength band as it passes through the color control pattern layer 140. The color control pattern layer 140 having a different color for each pixel may be disposed in a light path extending from the light source 500 to a viewer (not illustrated), so that the pixels PXa and PXb display different primary colors. In an embodiment, the color control pattern layer 140 may be a wavelength shift pattern layer including a material that shifts a peak wavelength of incident light to a specific peak wavelength, such as quantum dots or a phosphor material. In another embodiment, the color control pattern layer 140 may be a color filter that selectively transmits only part of a wavelength band of incident light by transmitting light of a specific wavelength band and absorbing light of another specific wavelength band.

The overcoat layer 150 may be disposed on the color control pattern layer 140. The overcoat layer 150 may planarize step differences between components stacked on the first base substrate 101 by compensating for the step differences. The overcoat layer 150 may be made of an organic material. The overcoat layer 150 may be disposed without distinction between the pixels PXa and PXb.

The common electrode 160 may be disposed on the overcoat layer 150. The common electrode 160 may be disposed without distinction between the pixels PXa and PXb, and a common voltage may be applied to the common electrode 160. The common electrode 160 may control the arrangement of a liquid crystal 301 in a corresponding pixel by forming an electric field in the liquid crystal layer 300 together with a pixel electrode 260 to be described later. The common electrode 160 may be a transparent electrode made of a transparent conductive material. Examples of the material that forms the transparent electrode include indium tin oxide (ITO) and indium zinc oxide (IZO). In some embodiments, the common electrode 160 may be disposed over the display area DA and the non-display area NA.

The first liquid crystal alignment layer 170 may be disposed on the common electrode 160. The first liquid crystal alignment layer 170 can induce initial alignment of the liquid crystals 301 in the adjacent liquid crystal layer 300. As used herein, the term "initial alignment of liquid crystals" refers to the arrangement of liquid crystals 301 in a state where no electric field has been formed in a liquid crystal layer 300. The first liquid crystal alignment layer 170 may be made, for example, of a polymer having an imide group in a repeating unit of a main chain, that is, a polyimide-based material. Part of the first liquid crystal alignment layer 170 may be located in the non-display area NA. In this case, the first liquid crystal alignment layer 170 may contact the sealing member 400. However, embodiments are not limited to this case.

Next, the second display panel 200 will be described. The second display panel 200 may be a lower panel located on a side of the liquid crystal layer 300 where the light source 500 is disposed. The second display panel 200 includes a second base substrate 201 and a switching element 210, and may further include the pixel electrode 260.

The second base substrate 201, like the first base substrate 101, may be a transparent insulating substrate. The second base substrate 201 has a surface (an upper surface in the drawing) facing the first display panel 100 and the other surface (a lower surface in the drawing).

The switching element 210 may be disposed on the surface (the upper surface in the drawing) of the second base substrate 201. The switching element 210 may be disposed in each of the pixels PXa and PXb to transmit a driving signal to the pixel electrode 260 or block the driving signal. In an embodiment, each switching element 210 may be a bottom gate transistor including a gate electrode, an active layer disposed on the gate electrode, and a source electrode and a drain electrode disposed on the active layer to be separated from each other (not shown). The active layer may include amorphous silicon or an oxide semiconductor.

The intermediate layer 250 may be disposed on the switching element 210. The intermediate layer 250 may electrically insulate components disposed on the intermediate layer 250 from components disposed under the intermediate layer 250 (i.e., components disposed on opposite sides of the intermediate layer 250) and planarize step differences between a plurality of components stacked on the second base substrate 201 by compensating for the step differences. The intermediate layer 250 may include one or more layers. For example, the intermediate layer 250 may be a stacked structure of a layer made of an organic material and a layer made of an inorganic material. Examples of the inorganic material include silicon nitride ($SiN_x$), silicon oxide ($SiO_x$), silicon nitride oxide ($SiN_xO_y$, where x>y), silicon oxynitride ($SiO_xN_y$, where x>y), or the like.

The pixel electrode 260 may be disposed on the intermediate layer 250. The pixel electrode 260 may be disposed in each of the pixels PXa and PXb, so that an independent driving signal can be applied to the pixel electrode 260. The pixel electrode 260 may control the arrangement of the liquid crystals 301 in a corresponding pixel by forming an electric field in the liquid crystal layer 300 together with the common electrode 160. Like the common electrode 160, the pixel electrode 260 may be a transparent electrode made of a transparent conductive material. The pixel electrode 260 may be electrically connected to a drain electrode (not shown) of the switching element 210 by a contact hole formed in the intermediate layer 250. Although not illustrated in the drawing, the pixel electrode 260 may have fine slits.

The second liquid crystal alignment layer 270 may be disposed on the pixel electrode 260. The second liquid crystal alignment layer 270 can induce initial alignment of the liquid crystals 301 in the adjacent liquid crystal layer 300. Like the first liquid crystal alignment layer 170, the second liquid crystal alignment layer 270 may be made, for example, of a polyimide-based material. In addition, part of the second liquid crystal alignment layer 270 may be located in the non-display area NA. In this case, the second liquid crystal alignment layer 270 may contact the sealing member 400. However, embodiments are not limited to this case.

Next, the liquid crystal layer 300 will be described. The liquid crystal layer 300 includes a plurality of liquid crystals 301 that can be initially aligned. In an embodiment, the liquid crystals 301 may have negative dielectric anisotropy, and their long axes may be aligned vertically in the initial alignment state. In this case, each of the first liquid crystal alignment layer 170 and the second liquid crystal alignment layer 270 may be a vertical alignment-inducing layer having a vertical alignment group in a repeating unit together with an imide group. When an electric field is formed between the pixel electrode 260 and the common electrode 160, the liquid crystals 301 may be tilted or rotated in a specific direction to change the polarization state of light transmitted through the liquid crystal layer 300. In an embodiment, the liquid crystals 301 may have positive dielectric anisotropy, and their long axes may be aligned horizontally in the initial alignment state.

The sealing member 400 may be disposed in the non-display area NA to bond the first display panel 100 and the second display panel 200 together. The sealing member 400 may be shaped like a substantially quadrilateral band in plan view to seal the liquid crystal layer 300 disposed in a space inside the sealing member 400. The sealing member 400 may be, for example, a sealant. The sealing member 400 may be coupled to the first display panel 100 and the second display panel 200 in order to prevent the leakage of the liquid crystals 301 and the introduction of moisture or impurities from the outside. In FIG. 5, the sealing member 400 is in contact with the first liquid crystal alignment layer 170 and the common electrode 160 of the first display panel 100 and the intermediate layer 250 and the second liquid crystal alignment layer 270 of the second display panel 200. However, embodiments are not limited to this case, and the liquid crystal layer 300 can also be sealed in a way different from the embodiment illustrated in the drawing.

The light source 500 may be disposed under the display panel. Specifically, the light source 500 may be disposed on the other surface (the lower surface in the drawing) of the second base substrate 201 to provide light toward the display panel. In an embodiment in which a wavelength shift pattern layer is used as the color control pattern layer 140, the light source 500 may provide blue light having a peak wavelength in a range of about 430 to about 470 nm or may provide light in a ultraviolet wavelength band (e.g., about 10 to about 400 nm). In an embodiment in which a color filter is used as the color control pattern layer 140, the light source 500 may provide white light (e.g., about 380 to about 750 nm). Although not illustrated in the drawing, one or more optical sheets may be disposed between the second display panel 200 and the light source 500. The optical sheets may include one or more of a prism sheet, a diffusion sheet, a lenticular lens sheet, and a micro-lens sheet. The optical sheets may improve the display quality of the display device 1000 by modulating the optical characteristics of light emitted from the light source 500 and travelling toward the second display panel 200.

The polarizer 12 may be disposed on the first display panel 100. In an embodiment, the polarizer 12 may be disposed on the other surface (the upper surface in the drawing) of the first base substrate 101. In an embodiment, the polarizer 12 may be disposed on the other surface (the lower surface) of the second base substrate 201. The polarizer 12 may overlap the display area DA and the non-display area NA of the display panel.

The polarizer 12 may include a dye alignment layer 110 and a polarizing layer 120. In an embodiment, the dye alignment layer 110 may be disposed directly on the first base substrate 101. The dye alignment layer 110 may induce the alignment of a polymer of a dye compound in the polarization layer 120.

A surface (an upper surface in the drawing) of the dye alignment layer 110 which faces the polarizing layer 120 may have a surface shape having alignment anisotropy. For example, the alignment anisotropy may be physical anisotropy. The surface of the dye alignment layer 110 may include a plurality of linear protruding patterns 110a extending in the first direction X and repeated in the second direction Y. Since the dye alignment layer 110 including the protruding patterns 110a has been described above with reference to FIG. 1 and the like, a detailed description of the dye alignment layer 110 will be omitted. The dye alignment layer 110 may be formed by directly applying or depositing a dye alignment layer forming material on the first base substrate 101 and patterning the dye alignment layer forming material. However, the method of forming the dye alignment layer 110 is not limited to this embodiment.

The polarizing layer 120 may be disposed directly on the dye alignment layer 110. The polarizing layer 120 may have a polarizing ability by including a polymer derived from one or more dichroic dye compounds. The polarizing layer 120 may be formed by directly applying and aligning a composition according to any of the above-described embodiments onto the dye alignment layer 110 and then polymerizing the composition. In this case, the polarizing layer 120 may be the same as the polarizing layer 120 according to the embodiment of FIG. 1. For example, the polarizing layer 120 may include a polymer derived from dye compounds represented by formula (A) below:

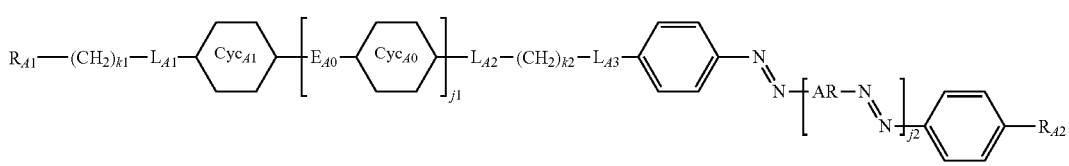

(A)

The more specific structure and substituents of the dye compounds having the structure represented by formula (A) and exemplary embodiments of compounds have been described above and thus will not be described again.

In some embodiments, the polarizing layer 120 may further include a polymer derived from one or more of reactive-liquid crystalline compounds. The reactive-liquid crystalline compounds may be liquid crystalline compounds having a structure represented by formula (B):

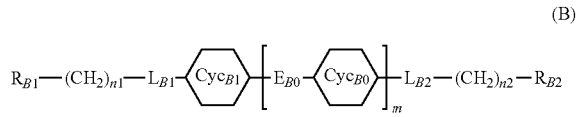

(B)

The more specific structure and substituents of the liquid crystalline compounds having the structure represented by formula (B) and exemplary embodiments of compounds have been described above and thus will not be described again.

For example, a main chain formed by the polymer of the dye compounds and/or the polymer of the liquid crystalline compounds in the polarizing layer 120 may be represented by formula (C):

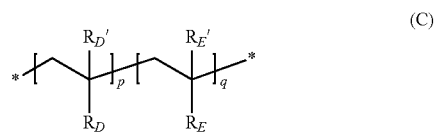

(C)

The more specific structure and substituents of exemplary embodiments of the main chain having the structure represented by formula (C) have been described above and thus will not be described again.

A side chain structure derived from the dye compounds and a side chain structure derived from the liquid crystalline compounds may be aligned, for example all aligned, in substantially one direction. For example, referring to FIG. 5, the dye compounds may be polymerized in a state where their long axes are aligned in the first direction X to be substantially parallel to the surface of the first base substrate 101, and the liquid crystalline compounds may also be polymerized in a state where their long axes are aligned in the first direction X to be substantially parallel to the surface of the first base substrate 101. The alignment direction of side chains derived from the dye compounds may define the transmission axis and the absorption axis of the polarizer 12.

Since exemplary embodiments of the dye alignment layer 110 and the polarizing layer 120 have been described above in detail with reference to FIG. 1 and the like, a redundant description of the dye alignment layer 110 and the polarizing layer 120 will be omitted.

The polarizer 12 including the dye alignment layer 110 and the polarizing layer 120 may perform an optical shutter function for controlling the amount of light provided from the light source 500, together with the liquid crystal layer 300 and another polarizer (not illustrated) disposed between the liquid crystal layer 300 and the light source 500. Accordingly, the display device 1000 can display an image.

The display device 1000 according to an embodiment may include the polarizer 12 integrated with the first display panel 100 or the second display panel 200. That is, in an embodiment, the polarizer 12 can be coupled to the first base substrate 101 of the display panel without an adhesive layer or the like. Thus, the configuration of the polarizer 12 can be simplified. In addition, since the durability of the polarizer 12 is improved, the durability and reliability of the display device 1000 can be improved.

Display devices according to other embodiments will now be described.

Figure 6:
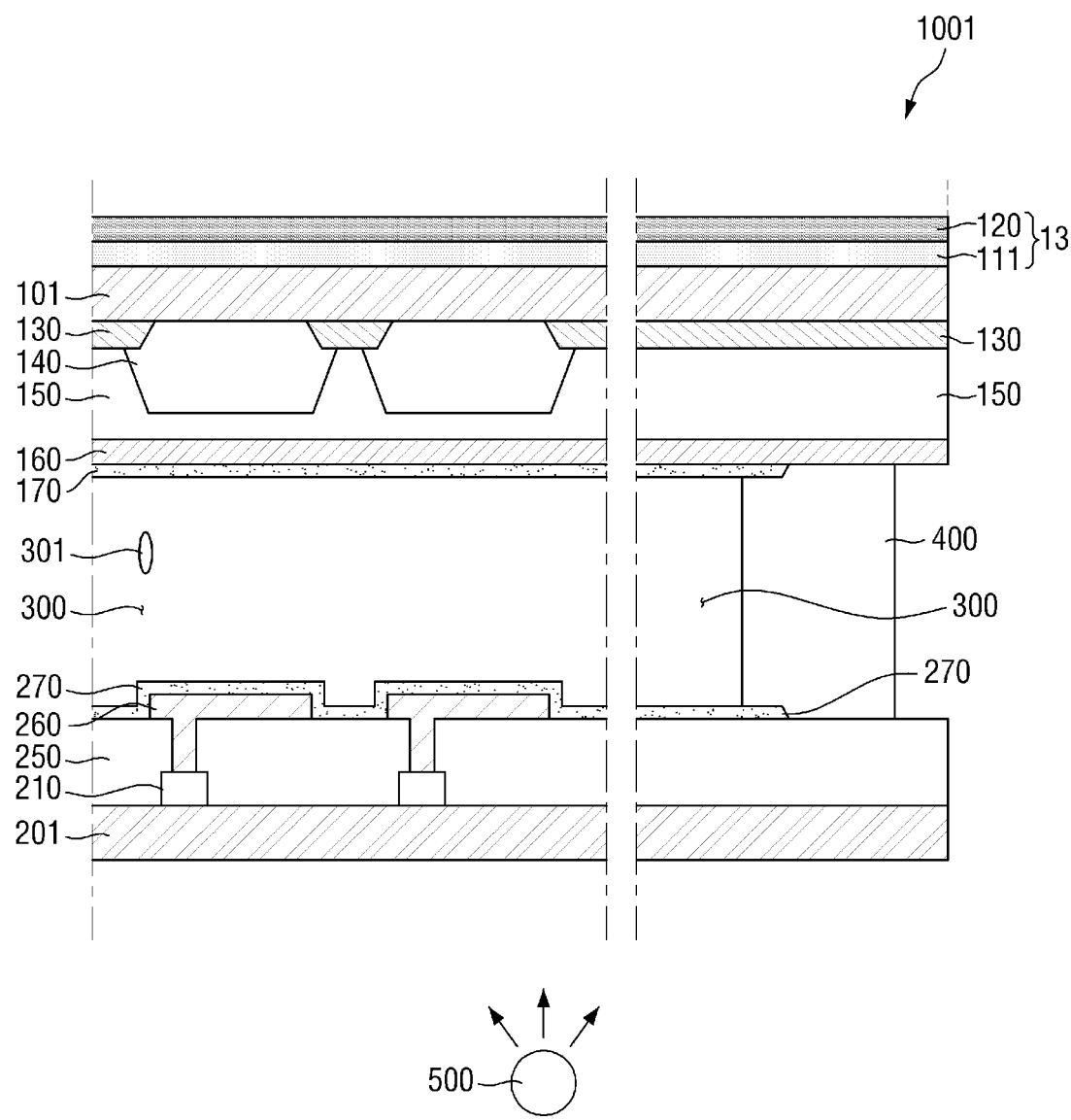
FIG. 6 is a cross-sectional view of a display device according to an embodiment.

FIG. 6 is a cross-sectional view of a display device 1001 according to an embodiment.

Referring to FIG. 6, the display device 1001 according to the current embodiment is different from the display device 1000 according to the embodiment of FIG. 5 in that the dye alignment layer 111 according to the embodiment of FIG. 4 is applied to a polarizer 13.

The polarizer 13 may include the dye alignment layer 111 and a polarizing layer 120. In an embodiment, the dye alignment layer 111 may be disposed directly on a first base substrate 101. The dye alignment layer 111 may induce the alignment of a polymer of dye compounds and a polymer of liquid crystalline compounds in the polarizing layer 120.

The dye alignment layer 111 may include a polyimide-based material having a photoreactive group in a repeating unit. Since embodiments of the dye alignment layer 111 including the polyimide-based material have been described above with reference to FIG. 4 and the like, a detailed description of the dye alignment layer 111 will be omitted. The dye alignment layer 111 may be formed by directly applying a composition including a polyimide-based material onto the first base substrate 101 and then aligning and curing the composition. The aligning of the composition may include, but is not limited to, rubbing alignment or photo alignment.

Side chains of the polymer of the dye compounds and/or the polymer of the reactive-liquid crystalline compounds in the polarizing layer 120 may be aligned, for example all aligned, in substantially one direction by the alignment anisotropy of the dye alignment layer 111. For example, the dye compounds may be polymerized in a state where their long axes are aligned in a direction substantially parallel to the surface of the first base substrate 101, and the liquid crystalline compounds may also be polymerized in a state where their long axes are aligned in the same direction as those of the dye compounds. The alignment direction of the side chains derived from the dye compounds may define the transmission axis and the absorption axis of the polarizer 13.

Figure 7:
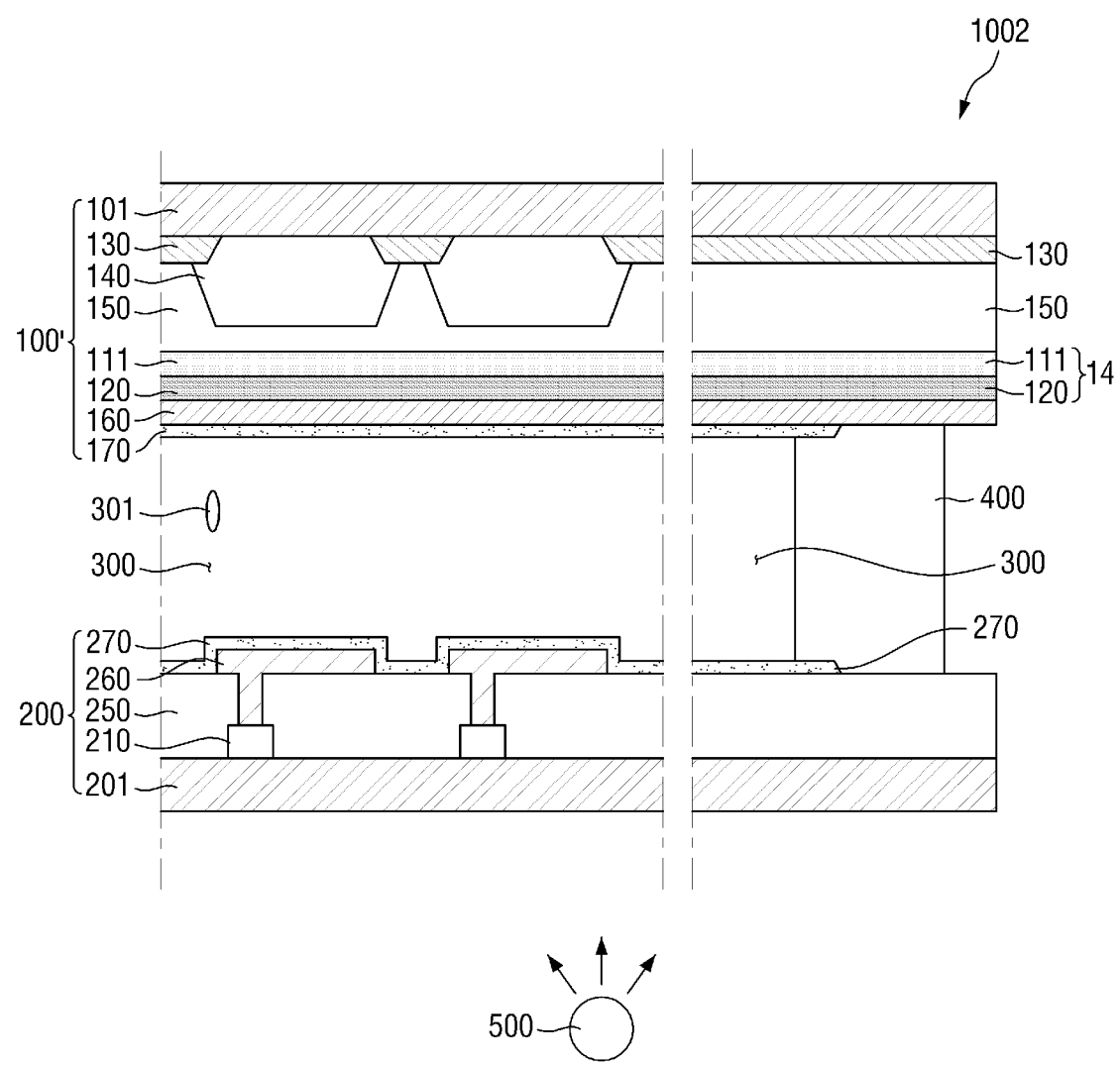
FIG. 7 is a cross-sectional view of a display device according to an embodiment.

FIG. 7 is a cross-sectional view of a display device 1002 according to an embodiment.

Referring to FIG. 7, the display device 1002 according to the current embodiment is different from the display device 1001 according to the embodiment of FIG. 6 in that a polarizer 14 is disposed between a first base substrate 101 and a liquid crystal layer 300.

The first display panel 100' includes the first base substrate 101, a color control pattern layer 140 disposed on a surface (a lower surface in the drawing) of the first base substrate 101 which faces a second display panel 200, an overcoat layer 150 disposed on the color control pattern layer 140, a common electrode 160 disposed on the overcoat layer 150 and a first liquid crystal alignment layer 170 disposed on the common electrode 160 and may further include the polarizer 14 disposed between the overcoat layer 150 and the common electrode 160.

In an embodiment, a dye alignment layer 111 may be disposed directly on the overcoat layer 150. The dye alignment layer 111 may be formed by directly applying a composition including a polyimide-based material onto the overcoat layer 150 and then aligning and curing the composition. However, the method of forming the dye alignment layer 111 is not limited to this embodiment. In an embodiment, the dye alignment layer 111 may be the dye alignment layer 110 according to the embodiment of FIG. 1.

The polarizing layer 120 may be disposed directly on the dye alignment layer 111. The polarizing layer 120 may be directly applied onto the dye alignment layer 111 and then aligned and polymerized. In addition, the common electrode 160 may be disposed directly on the polarizing layer 120. Since exemplary embodiments of the polarizing layer 120 has been described above with reference to FIGS. 1 through 6, a detailed description of the polarizing layer 120 will be omitted.

The display device 1002 according to an embodiment may include the polarizer 14 integrated with a first display panel 100' and a second display panel 200. Specifically, the polarizer 14 may be disposed between the first base substrate 101 and a second base substrate 201 to suppress denaturation of the polarizer 14 due to moisture or heat. This can minimize the degradation of the polarization characteristics of the polarizer 14 and improve the durability and reliability of the display device 1002.

Figure 8:
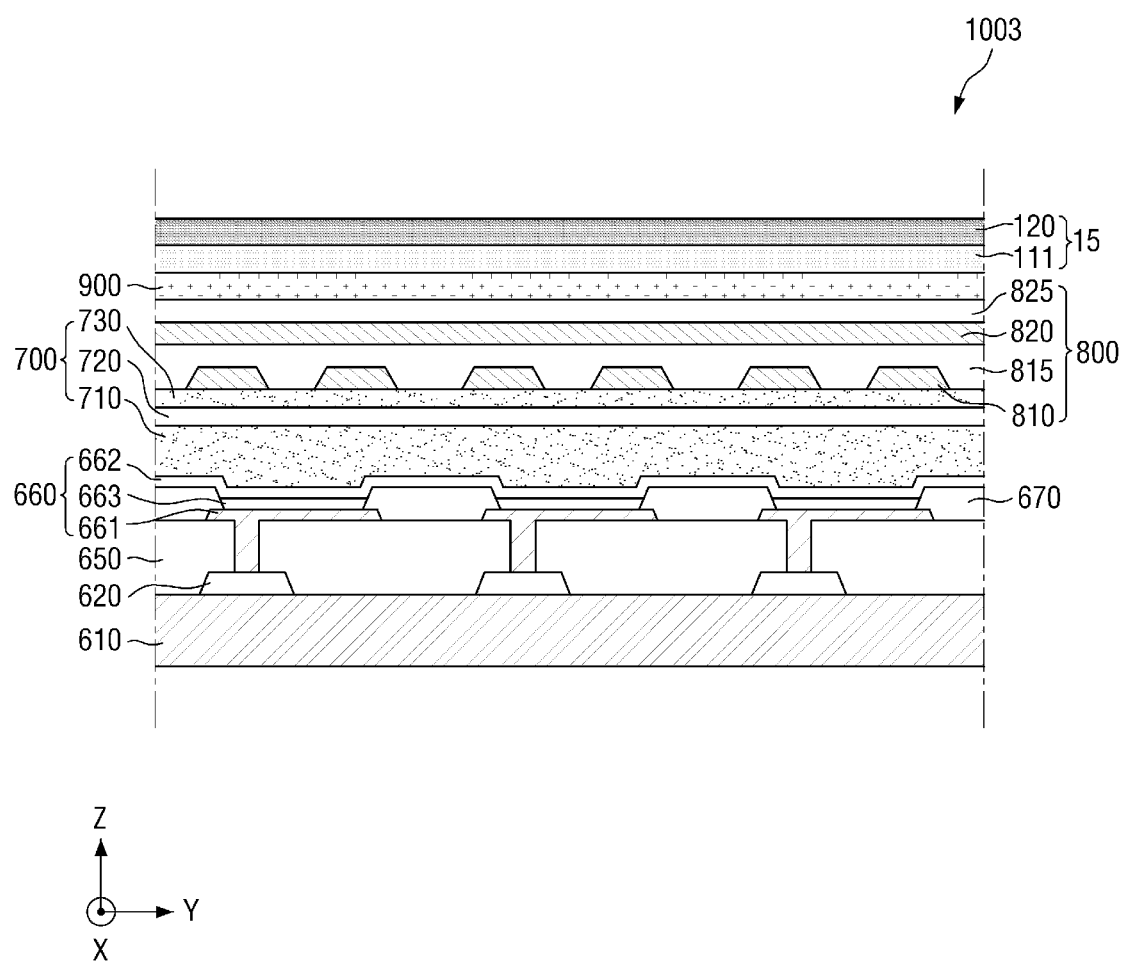
FIG. 8 is a cross-sectional view of a display device according to an embodiment.

FIG. 8 is a cross-sectional view of a display device 1003 according to another embodiment.

Referring to FIG. 8, the display device 1003 according to an embodiment includes a base substrate 610, an organic light emitting element 660 disposed on a surface of the base substrate 610, and an encapsulation member 700 disposed on the organic light emitting element 660 to encapsulate the organic light emitting element 660, and may further include a touch unit 800 disposed on the encapsulation member 700 and a polarizer 15 disposed on the touch unit 800.

The base substrate 610 may be a transparent or opaque insulating substrate. For example, the base substrate 610 may be made of a flexible plastic material such as a glass material, a quartz material, or polyimide.

The driving element 620 may be disposed on the base substrate 610. The driving element 620 may be disposed in each pixel to control the flow of voltage or current for driving the organic light emitting element 660 in a specific pixel. In an embodiment, each driving element 620 may be a top gate transistor including an active layer having a source region, a drain region and a channel region, a gate electrode disposed on the channel region of the active layer, and a source electrode and a drain electrode electrically connected to the source region and the drain region of the active layer, respectively (not illustrated). The active layer may include polycrystalline silicon or monocrystalline silicon. The gate electrode may be electrically connected to an output terminal of a switching element (not illustrated) for controlling ON/OFF of a specific pixel.

The intermediate layer 650 may be disposed on the driving element 620. The intermediate layer 650 may electrically insulate components disposed on the intermediate layer 650 from components disposed under the intermediate layer 650 (i.e., components on opposite sides of the intermediate layer 650) and planarize step differences between a plurality of components stacked on the base substrate 610 by compensating for the step differences. The intermediate layer 650 may be made of an organic material. For example, the intermediate layer 650 may include an organic material such as acrylic resin, epoxy resin, polyimide resin, or polyester resin.

The organic light emitting element 660 may be disposed on the intermediate layer 650. The organic light emitting element 660 disposed in each pixel may emit light of a color different or identical to the color of light emitted from the organic light emitting element 660 disposed in other pixels. The organic light emitting element 660 includes a first electrode 661 disposed on the intermediate layer 650, an organic light emitting layer 663 disposed on the first electrode 661, and a second electrode 662 disposed on the organic light emitting layer 663.

The first electrode 661 may be an anode having a relatively larger work function than the second electrode 662. The first electrode 661 may be a transparent electrode, an opaque electrode, or a stacked structure of the transparent electrode and the opaque electrode. Examples of the material that forms the transparent electrode include indium tin oxide (ITO), indium zinc oxide (IZO), zinc oxide, and indium oxide. Examples of the material that forms the opaque electrode include lithium (Li), aluminum (Al), magnesium (Mg), silver (Ag), nickel (Ni), and chromium (Cr). The first electrode 661 may be disposed in each pixel, and an independent driving signal may be transmitted to the first electrode 661. The first electrode 661 may be electrically connected to the drain electrode of the driving element 620 by a contact hole formed in the intermediate layer 650.

The second electrode 662 may be a cathode having a relatively smaller work function than the first electrode 661. The second electrode 662 can drive the organic light emitting element 660 together with the first electrode 661 which faces the second electrode 662 with the organic light emitting layer 663 interposed between them. Like the first electrode 611, the second electrode 662 may be a transparent electrode, an opaque electrode, or a stacked structure of the transparent electrode and the opaque electrode. The second electrode 662 may be disposed substantially on the entire surface of the base substrate 610 without distinction between pixels.

The organic light emitting layer 663 may be interposed between the first electrode 661 and the second electrode 662. The organic light emitting layer 663 may generate light by recombining holes and electrons transferred from the first electrode 661 and the second electrode 662. For example, the holes and the electrons may be recombined to form excitons, and the excitons may emit light as they change from an excited state to a ground state.

Although not illustrated in the drawing, in some embodiments, the organic light emitting element 660 may further include functional layers such as a hole injection layer and a hole transport layer interposed between the first electrode 661 and the organic light emitting layer 663 and/or an electron injection layer and an electron transport layer interposed between the second electrode 662 and the organic light emitting layer 663.

A pixel defining layer 670 may be disposed on the first electrode 661 and the intermediate layer 650. The pixel defining layer 670 may define each pixel. The pixel defining layer 670 may partially overlap the first electrode 661 and expose at least a portion of the first electrode 661. That is, in plan view, the pixel defining layer 670 may substantially be in the form of a lattice with openings, each exposing the first electrode 661. The organic light emitting layer 663 may be disposed in each of the openings. The pixel defining layer 670 may include an organic material such as polyacrylic resin or polyimide resin.

The encapsulation member 700 may be disposed on the organic light emitting element 660. In an embodiment, the encapsulation member 700 may be a thin-film encapsulation film. The encapsulation member 700 may encapsulate the organic light emitting element 660 by covering the organic light emitting element 660. The encapsulation member 700 can prevent moisture and the like from penetrating from the outside and denaturing the organic light emitting layer 663.

In an embodiment, the encapsulation member 700 may include one or more inorganic layers and one or more organic layers arranged alternately. For example, the encapsulation member 700 may have a three-layer structure including a first inorganic encapsulation layer 710 disposed on the second electrode 662, an organic encapsulation layer 720 disposed on the first inorganic encapsulation layer 710, and a second inorganic encapsulation layer 730 disposed on the organic encapsulation layer 720.

Each of the first inorganic encapsulation layer 710 and the second inorganic encapsulation layer 730 may be made of an inorganic material such as silicon nitride ($SiN_x$), silicon oxide ($SiO_x$), silicon nitride oxide ($SiN_xO_y$, where x>y), or silicon oxynitride ($SiO_xN_y$, where x>y). The first inorganic encapsulation layer 710 and the second inorganic encapsulation layer 730 may be formed by, but not limited to, a chemical vapor deposition method.

The organic encapsulation layer 720 may include an organic material. The organic encapsulation layer 720 may be formed, for example, by directly applying a coating composition containing an organic material onto the first inorganic encapsulation layer 710 and curing the coating composition.

In FIG. 8, the encapsulation member 700 has a three-layer structure. However, the encapsulation member 700 can also be a single layer, a two-layer structure, or a four or more layer structure. Further, although an uppermost layer of the encapsulation member 700 is made of an inorganic material in FIG. 8, the uppermost layer can alternatively be an organic layer made of an organic material.

The touch unit 800 may be disposed on the encapsulation member 700. The touch unit 800 may be a portion that senses a touch made by a part of a user's body or a stylus pen. The touch unit 800 may include a first touch electrode 810 extending in the first direction X and a second touch electrode 820 disposed on the first touch electrode 810 and extending in the second direction Y intersecting the first direction X.

In an embodiment, the first touch electrode 810 may be disposed directly on the encapsulation member 700. In FIG. 8, the uppermost layer of the encapsulation member 700 which contacts the first touch electrode 810 is an inorganic layer made of an inorganic material. However, in an embodiment, the uppermost layer of the encapsulation member 700 which contacts the first touch electrode 810 may also be an organic layer made of an organic material. The first touch electrode 810 may extend in the first direction X and may be provided in a plurality, wherein the first touch electrodes 810 are separated from each other in the second direction Y. The first touch electrode 810 may transmit a sensed touch signal in the first direction X. In FIG. 8, two first touch electrodes 810 are disposed in one pixel. However, embodiments are not limited to this case. A first insulating layer 815 may be disposed directly on the first touch electrode 810 to insulate the first touch electrode 810 and the second touch electrode 820 from each other.

The second touch electrode 820 may be disposed directly on the first insulating layer 815. The second touch electrode 820 may be insulated from the first touch electrode 810. The second touch electrode 820 may extend in the second direction Y and may be provided in a plurality, wherein the second touch electrodes 820 are separated from each other in the first direction X. The second touch electrode 820 may transmit a sensed touch signal in the second direction Y. A second insulating layer 825 may be disposed directly on the second touch electrode 820 to cover the second touch electrode 820. The second insulating layer 825 may be an organic layer made of an organic material, an inorganic layer made of an inorganic material, or an alternately stacked structure of one or more organic layers and one or more inorganic layers.

A phase delay layer 900 may be disposed on the second insulating layer 825. The phase delay layer 900 may convert linearly polarized light into circularly polarized light or elliptically polarized light or may convert circularly polarized light or elliptically polarized light into linearly polarized light by delaying the phase of any one of orthogonal components of incident light. In an embodiment, the phase delay layer 900 may delay the phase of incident light by about $\lambda/4$.

The phase delay layer 900 may include a birefringent polyether sulfone-, cellulose ester- or cycloolefin-based material or a birefringent liquid crystal material. In an embodiment, the phase delay layer 900 may be disposed directly on the second insulating layer 825. The phase delay layer 900 may be formed, for example, by directly applying a coating composition containing the birefringent material onto the second insulating layer 825 and curing the coating composition. However, the method of forming the phase delay layer 900 is not limited to this embodiment. In an embodiment, the phase delay layer 900 may be in the form of a stretched film and may be in contact with the second insulating layer 825 or separated from the second insulating layer 825 by an adhesive layer (not illustrated) interposed between them.

The polarizer 15 may be disposed on the phase delay layer 900. The polarizer 15 may include a dye alignment layer 111 and a polarizing layer 120. In an embodiment, the dye alignment layer 111 may be disposed directly on the phase delay layer 900. The dye alignment layer 111 may be formed by directly applying a composition containing a polyimide-based material onto the phase delay layer 900 and then aligning and curing the composition. However, the method of forming the dye alignment layer 111 is not limited to this embodiment. In an embodiment, the dye alignment layer 111 may be the dye alignment layer 110 according to the embodiment of FIG. 1.

The polarizing layer 120 may be disposed directly on the dye alignment layer 111. The polarizing layer 120 may be directly applied onto the dye alignment layer 111 and then aligned and polymerized. Since exemplary embodiments of the polarizing layer 120 have been described above with reference to FIGS. 1 through 7, a detailed description of the polarizing layer 120 will be omitted.

The polarizer 15 may convert unpolarized incident light into circularly or elliptically polarized light, together with the phase delay layer 900. Therefore, the polarizer 15 can be used to suppress the reflection of external light by a metal layer or the like in the display device 1003 and improve the display quality of the display device 1003.

The display device 1003 according to an embodiment may include the polarizer 15 integrated with a display panel. For example, the polarizer 15 can be coupled to the phase delay layer 900 without an adhesive layer or the like. Thus, the configuration of the display device 1003 can be simplified. Further, it is possible to provide the display device 1003 capable of suppressing the reflection of external light without a complicated process such as a stretching/pressure process.

Hereinafter, methods of manufacturing a display device according to embodiments will be described.

FIGS. 9 through 12 are cross-sectional views illustrating the steps of a method of manufacturing a display device according to an embodiment.

Figure 9:
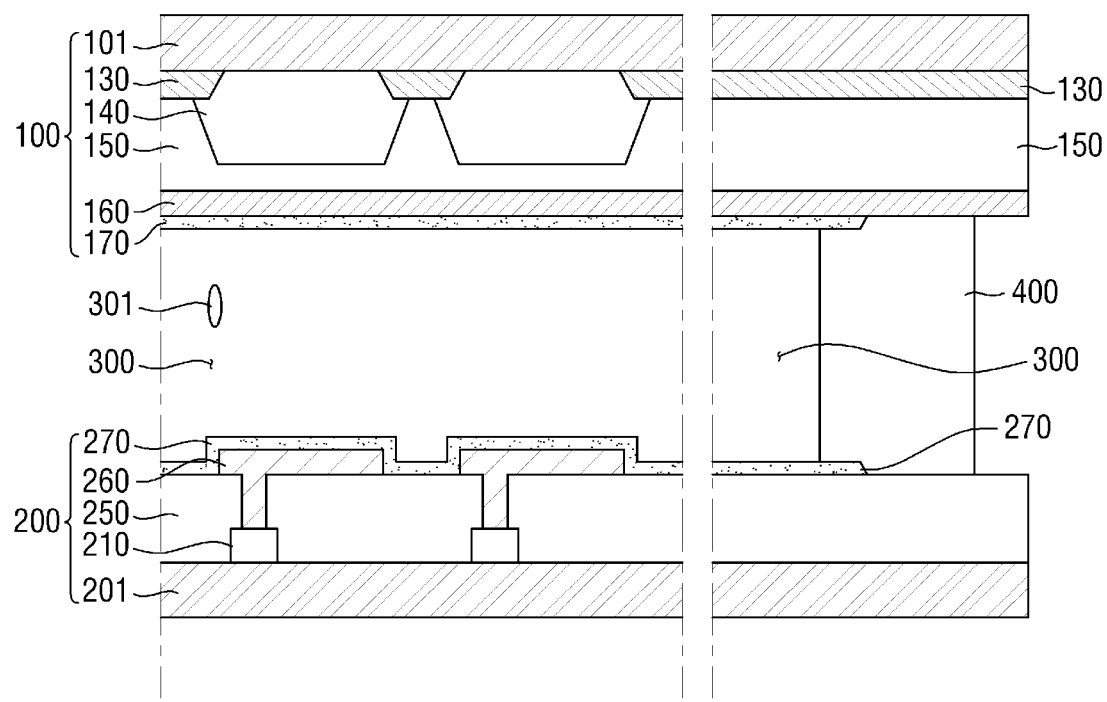
FIGS. 9 through 12 are cross-sectional views illustrating a method of manufacturing a display device according to an embodiment.

Referring to FIG. 9, a display panel including a first display panel 100, a second display panel 200 facing the first display panel 100, and a liquid crystal layer 300 interposed between the first display panel 100 and the second display panel 200, and a sealing member 400 for sealing the liquid crystal layer 300 by bonding the first display panel 100 and the second display panel 200 together is prepared. The first display panel 100 may be an upper panel including a color control pattern layer 140, and the second display panel 200 may be a lower panel including a switching element 210. Since exemplary embodiments of the first display panel 100, the second display panel 200, the liquid crystal layer 300, and the sealing member 400 have been described above with reference to FIG. 5 and the like, a detailed description of them will be omitted.

Figure 10:
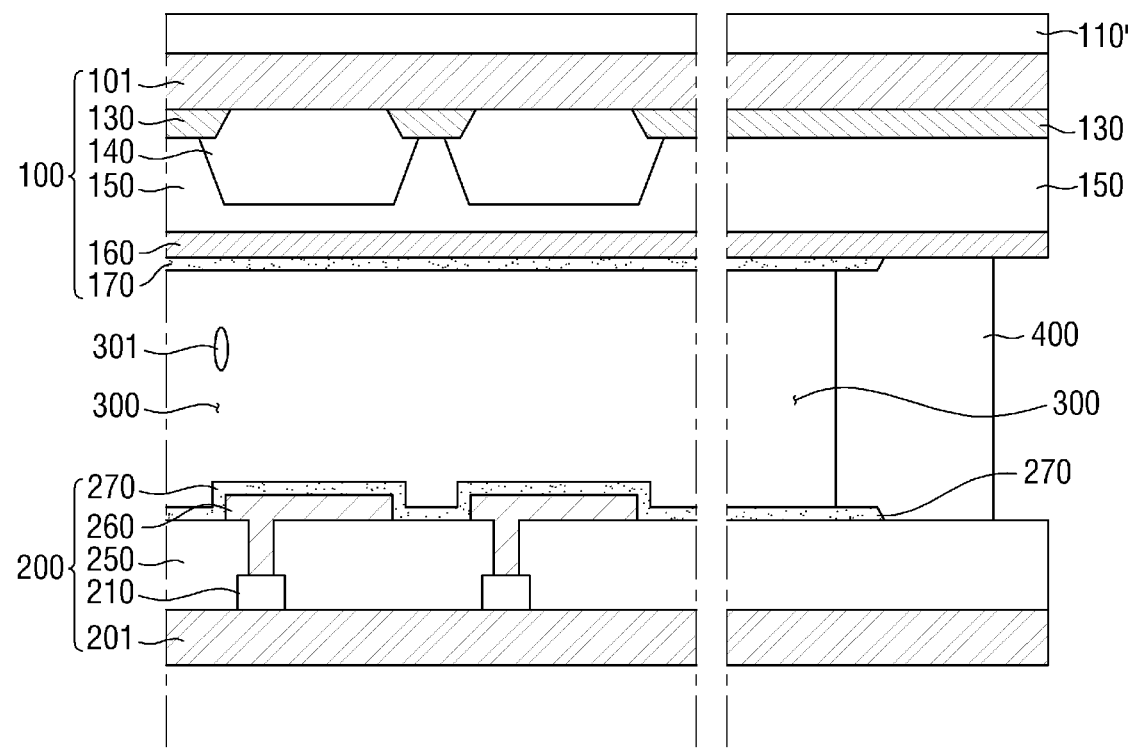

Referring to FIG. 10, a first material layer 110' is formed on a first base substrate 101 of the first display panel 100. In an embodiment, the forming of the first material layer 110' may be an operation of depositing a metal material such as aluminum or copper or an operation of applying and curing a composition such as polyvinyl alcohol, polyimide, polyamide, cycloolefin, epoxy, or phenol.

Figure 11:
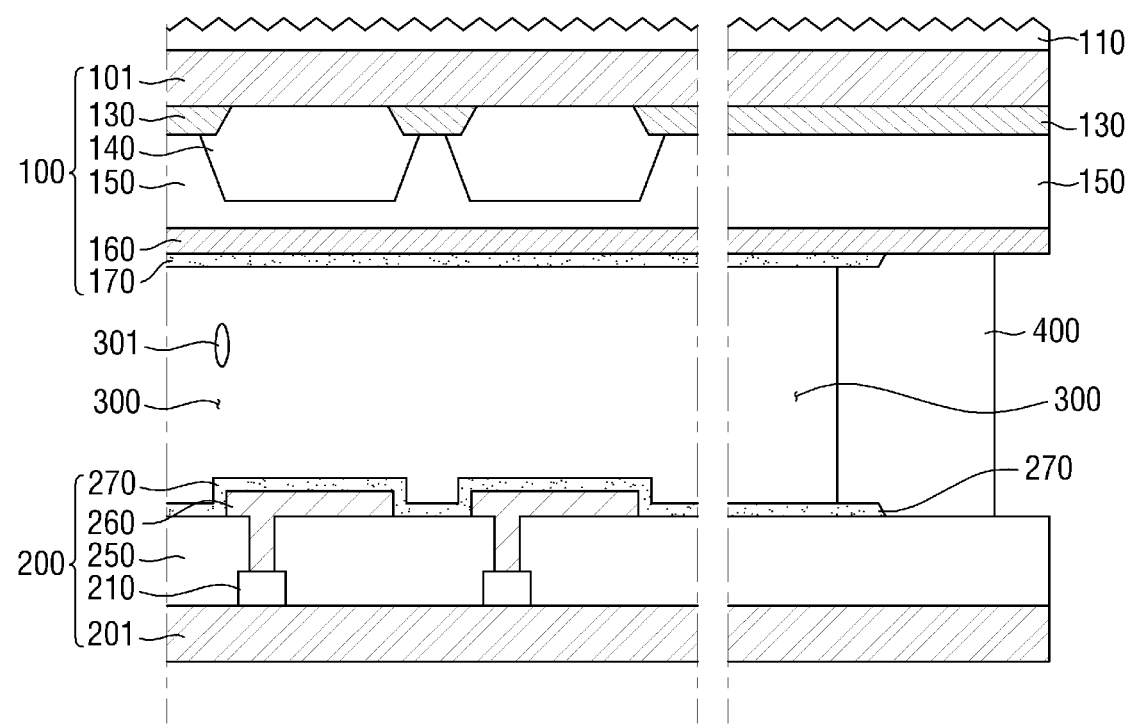

Referring to FIG. 11, the first material layer 110' is patterned to form a dye alignment layer 110 having a surface shape having alignment anisotropy. The forming of the dye alignment layer 110 may include forming a plurality of linear protruding patterns 110a extending in a direction and repeated in another direction intersecting the direction. Since exemplary embodiments of the protruding patterns 110a have been described above with reference to FIG. 1 and the like, a detailed description of the protruding patterns 110a will be omitted. The forming of the protruding patterns 110a may be performed, for example, using an etching process or a patterning method such as nanoimprinting.

Figure 12:
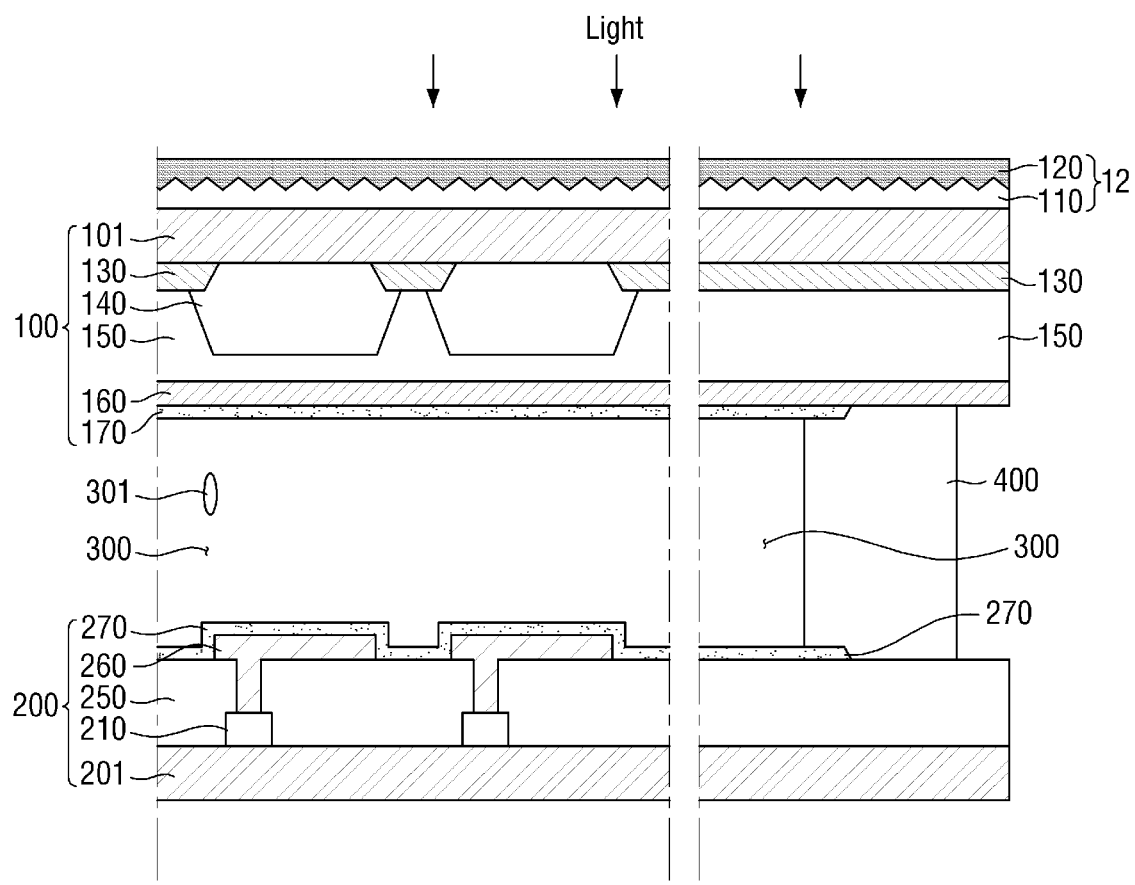

Referring to FIG. 12, a polarizing layer 120 is formed on the dye alignment layer 110. In an embodiment, the forming of the polarizing layer 120 may include directly applying a composition for forming a polarizing layer onto the dye alignment layer 110 and polymerizing the applied composition by irradiating light to the applied composition.

The composition for forming a polarizing layer may be a composition according to any of the above-described embodiments. For example, the composition for forming a polarizing layer may include one or more of dye compounds represented by formula (A):

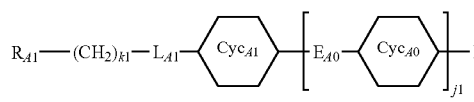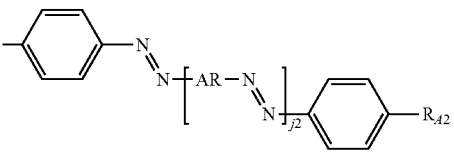

(A)

In an exemplary embodiment, the composition for forming a polarizing layer may include a dye compound represented by formula (A). In some embodiments, the composition may include the dye compound represented by the above-described formula (A-1) as a dye compound. In some embodiments, the composition may include the dye compound represented by the above-described formula (A-2) as a dye compound. In some embodiments, the composition may include the dye compound represented by the above-described formula (A-3) as a dye compound.

In another exemplary embodiment, the composition for forming a polarizing layer may include, as a dye compound, the dye compound represented by formula (A-1) and the dye compound represented by formula (A-2). In an embodiment, the composition may include, as a dye compound, the dye compound represented by formula (A-1) and the dye compound represented by formula (A-3). In an embodiment, the composition may include, as a dye compound, the dye compound represented by formula (A-2) and the dye compound represented by formula (A-3). In some embodiments, the composition may include, as a dye compound, all of the dye compound represented by formula (A-1), the dye compound represented by formula (A-2) and the dye compound represented by formula (A-3).

In some embodiments, the composition for forming a polarizing layer may further include one or more of the liquid-liquid crystalline compounds described above. The reactive-liquid crystalline compounds may be liquid crystalline compounds having the structure represented by formula (B) described above.

Since exemplary embodiments of the composition for forming a polarizing layer has been described in detail above, a redundant description of the composition will be omitted.

The polymerizing of the applied composition by irradiating the light may be an operation of forming the coated polarizing layer 120 by irradiating the applied coating composition with light in an ultraviolet wavelength band. The ultraviolet light may be, but is not limited to, light having a peak wavelength at about 365 nm or about 254 nm. In the polymerizing of the applied composition by irradiating the light, at least a portion of a photopolymerizable group (e.g., $R_{A1}$ in formula (A)) of the dye compounds and/or a photopolymerizable group ($R_{B1}$ and/or $R_{B2}$ in formula (B)) of the reactive-liquid crystalline compounds in the applied coating composition may be polymerized to form a polymer of the dye compounds and a polymer of the reactive-liquid crystalline compounds.

Methods of manufacturing a display device according to other embodiments will now be described.

Figure 13:
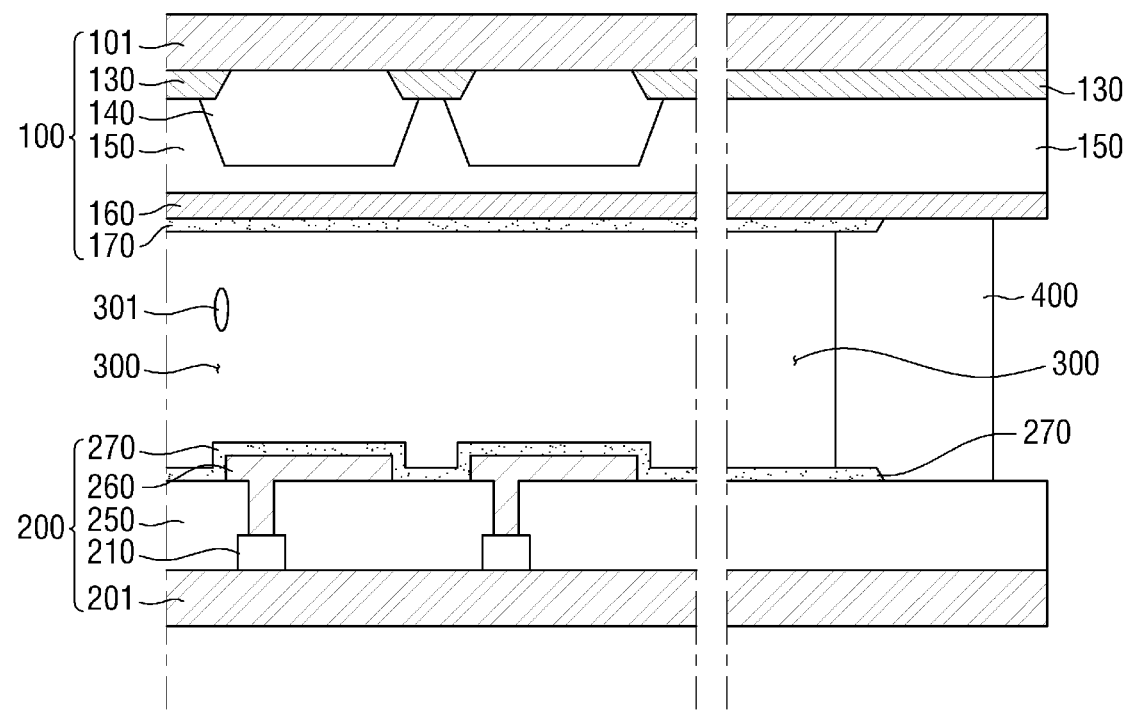
FIGS. 13 through 15 are cross-sectional views illustrating a method of manufacturing a display device according to an embodiment.
Figure 14:
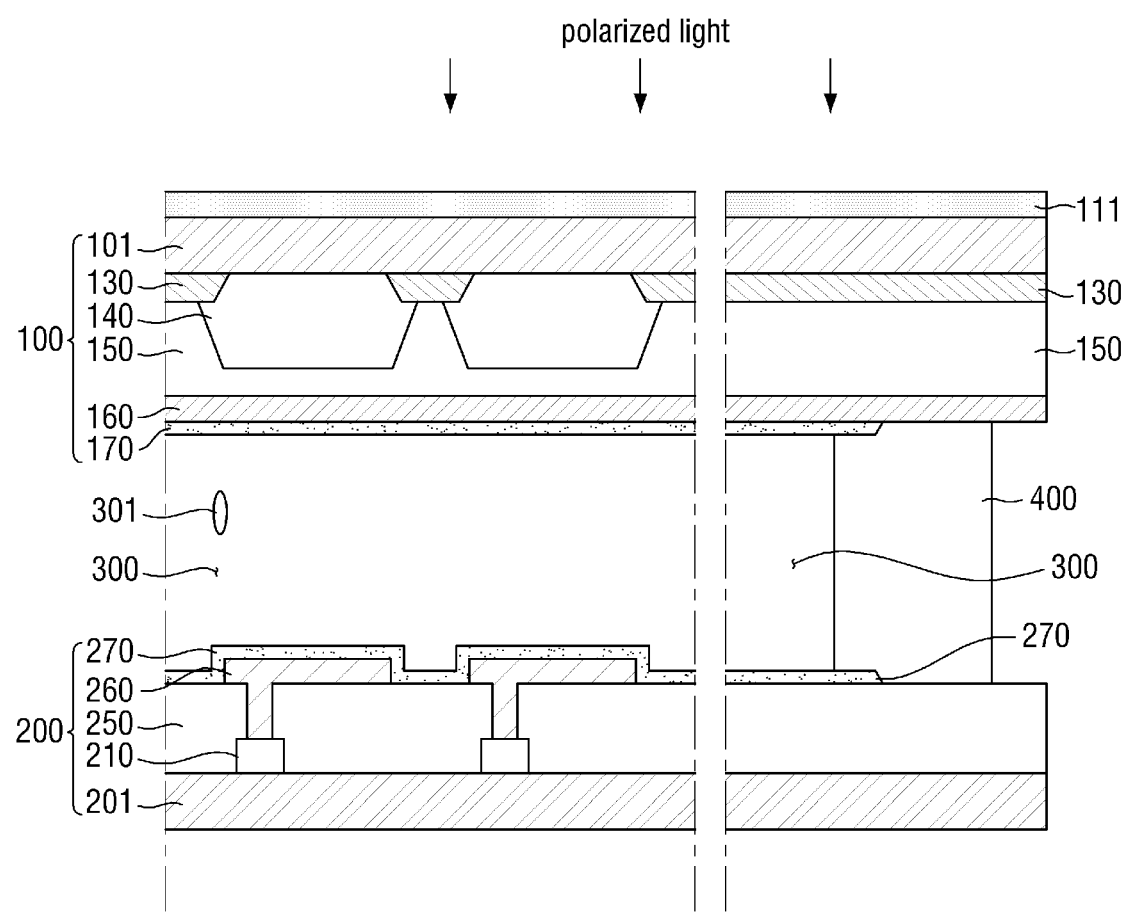
Figure 15:
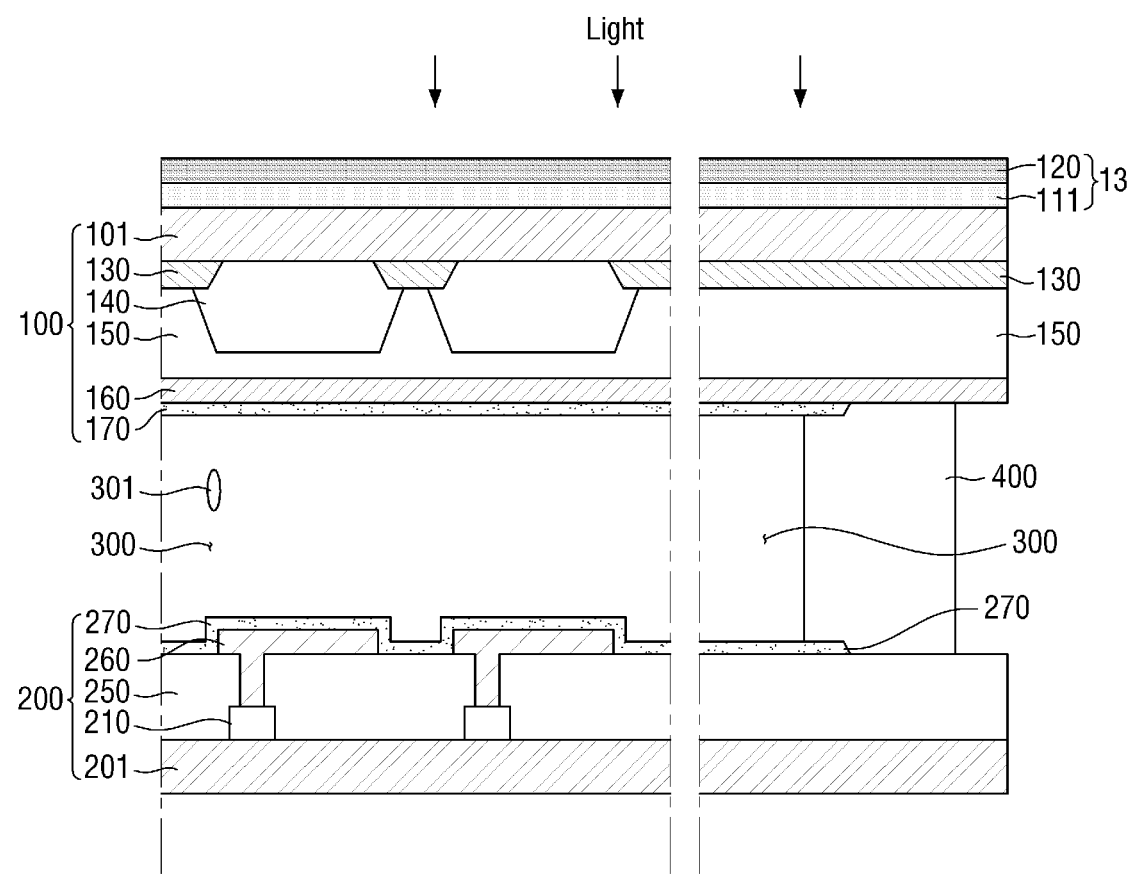

FIGS. 13 through 15 are cross-sectional views illustrating a method of manufacturing a display device according to an embodiment.

Referring to FIG. 13, a display panel including a first display panel 100, a second display panel 200 facing the first display panel 100, a liquid crystal layer 300 interposed between the first display panel 100 and the second display panel 200, and a sealing member 400 for sealing the liquid crystal layer 300 by bonding the first display panel 100 and the second display panel 200 together is prepared.

Referring to FIG. 14, a dye alignment layer 111 is formed on a first base substrate 101 of the first display panel 100. In an embodiment, the forming of the dye alignment layer 111 may include directly applying a coating composition, which contains a polyimide-based material having a photoreactive group in a repeating unit, onto a surface of the first base substrate 101, irradiating polarized light to the applied coating composition so as to give alignment anisotropy, and curing the dye alignment layer having the given alignment anisotropy.

In the irradiating of the polarized light, the polyimide-based polymer having the photoreactive group may be given anisotropy as it is isomerized or decomposed in response to the polarized light. However, embodiments are not limited to this case. The curing of the dye alignment layer may be performed at a temperature of about 180 to about 210° C. for about 20 to about 30 minutes.

In the irradiating of the polarized light, the polarization direction of the polarized light that is irradiated may be substantially perpendicular to a direction (that is, an absorption axis direction) in which a dye compound in a polarizing layer 120 to be described later is to be aligned. In other words, the polarization direction of irradiated light may be, but is not limited to, substantially parallel to the transmission axis direction of the polarizer 13.

Referring to FIG. 15, the polarizing layer 120 can be formed on the dye alignment layer 111. Since exemplary embodiments of the forming of the polarizing layer 120 has been described above with reference to FIG. 12 and the like, a redundant description of this operation will be omitted.

FIGS. 16 through 19 are cross-sectional views illustrating a method of manufacturing a display device according to an embodiment.

Figure 16:
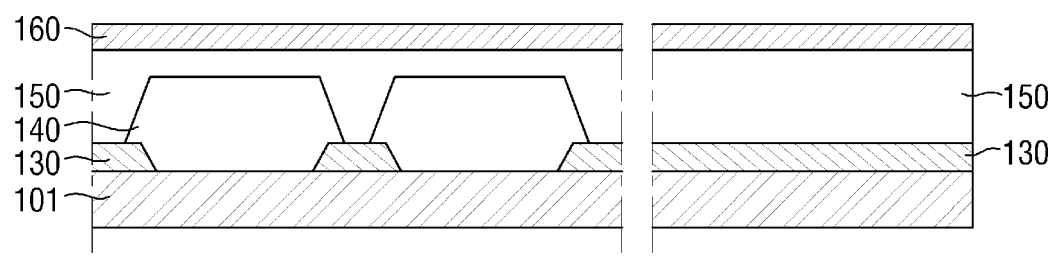
FIGS. 16 through 19 are cross-sectional views illustrating a method of manufacturing a display device according to an embodiment.

Referring to FIG. 16, a first base substrate 101, a light shielding member 130 disposed on the first base substrate 101, a color control pattern layer 140 disposed on the light shielding member 130, an overcoat layer 150 disposed on the color control pattern layer 140, and a common electrode 160 disposed on the overcoat layer 150 are prepared. The first base substrate 101 has a surface, on which the light shielding member 130 and the like are disposed, and the other surface (i.e., the surface opposite the light shielding member 130).

Figure 17:
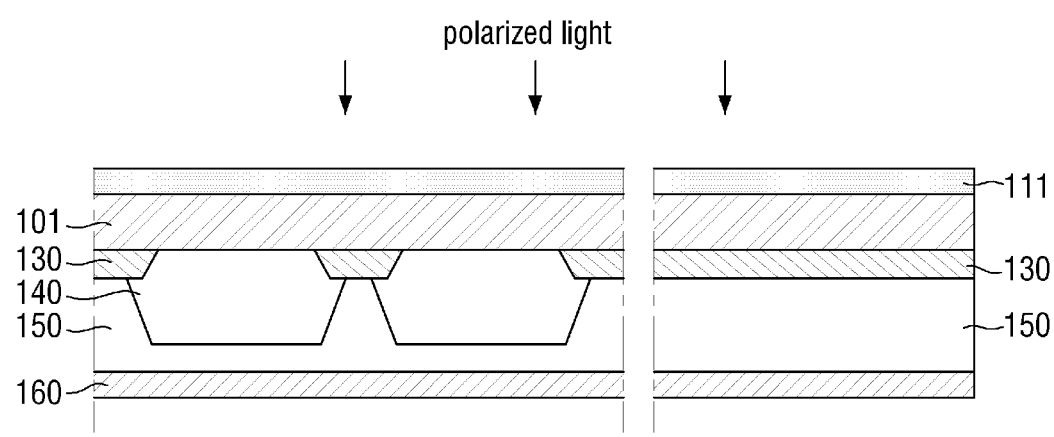

Referring to FIG. 17, a dye alignment layer 111 is formed on the other surface of the first base substrate 101. In an embodiment, the forming of the dye alignment layer 111 may include directly applying a coating composition, which contains a polyimide-based material having a photoreactive group in a repeating unit, onto the first base substrate 101, irradiating polarized light to the applied coating composition so as to give alignment anisotropy, and curing the dye alignment layer having the alignment anisotropy. Since exemplary embodiments of the irradiating of the polarized light and the curing of the dye alignment layer have been described above with reference to FIG. 14 and the like, a redundant description of these operations will be omitted.

Figure 18:
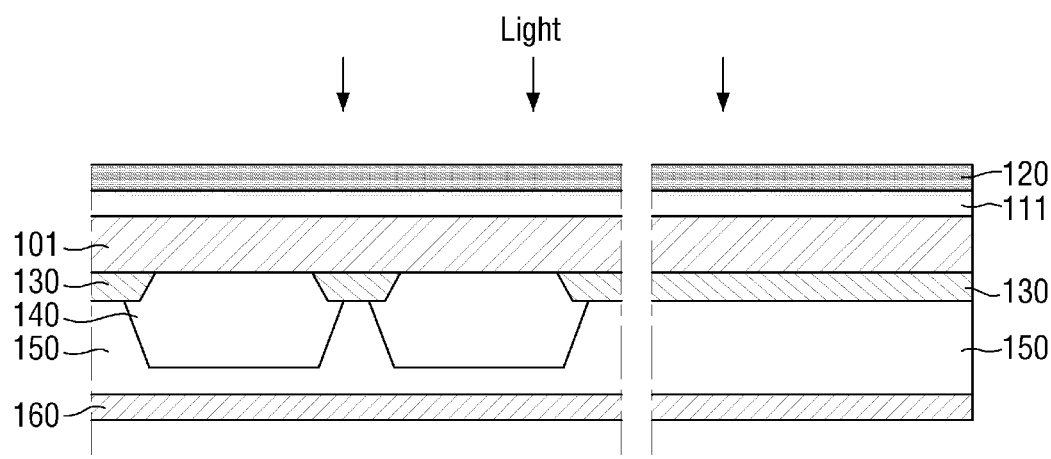

Referring to FIG. 18, a polarizing layer 120 can be formed on the dye alignment layer 111. In an embodiment, the forming of the polarizing layer 120 may include directly applying a composition for forming a polarizing layer, which contains one or more of the dye compounds represented by the above-described formula (A), onto the dye alignment layer 111 and polymerizing the applied coating composition by irradiating light to the applied coating composition. Since exemplary embodiments of the composition for forming a polarizing layer and the irradiating of the light have been described together with reference to FIG. 15 and the like, a redundant description of them will be omitted.

Figure 19:
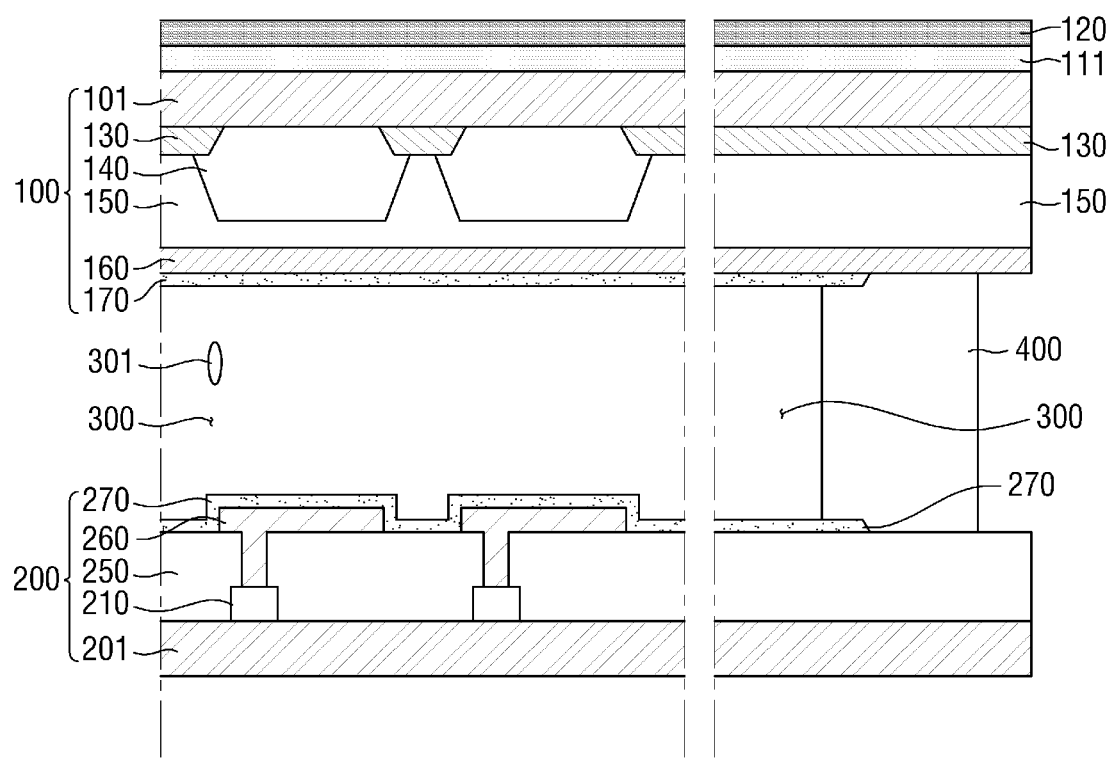

Referring to FIG. 19, a first liquid crystal alignment layer 170 is formed on the common electrode 160, a liquid crystal layer 300 is interposed between a first display panel 100 and a second display panel 200 including switching elements 210, and the liquid crystal layer 300 is sealed with a sealing member 400.

FIGS. 20 through 24 are cross-sectional views illustrating a method of manufacturing a display device according to an embodiment.

Figure 20:
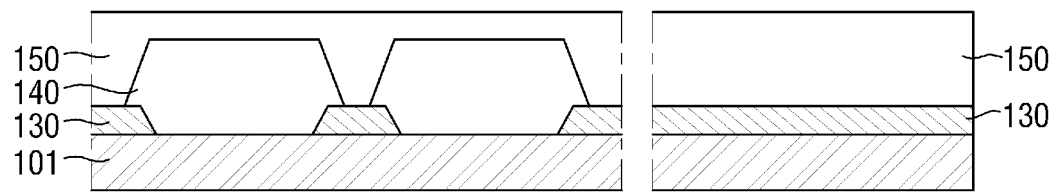
FIGS. 20 through 24 are cross-sectional views illustrating a method of manufacturing a display device according to an embodiment.

Referring to FIG. 20, a first base substrate 101, a light shielding member 130 disposed on the first base substrate 101, a color control pattern layer 140 disposed on the light shielding member 130, and an overcoat layer 150 disposed on the color control pattern layer 140 are prepared.

Figure 21:
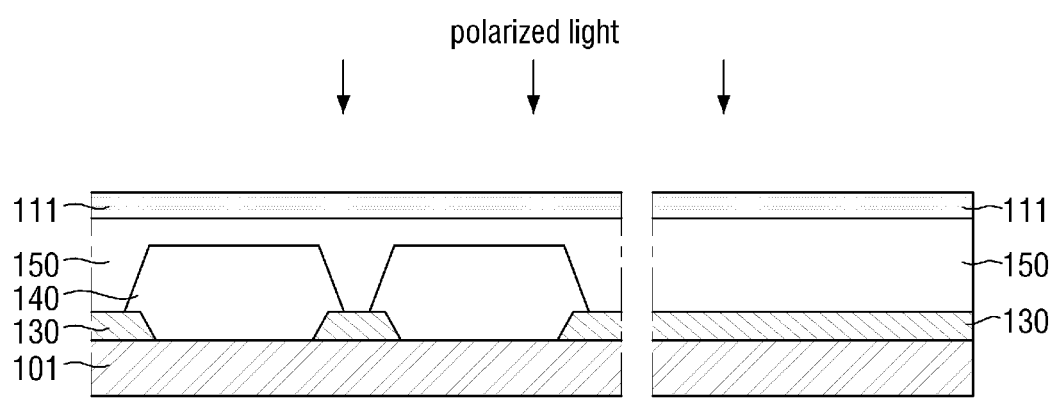

Referring to FIG. 21, a dye alignment layer 111 is formed on the overcoat layer 150. In an embodiment, the forming of the dye alignment layer 111 may include directly applying a coating composition, which contains a polyimide-based material having a photoreactive group in a repeating unit, onto the overcoat layer 150, giving anisotropy to the applied coating composition by irradiating polarized light to the applied coating composition, and curing the dye alignment layer having the given alignment anisotropy. Since exemplary embodiments of the irradiating of the polarized light and the curing of the dye alignment layer have been described above with reference to FIG. 14 and the like, a redundant description of these operations will be omitted.

Figure 22:
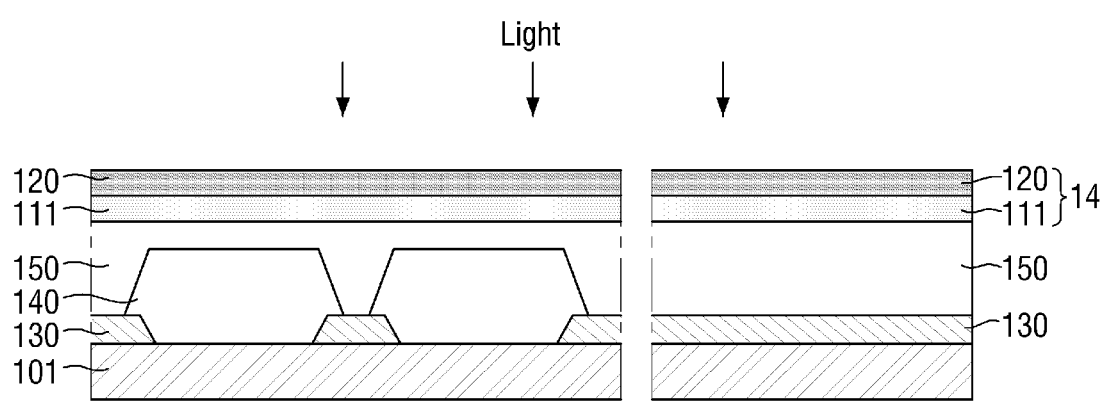

Referring to FIG. 22, a polarizing layer 120 is formed on the dye alignment layer 111. In an embodiment, the forming of the polarizing layer 120 may include directly applying a polarizing layer forming composition, which contains one or more of the dye compounds represented by the above-described formula (A), onto the dye alignment layer 111 and polymerizing the applied coating composition by irradiating light to the applied coating composition. Since exemplary embodiments of the composition for forming a polarizing layer and the irradiating of the light have been described together with reference to FIG. 15 and the like, a redundant description of them will be omitted.

Figure 23:
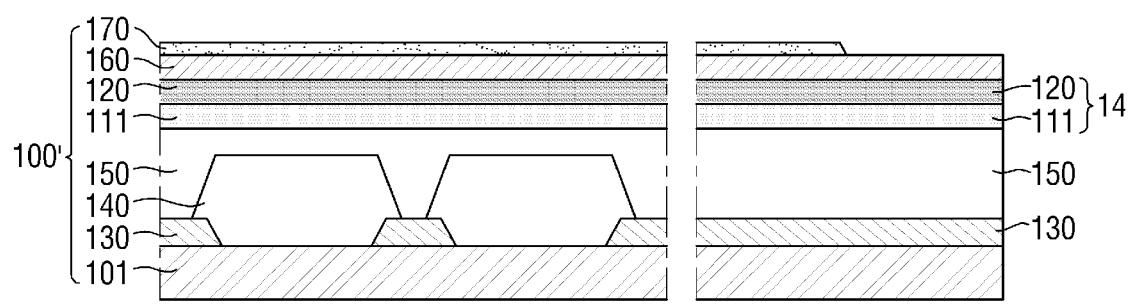

Referring to FIG. 23, a common electrode 160 and a first liquid crystal alignment layer 170 are formed on the polarizing layer 120 to prepare a first display panel 100'.

Figure 24:
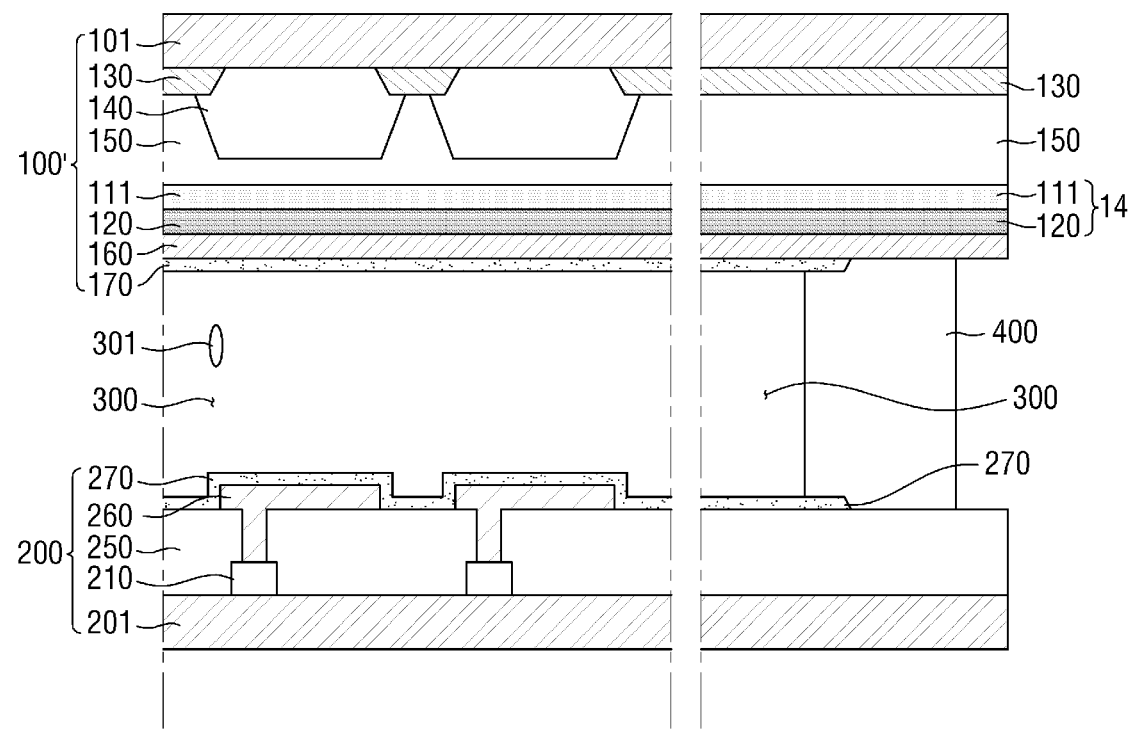

Referring to FIG. 24, a liquid crystal layer 300 is interposed between the first display panel 100' including a polarizer 14 and a second display panel 200 including switching elements 210 and is sealed with a sealing member 400.

FIGS. 25 through 30 are cross-sectional views illustrating a method of manufacturing a display device according to another embodiment.

Figure 25:
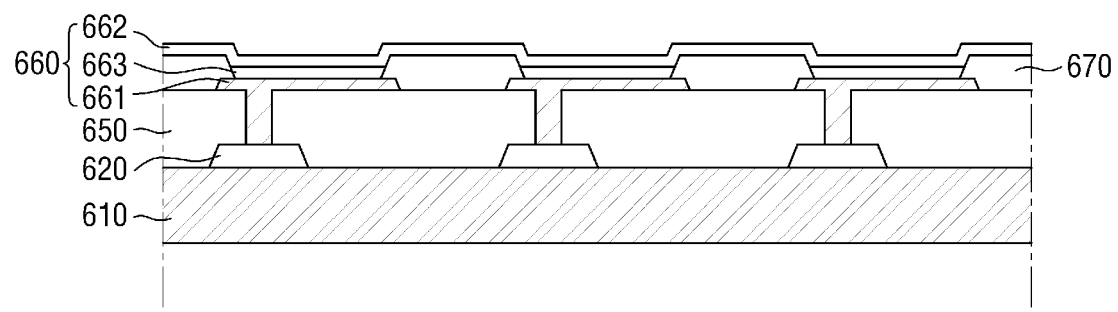
FIGS. 25 through 30 are cross-sectional views illustrating a method of manufacturing a display device according to an embodiment.

Referring to FIG. 25, a base substrate 610, a driving element 620 disposed on the base substrate 610, an intermediate layer 650 disposed on the driving element 620, and a pixel defining layer 670 disposed on the intermediate layer 650, and an organic light emitting element 660 are prepared.

Figure 26:
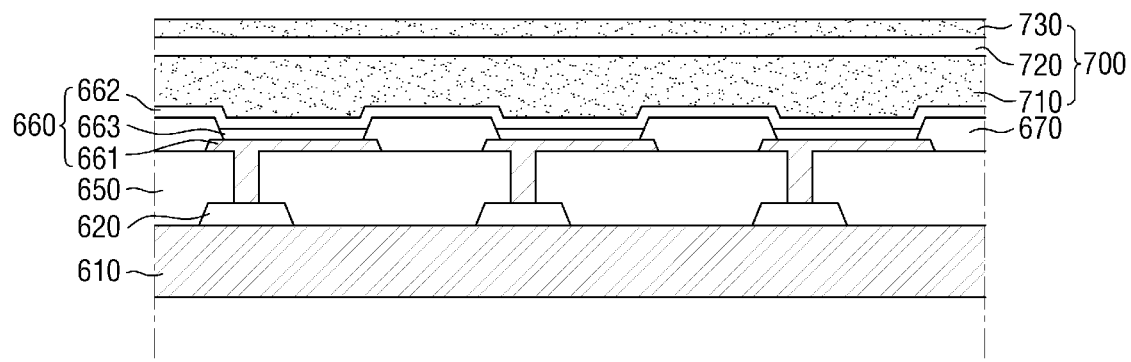

Referring to FIG. 26, an encapsulating member 700 is formed on the organic light emitting element 660. In an embodiment, the forming of the encapsulation member 700 may include forming a first inorganic encapsulating layer 710 by depositing an inorganic material directly on a second electrode 662, forming an organic encapsulation layer 720 by applying a coating composition containing an organic material directly onto the first inorganic encapsulation layer 710 and curing the coating composition, and forming a second inorganic encapsulation layer 730 by depositing an inorganic material directly on the organic encapsulation layer 720.

Figure 27:
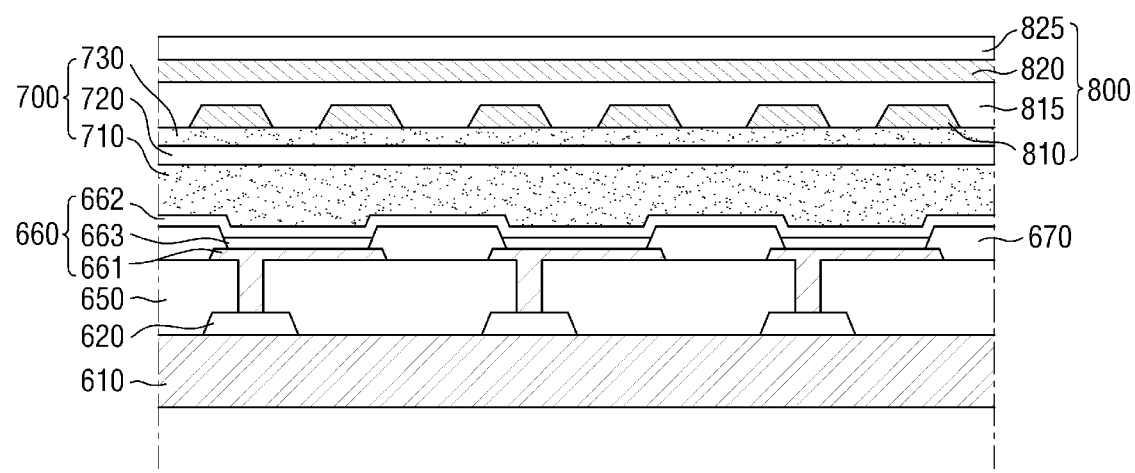

Referring to FIG. 27, a touch unit 800 is formed on the encapsulation member 700. In an embodiment, the forming of the touch unit 800 may include forming a first touch electrode 810 by depositing a conductive material directly on the encapsulation member 700 and patterning the conductive material, forming a first insulating layer 815 directly on the first touch electrode 810, forming a second touch electrode 820 by depositing a conductive material directly on the first insulating layer 815 and patterning the conductive material, and forming a second insulating layer 825 directly on the second touch electrode 820.

Figure 28:
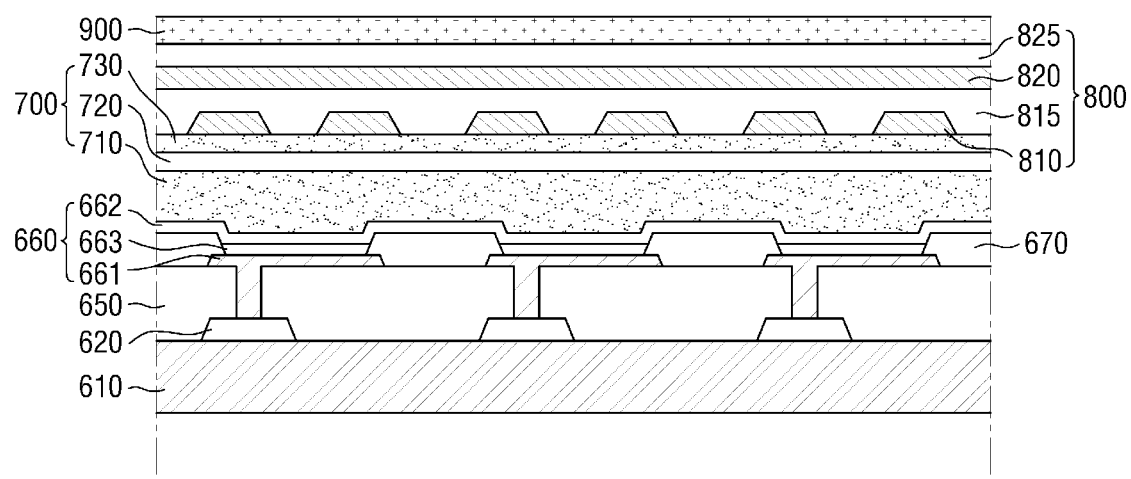

Referring to FIG. 28, a phase delay layer 900 is formed on the touch unit 800. In an embodiment, the forming of the phase delay layer 900 may include applying a coating composition containing a birefringent material directly onto the touch unit 800 and curing the applied coating composition. Since exemplary embodiments of the phase delay layer 900 have been described above with reference to FIG. 8, a detailed description of the phase delay layer 900 will be omitted. In an embodiment, the forming of the phase delay layer 900 may be an operation of bonding the phase delay layer 900 onto the touch unit 800 by interposing an adhesive layer (not illustrated) between the phase delay layer 900 and the touch unit 800.

Figure 29:
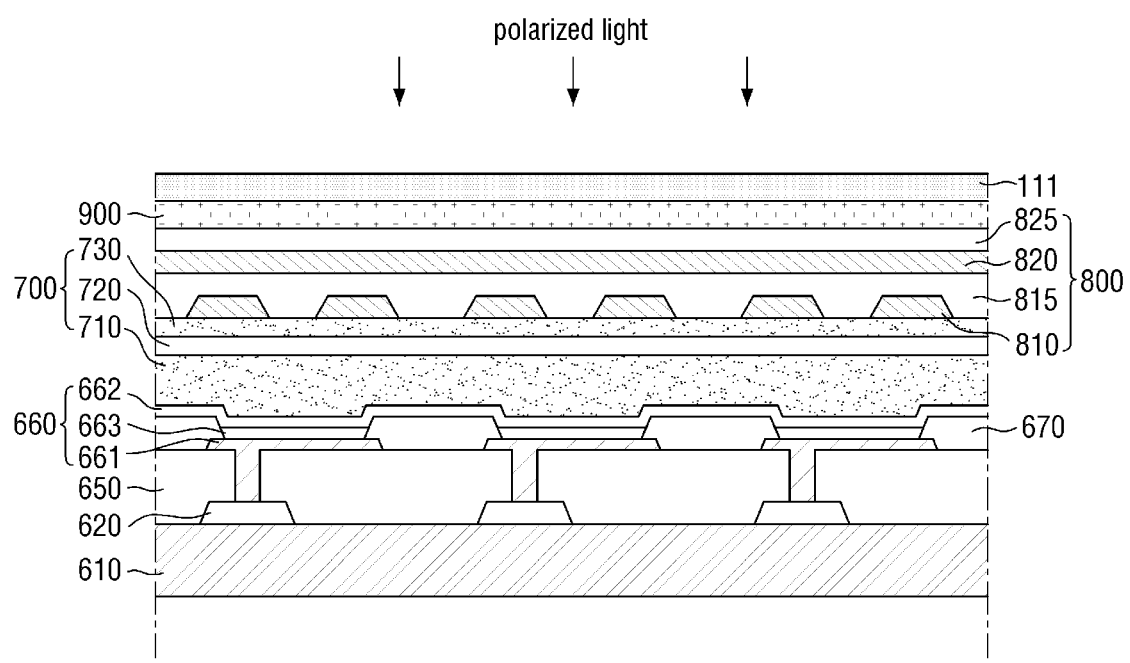

Referring to FIG. 29, a dye alignment layer 111 is formed on the phase delay layer 900. In an embodiment, the forming of the dye alignment layer 111 may include directly applying a coating composition, which contains a polyimide-based material having a photoreactive group in a repeating unit, onto the phase delay layer 900, irradiating polarized light to the applied coating composition so as to give alignment anisotropy, and curing the dye alignment layer having the given alignment anisotropy. Since exemplary embodiments of the irradiating of the polarized light and the curing of the dye alignment layer have been described above with reference to FIG. 14 and the like, a redundant description of these operations will be omitted.

Figure 30:
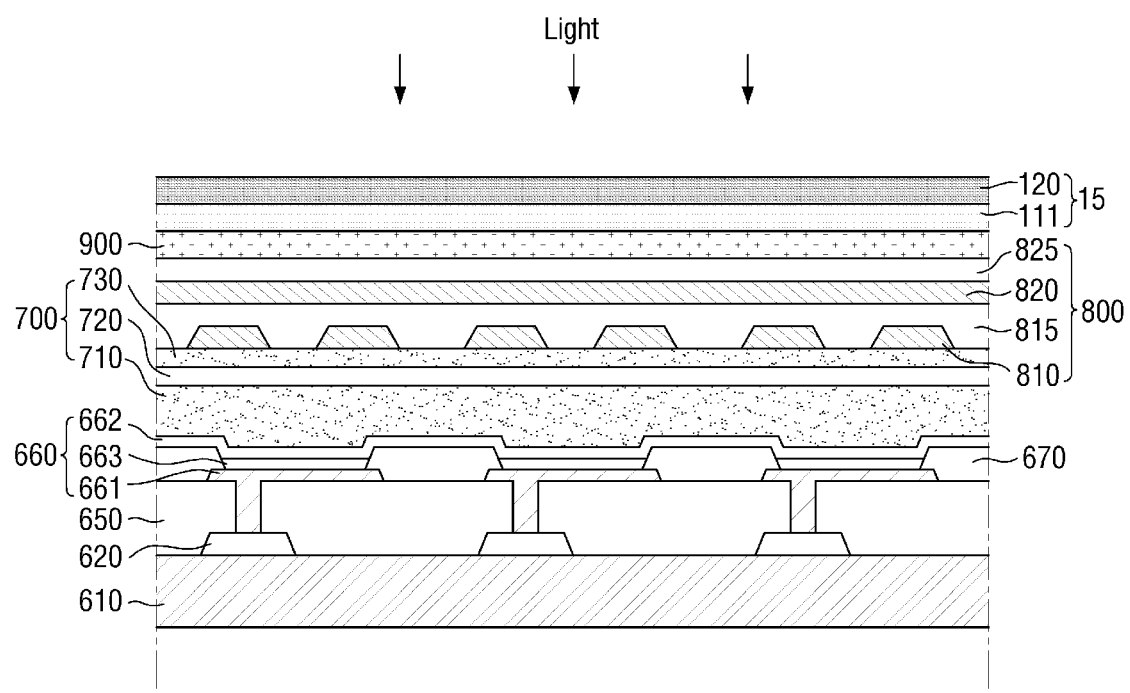

Referring to FIG. 30, a polarizing layer 120 is formed on the dye alignment layer 111. In an embodiment, the forming of the polarizing layer 120 may include directly applying a polarizing layer forming composition, which contains one or more of the dye compounds represented by the above-described formula (A), onto the dye alignment layer 111 and polymerizing the applied coating composition by irradiating light to the applied coating composition. Since exemplary embodiments of the composition for forming a polarizing layer and the irradiating of the light have been described together with reference to FIG. 15 and the like, a redundant description of them will be omitted.

While the present disclosure has been particularly illustrated and described with reference to exemplary embodiments thereof, it will be understood by those of ordinary skill in the art that various changes in form and detail may be made therein without departing from the spirit and scope of the present disclosure as defined by the following claims. The exemplary embodiments should be considered in a descriptive sense and not for purposes of limitation.

What is claimed is:

1. A dye compound represented by one of formulae (A-1), (A-2), (A-3):

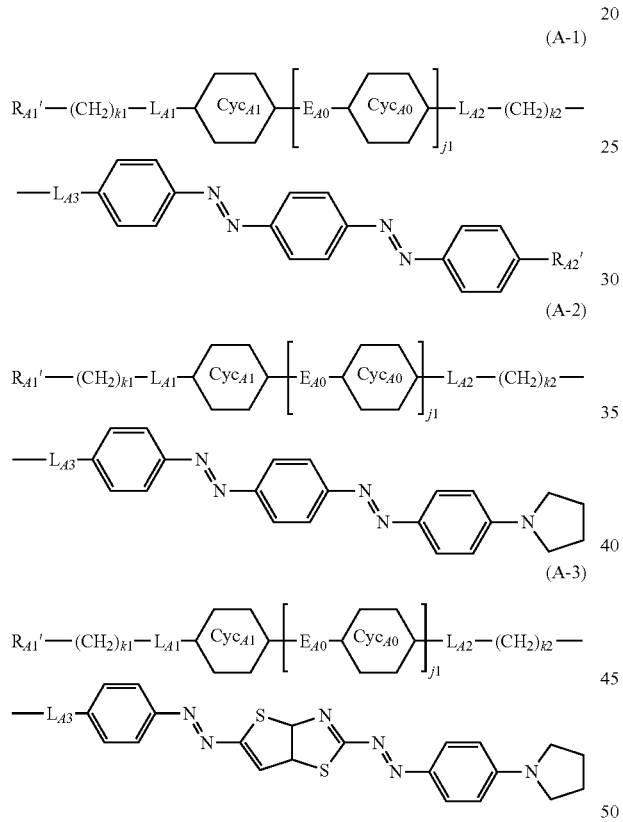

wherein, in formulae (A-1), (A-2), (A-3), $Cyc_{A1}$ and each $Cyc_{A0}$ are each independently 1,4-phenylene or 1,4-cyclohexylene, each $E_{A0}$ is independently a single bond, *—(C=O)O—*, *—O(C=O)—*, $C_{1-4}$ alkylene of the formula *—$(CH_2)_k$—* wherein k is a natural number, *—CH=CH—*, or *—C≡C—*, j1 is an integer of 1 to 3, $L_{A1}$ is a single bond, *—O—*, *—(C=O)O—*, or *—O(C=O)—*, $L_{A2}$ and $L_{A3}$ are each independently a single bond or *—O—*, k1 is an integer of 0 to 12, k2 is an integer of 6 to 10, each $R_{A1}'$ in formulae (A-1) through (A-3) is independently an acrylate group or a methacrylate group, and $R_{A2}'$ in formula (A-1) is a $C_{1-10}$ alkyl group or a $C_{1-10}$ alkoxy group.

2. The dye compound of claim 1, wherein, in formulae (A-1) through (A-3), k2 is 6, 8, or 10.

3. The dye compound of claim 2, wherein, in formulae (A-1) through (A-3),

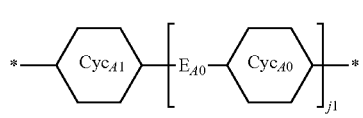

is represented by one of the formulae:

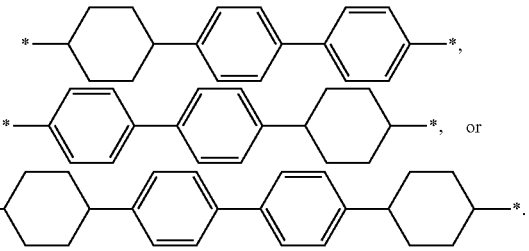

4. The dye compound of claim 3, wherein, in formulae (A-1) through (A-3), one or more of $L_{A2}$ and $L_{A3}$ are *—O—*.

5. The dye compound of claim 4, wherein the dye compound represented by formula (A-1) absorbs light in a wavelength band of about 400 to about 500 nanometers, the dye compound represented by formula (A-2) absorbs light in a wavelength band of about 500 to about 600 nanometers, and the dye compound represented by formula (A-3) absorbs light in a wavelength band of about 600 to about 700 nanometers.

6. A polarizer comprising:
   a dye alignment layer; and
   a polarizing layer which is disposed on the dye alignment layer and comprises a polymer derived from a compound represented by one of formulae (A-1), (A-2), (A-3):

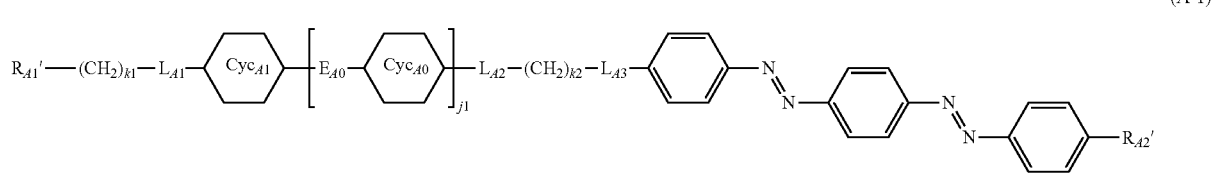

-continued

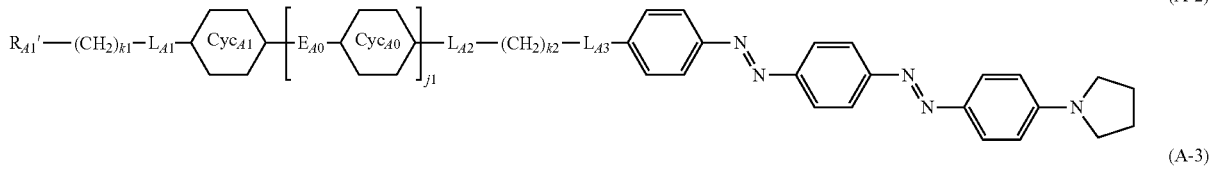
(A-2)

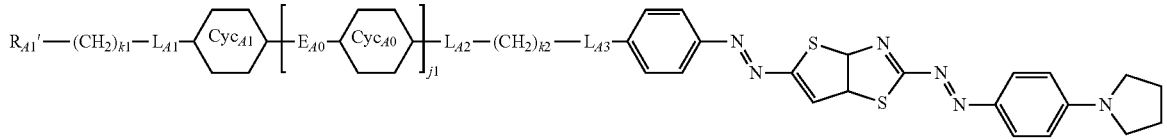
(A-3)

wherein, in formulae (A-1), (A-2), (A-3),
  $Cyc_{A1}$ and each $Cyc_{A0}$ are each independently 1,4-phenylene or 1,4-cyclohexylene,
  each $E_{A0}$ is independently a single bond, *—(C=O)O—*, *—O(C=O)—*, $C_{1-4}$ alkylene of the formula *—(CH$_2$)$_k$—* wherein k is a natural number, *—CH=CH—*, or *—C≡C—*,
  j1 is an integer of 1 to 3,
  $L_{A1}$ is a single bond, *—O—*, *—(C=O)O—*, or *—O(C=O)—*,
  $L_{A2}$ and $L_{A3}$ are each independently a single bond or *—O—*,
  k1 is an integer of 0 to 12,
  k2 is an integer of 6 to 10,
  each $R_{A1}$' in formulae (A-1) through (A-3) is independently an acrylate group or a methacrylate group, and
  $R_{A2}$' in formula (A-1) is a $C_{1-10}$ alkyl group or a $C_{1-10}$ alkoxy group.

7. The polarizer of claim 6, wherein the polarizing layer further comprises a polymer derived from a liquid crystalline compound represented by formula (B):

(B)

wherein, in formula (B),
  $Cyc_{B1}$ and each $Cyc_{B0}$ are each independently 1,4-phenylene or 1,4-cyclohexylene,
  each $E_{B0}$ is independently a single bond, *—(C=O)O—*, *—O(C=O)—*, $C_{1-4}$ alkylene of the formula *—(CH$_2$)$_k$—, wherein k is a natural number, *—CH=CH—*, or *—C≡C—*,
  m is an integer of 1 to 3,
  $L_{B1}$ and $L_{B2}$ are each independently a single bond, *—O—*, *—(C=O)O—*, or *—O(C=O)—*,
  n1 and n2 are each independently an integer of 0 to 12,
  $R_{B1}$ and $R_{B2}$ are each independently a hydrogen atom, an acrylate group, or a methacrylate group, and
  one or more of $R_{B1}$ and $R_{B2}$ are the acrylate group or the methacrylate group.

8. The polarizer of claim 7, wherein the liquid crystalline compound has a smectic B phase and is represented by one of formulae (B-1) or (B-2):

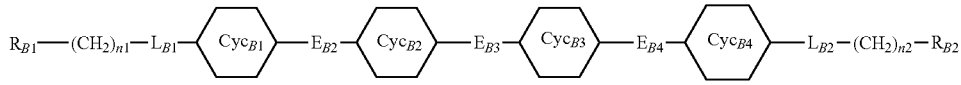
(B-1)

(B-2)

wherein, in formulae (B-1) and (B-2),
  $Cyc_{B2}$, $Cyc_{B3}$, and $Cyc_{B4}$ are each independently 1,4-phenylene or 1,4-cyclohexylene,
  $E_{B2}$, $E_{B3}$, and $E_{B4}$ are each independently a single bond, *—(C=O)O—*, *—O(C=O)—*, $C_{1-4}$ alkylene of the formula *—(CH$_2$)$_k$—* wherein k is a natural number, *—CH=CH—*, or *—C≡C—*, and
  $Cyc_{B1}$, $L_{B1}$, $L_{B2}$, n1, n2, $R_{B1}$, and $R_{B2}$ are the same as those defined in formula (B).

9. The polarizer of claim 7, wherein the polymer derived from a liquid crystalline compound represented by formula (B) has a main chain represented by formula (C):

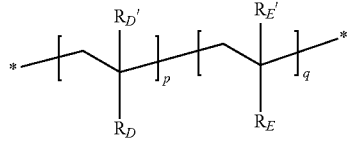
(C)

wherein, in formula (C),
  each $R_D$ is independently a monovalent atomic group represented by formula (D), each $R_D$' is independently a hydrogen atom or a methyl group, and p is an integer of 0 to 100;

each $R_E$ is independently a monovalent atomic group represented by formula (E), each $R_E'$ independently is a hydrogen atom or a methyl group, and q is an integer of 0 to 100; and both p and q are not zero, $R_{B2}$ is a hydrogen atom, an acrylate group, or a methacrylate group.

10. The polarizer of claim 9, wherein, in formula (C), the repeating unit of the formula

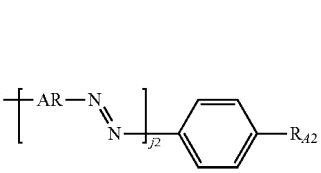
(D)

wherein, in formula (D),
$Cyc_{A1}$ and each $Cyc_{A0}$ are each independently 1,4-phenylene or 1,4-cyclohexylene,
each $E_{A0}$ is independently a single bond, *—(C=O)O—*, *—O(C=O)—*, $C_{1-4}$ alkylene represented by the formula *—(CH$_2$)$_k$—* wherein k is a natural number, *—CH=CH—*, or *—C≡C—*,
j1 is an integer of 1 to 3,
each AR is independently 1,4-phenylene or

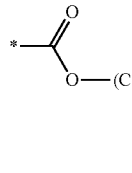, j2 is an integer of 1 or 2,
$L_{A1}$ is a single bond, *—O—*, *—(C=O)O—*, or *—O(C=O)—*,
$L_{A2}$ and $L_{A3}$ are each independently a single bond or *—O—*,
k1 is an integer of 0 to 12,
k2 is an integer of 6 to 10,
$R_{A2}$ is a hydrogen atom, a hydroxy group, an alkyl group, an alkoxy group, or

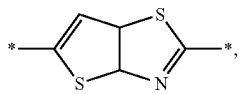;

and

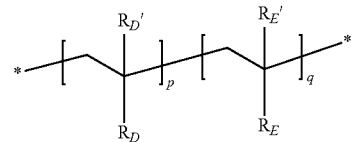
(E)

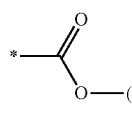

wherein, in formula (E),
$Cyc_{B1}$ and each $Cyc_{B0}$ are each independently 1,4-phenylene or 1,4-cyclohexylene,
each $E_{B0}$ is independently a single bond, *—(C=O)O—*, *—O(C=O)—*, $C_{1-4}$ alkylene represented by the formula *—(CH$_2$)$_k$—* wherein k is a natural number, *—CH=CH—*, or *—C≡C—*,
m is an integer of 1 to 3,
$L_{B1}$ and $L_{B2}$ are each independently a single bond, *—O—*, *—(C=O)O—*, or *—O(C=O)—*,
n1 and n2 are each independently an integer of 0 to 12, and is represented by one of formulae (C-1), (C-2), or (C-3):

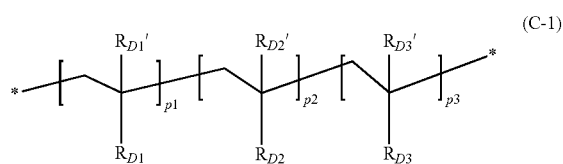
(C-1)

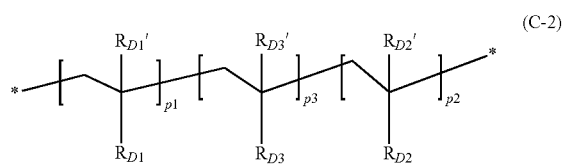
(C-2)

-continued

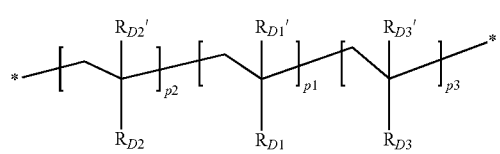
(C-3)

wherein, in formulae (C-1), (C-2), and (C-3),
each $R_{D1}$ is independently a monovalent atomic group represented by formula (D-1), each $R_{D1}'$ is independently a hydrogen atom or a methyl group, p1 is an integer of 1 to 30, each $R_{D2}$ is independently a monovalent atomic group represented by formula (D-2), each $R_{D2}'$ is independently a hydrogen atom or a methyl group, p2 is an integer of 1 to 30, each $R_{D3}$ is independently a monovalent atomic group represented by formula (D-3), each $R_{D3}'$ is independently a hydrogen atom or a methyl group, and p3 is an integer of 1 to 30,

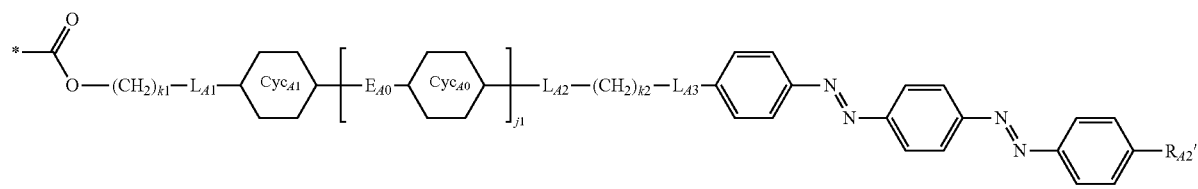
(D-1)

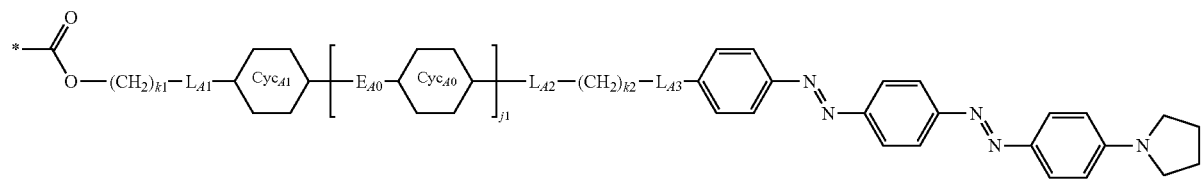
(D-2)

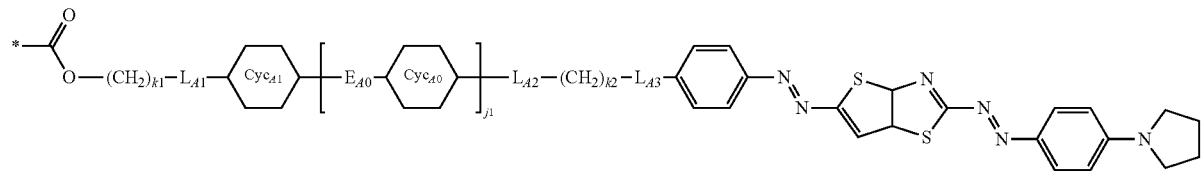
(D-3)

wherein $R_{A2}'$ in formula (D-1) is a $C_{1-10}$ alkyl group or a $C_{1-10}$ alkoxy group, and $Cyc_{A1}$, each $Cyc_{A0}$, each $E_{A0}$, j1, $L_{A1}$, $L_{A2}$, $L_{A3}$, k1, and k2 in formulas (D-1) through (D-3) are the same as those defined in formula (D).

11. The polarizer of claim 10, wherein, in formula (C), the repeating unit of the formula

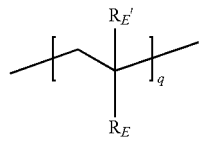

is represented by formula (C-4):

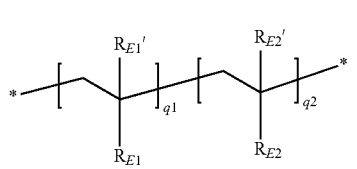 (C-4)

wherein, in formula (C-4),
each $R_{E1}$ is independently a monovalent atomic group represented by formula (E-1),
each $R_{E1}'$ is independently a hydrogen atom or a methyl group,
q1 is an integer of 1 to 30,
each $R_{E2}$ is independently a monovalent atomic group represented by formula (E-2),
each $R_{E2}'$ is independently a hydrogen atom or a methyl group, and
q2 is an integer of 1 to 30,

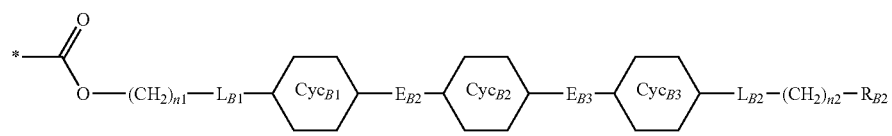 (E-1)

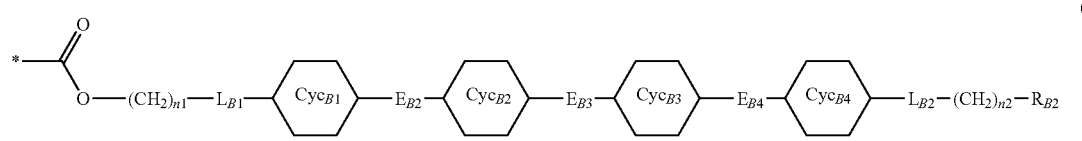 (E-2)

wherein, in formulae (E-1) and (E-2),
$Cyc_{B2}$, $Cyc_{B3}$, and $Cyc_{B4}$ are each independently 1,4-phenylene or 1,4-cyclohexylene,
$E_{B2}$, $E_{B3}$, and $E_{B4}$ are each independently a single bond, *—(C=O)O—*, *—O(C=O)—*, $C_{1-4}$ alkylene of the formula *—$(CH_2)_k$—* wherein k is a natural number, *—CH=CH—*, or *—C≡C—*, and
$Cyc_{B1}$, $L_{B1}$, $L_{B2}$, n1, n2, and $R_{B2}$ are the same as those defined in formula (E).

12. The polarizer of claim 7, wherein the polarizing layer comprises a polymer derived from a composition comprising the compound represented by formula (A) and the liquid crystalline compound represented by formula (B), wherein the composition has a smectic B phase at a temperature within a range of about 0° C. to about 100° C.

13. The polarizer of claim 12, wherein the composition further comprises
a crosslinking agent, wherein the crosslinking agent comprises a compound represented by one of formulae (F-1), (F-2), or (F-3); and
about 200 to about 400 parts by weight of the liquid crystalline compound represented by formula (B) and about 10 to about 100 parts by weight of the crosslinking agent, based on 100 parts by weight of the compound represented by formula (A):

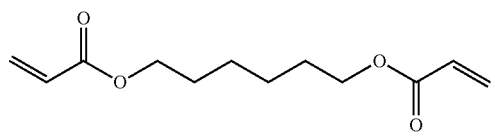 (F-1)

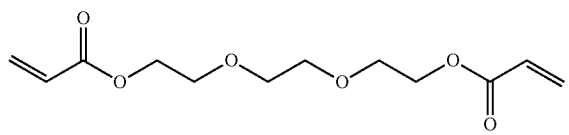 (F-2)

-continued

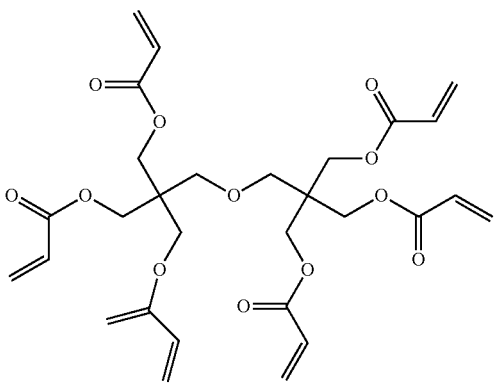 (F-3)

14. A display device comprising a polarizing layer which comprises a polymer derived from a compound represented by one of formulae (A-1), (A-2), (A-3):

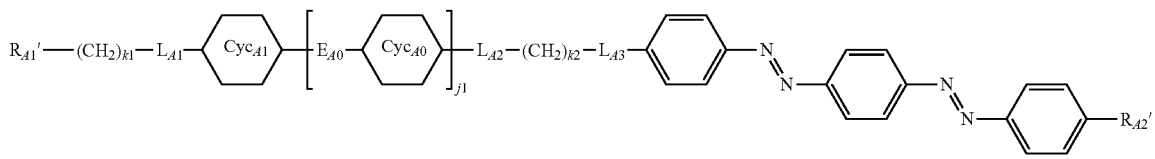
(A-1)

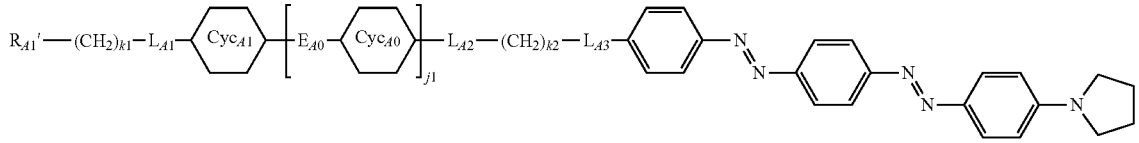
(A-2)

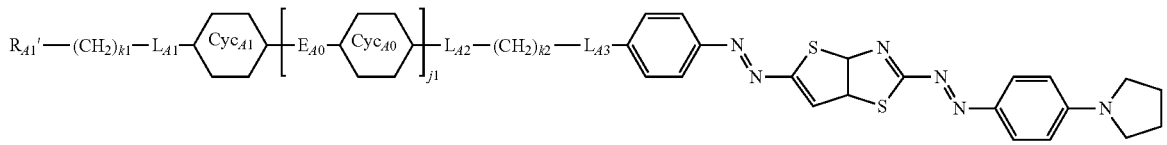
(A-3)

wherein, in formulae (A-1), (A-2), (A-3), $Cyc_{A1}$ and each $Cyc_{A0}$ are each independently 1,4-phenylene or 1,4-cyclohexylene, each $E_{A0}$ is independently a single bond, *—(C=O)O—*, *—O(C=O)—*, $C_{1-4}$ alkylene of the formula *—(CH$_2$)$_k$—* wherein k is a natural number, *—CH=CH—*, or *—C≡C—*, j1 is an integer of 1 to 3, $L_{A1}$ is a single bond, *—O—*, *—(C=O)O—*, or *—O(C=O)—*, $L_{A2}$ and $L_{A3}$ are each independently a single bond or *—O—*, k1 is an integer of 0 to 12, k2 is an integer of 6 to 10, each $R_{A1}'$ in formulae (A-1) through (A-3) is independently an acrylate group or a methacrylate group, and $R_{A2}'$ in formula (A-1) is a $C_{1-10}$ alkyl group or a $C_{1-10}$ alkoxy group.

15. The display device of claim 14, further comprising:
a first display panel which comprises a first base substrate and a switching element disposed on the first base substrate;
a second display panel which faces the first display panel and comprises a second base substrate and the polarizing layer disposed on a surface of the second base substrate which faces the first display panel;
a liquid crystal layer which is interposed between the first display panel and the second display panel; and
a sealing member which seals the liquid crystal layer by bonding the first display panel and the second display panel together.

16. The display device of claim 15, wherein the second display panel further comprises:
a color control pattern layer which is disposed on the surface of the second base substrate;
an overcoat layer which is disposed on the color control pattern layer; and
a dye alignment layer which is disposed on the overcoat layer,
wherein the polarizing layer is disposed directly on the dye alignment layer.

17. The display device of claim 14, further comprising:
a first display panel;
a second display panel which faces the first display panel and comprises a base substrate having a surface facing the first display panel and an other surface;
a liquid crystal layer which is interposed between the first display panel and the second display panel;
a sealing member which seals the liquid crystal layer by bonding the first display panel and the second display panel together; and
a dye alignment layer which is disposed directly on the other surface of the base substrate, wherein the polarizing layer is disposed directly on the dye alignment layer.

18. The display device of claim 14, further comprising:
a base substrate;
an organic light emitting element which is disposed between the base substrate and the polarizing layer; and
an encapsulation member which is disposed between the organic light emitting element and the polarizing layer to encapsulate the organic light emitting element.

19. The display device of claim 18, wherein the encapsulation member comprises one or more inorganic layers and one or more organic layers, wherein each inorganic layer is stacked alternately with each organic layer, and further comprising:
- a first touch electrode which is disposed on the encapsulation member;
- a second touch electrode which is disposed on the first touch electrode and insulated from the first touch electrode;
- an insulating layer which is disposed on the second touch electrode;
- a phase delay layer which is disposed on the insulating layer; and
- a dye alignment layer which is disposed directly on the phase delay layer,
- wherein the polarizing layer is disposed directly on the dye alignment layer.

* * * * *